US012713918B2

(12) United States Patent
Rai et al.

(10) Patent No.: US 12,713,918 B2
(45) Date of Patent: Aug. 18, 2026

(54) THERMAL TEST CHIP WITH STACKABLE METAL BASED HEATER AND SENSOR

(71) Applicant: Texas Instruments Incorporated, Dallas, TX (US)

(72) Inventors: Vinod Rai, San Jose, CA (US); Archana Venugopal, Mountain View, CA (US); Blake Travis, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 765 days.

(21) Appl. No.: 17/952,111

(22) Filed: Sep. 23, 2022

(65) Prior Publication Data

US 2023/0378023 A1 Nov. 23, 2023

Related U.S. Application Data

(60) Provisional application No. 63/344,400, filed on May 20, 2022.

(51) Int. Cl.
*H10W 40/70* (2026.01)
*H10P 74/20* (2026.01)
*H10W 20/40* (2026.01)

(52) U.S. Cl.
CPC ........... *H10W 40/70* (2026.01); *H10P 74/203* (2026.01); *H10W 20/40* (2026.01); *H10W 20/498* (2026.01)

(58) Field of Classification Search
CPC ....... H01L 23/42; H01L 22/12; H01L 23/485; H01L 23/5228; H01L 23/345; H01L 23/49541; G01R 31/2856; G01R 31/2896; G01R 31/2884; G01R 31/2874
See application file for complete search history.

(56) References Cited

U.S. PATENT DOCUMENTS 6,559,667 B1* 5/2003 Tarter ................ G01R 31/2896 324/762.02
2010/0278211 A1* 11/2010 Pu ......................... H01L 22/34 374/57
2011/0176579 A1* 7/2011 Rahman .................. G01K 1/14 374/185
2019/0139861 A1 5/2019 Kande
2019/0164851 A1* 5/2019 Yoo ................... G01R 31/2879

* cited by examiner

*Primary Examiner* — Jeff W Natalini
*Assistant Examiner* — Nicholas Leland Hutson
(74) *Attorney, Agent, or Firm* — Xiaotun Qiu; Frank D. Cimino

(57) ABSTRACT

An electronic device includes a package structure, conductive leads partially exposed outside the package structure, and a semiconductor die having a semiconductor layer and a multilevel metallization structure, where the semiconductor die is enclosed by the package structure and the multilevel metallization structure includes a heater resistor, a sense resistor, and conductive metal features electrically coupled to respective terminals of the heater resistor and the sense resistor, with the conductive metal features electrically coupled to respective ones of the conductive leads.

18 Claims, 65 Drawing Sheets

THERMAL TEST CHIP WITH STACKABLE METAL BASED HEATER AND SENSOR

CROSS-REFERENCE TO RELATED APPLICATION

This application claims priority to and benefit of U.S. Provisional Patent Application Ser. No. 63/344,400, filed on May 20, 2022, and titled "Thermal Testchip (Stackable Heater, Sensor) for theta-Ja and BOM Characterization", the contents of which are hereby fully incorporated by reference.

BACKGROUND

Development of electronic systems includes a variety of tasks and stages, such as developing a bill of material (BOM) with a list of components and specifications, integrated circuit chip design, designing system packaging forms and materials, as well as layout and design of one or more printed circuit boards (PCBs). An important consideration in system design and development is thermal performance, particularly for systems design for industrial or automotive applications that require operation over a wide range of temperatures. Thermal performance affects the design and material selection for various system components including circuit chips, circuit boards, molding compounds, and packaging structures. A significant hurdle in system development is evaluation of thermal performance for various component and design choices, which leads to extended development time and cost. Conventional techniques for evaluating thermal performance, such as transient junction temperatures (e.g., θja) in operation of integrated circuits or other packaged electronic devices are generally not scalable and are not technology agnostic.

SUMMARY

In one aspect, an electronic device includes a package structure, conductive leads partially exposed outside the package structure, and a semiconductor die having a semiconductor layer and a multilevel metallization structure, where the semiconductor die is enclosed by the package structure and the multilevel metallization structure includes a heater resistor, a sense resistor, and conductive metal features electrically coupled to respective terminals of the heater resistor and the sense resistor, with the conductive metal features electrically coupled to respective ones of the conductive leads.

In another aspect, a method of fabricating an electronic device includes forming a first metallization level of a multilevel metallization structure above a semiconductor layer, the first metallization level including a first heater resistor, forming a second metallization level of the multilevel metallization structure above the first metallization level, the second metallization level including a second heater resistor, and one of the first and second metallization levels including a sense resistor, electrically coupling the first and second heater resistors to conductive leads, and enclosing the first and second metallization levels, the semiconductor layer and portions of the conductive leads in a package structure.

In a further aspect, a system includes a circuit board, an electronic device, a power circuit, a sensing circuit, and a switching circuit. The electronic device includes conductive leads partially exposed outside a package structure and connected to conductive features of the circuit board, and a semiconductor die having a semiconductor layer and a multilevel metallization structure. The multilevel metallization structure includes a heater resistor, a sense resistor, an array of unit regions arranged in rows and columns, each unit region including an instance of a first heater resistor, an instance of a second heater resistor, and an instance of a sense resistor, and conductive metal features electrically coupled to respective terminals of the heater and sense resistors, where the conductive metal features are electrically coupled to respective ones of the conductive leads. The power circuit is configured to provide current to activate selected ones of the heater resistors and the sensing circuit is configured to sense a signal of selected ones of the sense resistors. The switching circuit is coupled between the circuit board, the power circuit, and the sensing circuit, and the switching circuit is configured to selectively couple the power circuit to the selected ones of the heater resistors and to selectively couple the sensing circuit to the selected ones of the sense resistors to test thermal performance of the circuit board.

DETAILED DESCRIPTION

Figure 1:
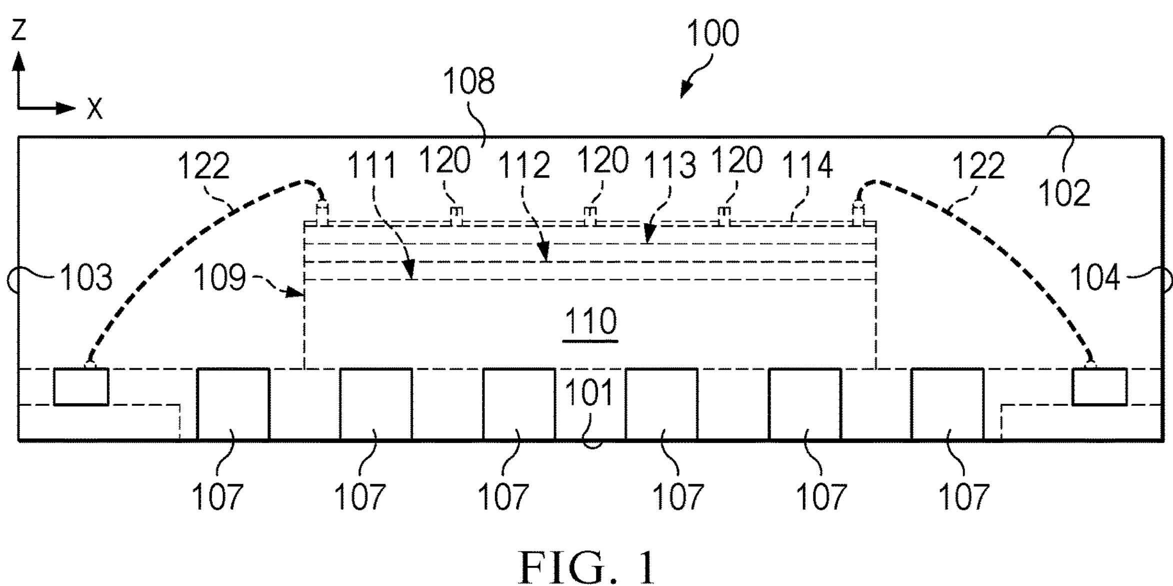
FIG. 1 is a partial side elevation view of a thermal test chip electronic device with a semiconductor die having a multilevel metallization structure with a metal based heater and sensor and bond wire electrical connections.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

Figure 1A:
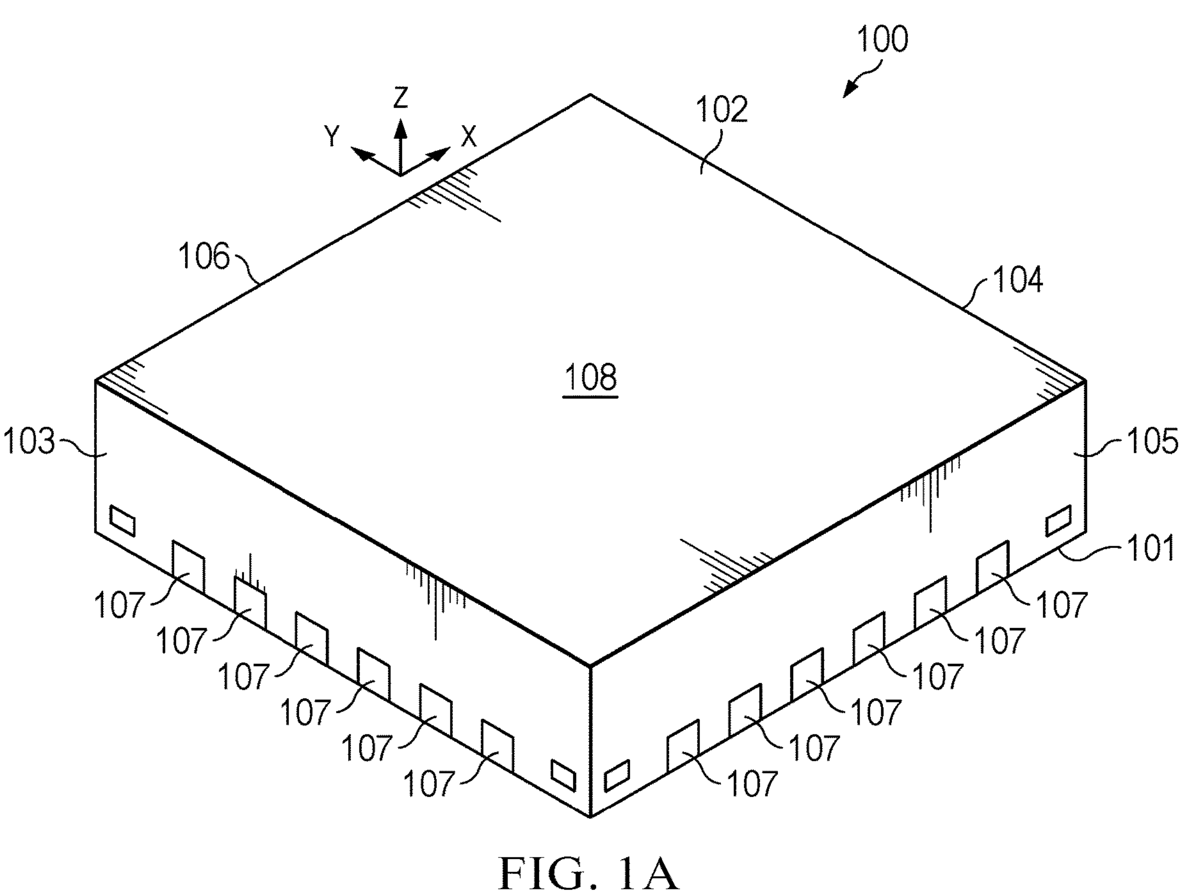
FIG. 1A a is a top perspective view of the electronic device of FIG. 1.
Figure 1B:
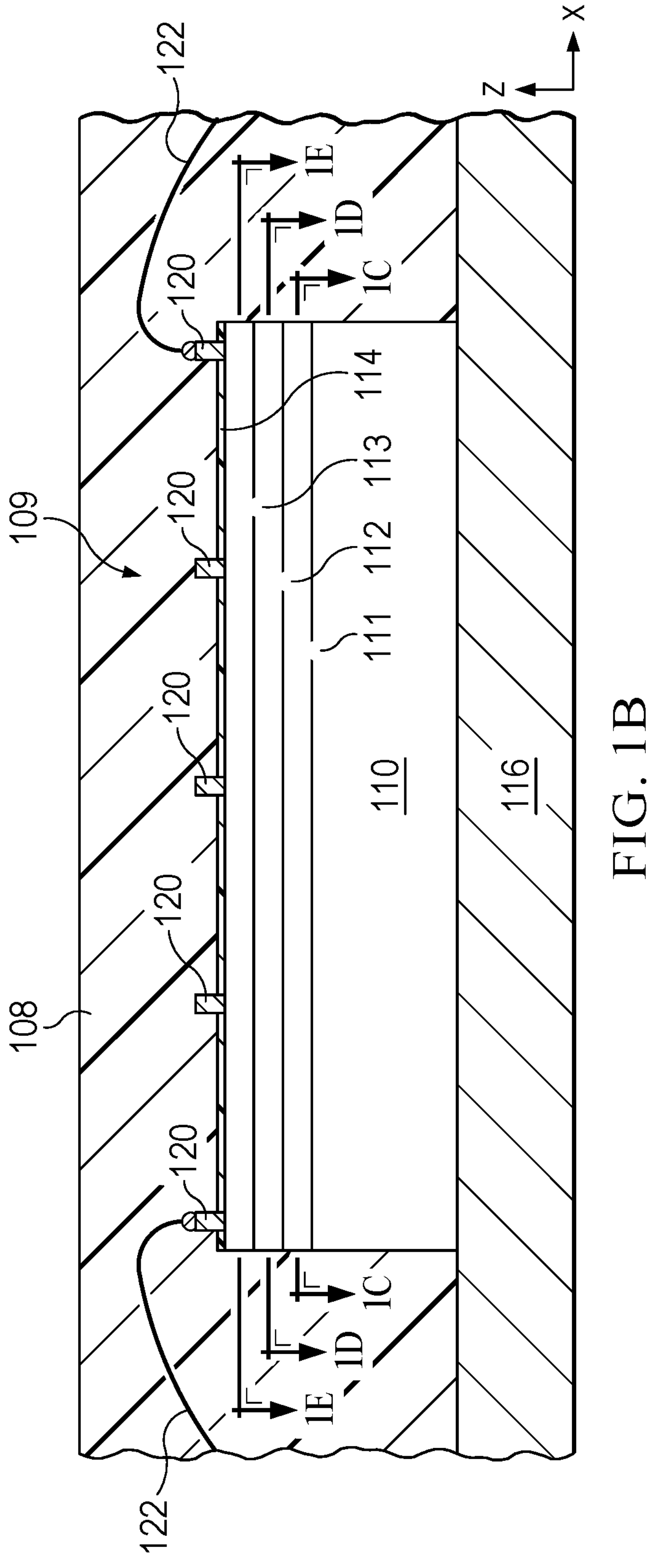
FIG. 1B is a partial side elevation view of the semiconductor die in the electronic device of FIG. 1.
Figure 1C:
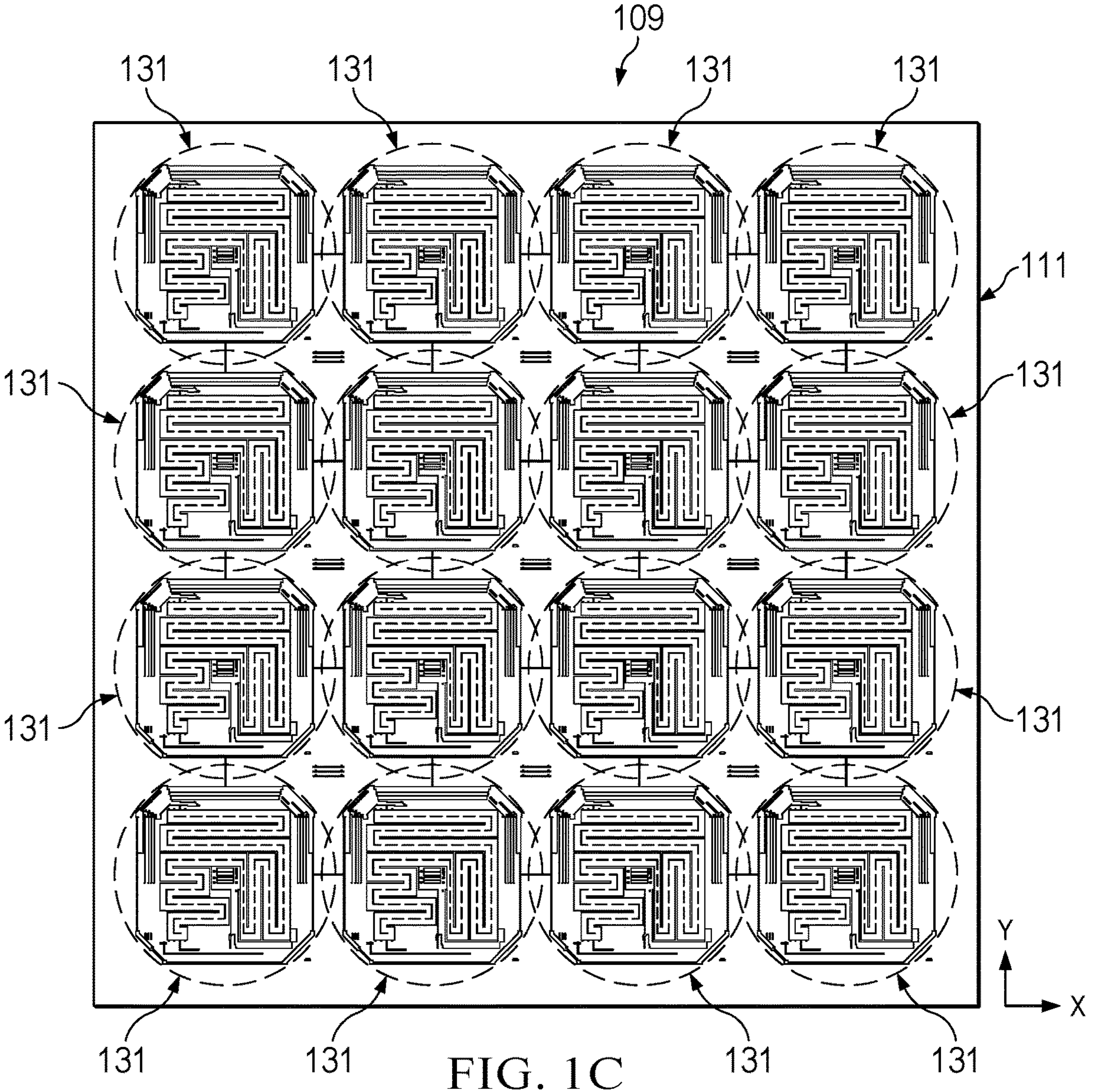
FIG. 1C is a partial top section view of a first metallization level of the semiconductor die in the electronic device taken along line 1C-1C of FIG. 1.
Figure 1D:
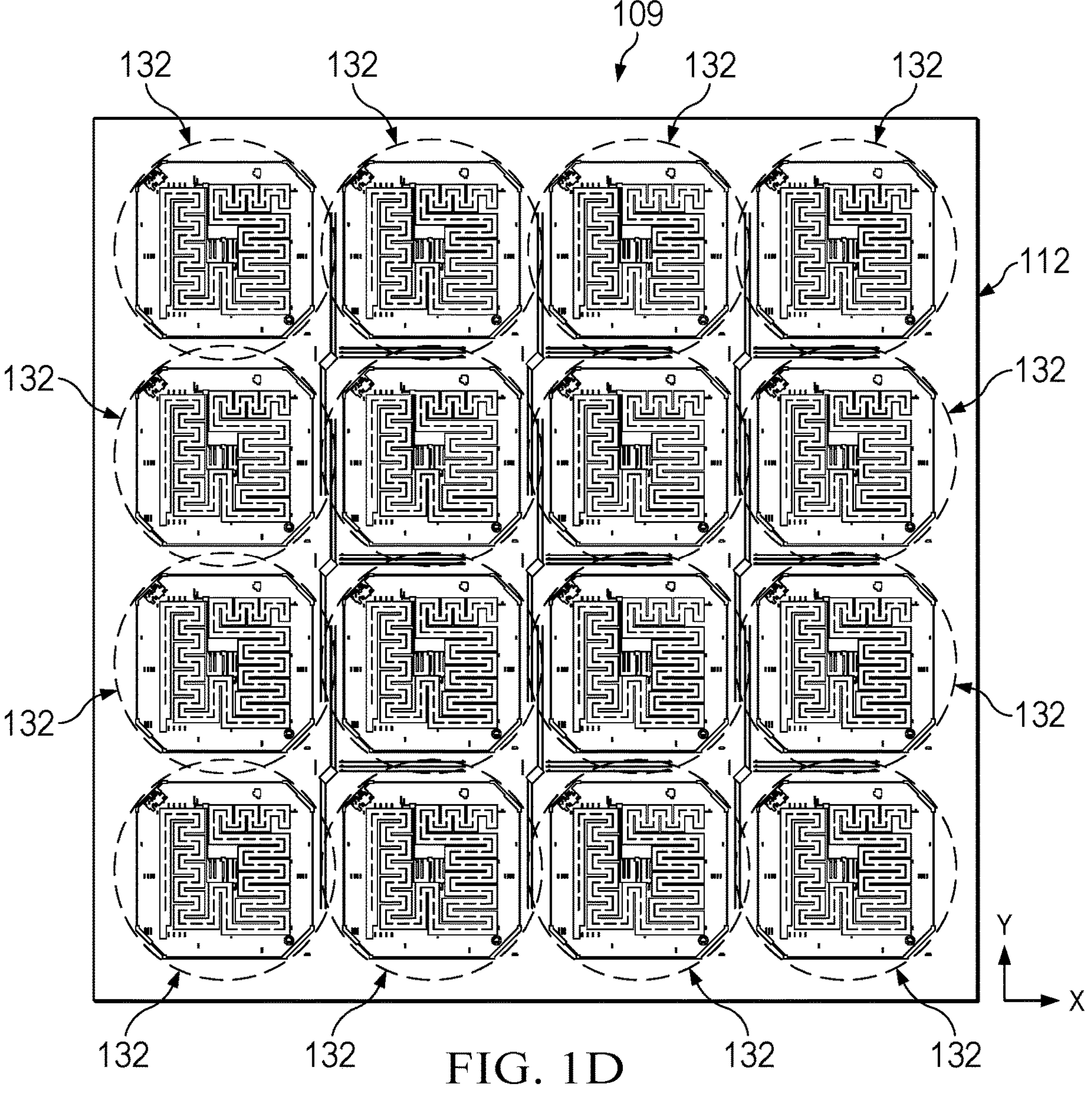
FIG. 1D is a partial top section view of a second metallization level of the semiconductor die in the electronic device taken along line 1D-1D of FIG. 1.
Figure 1E:
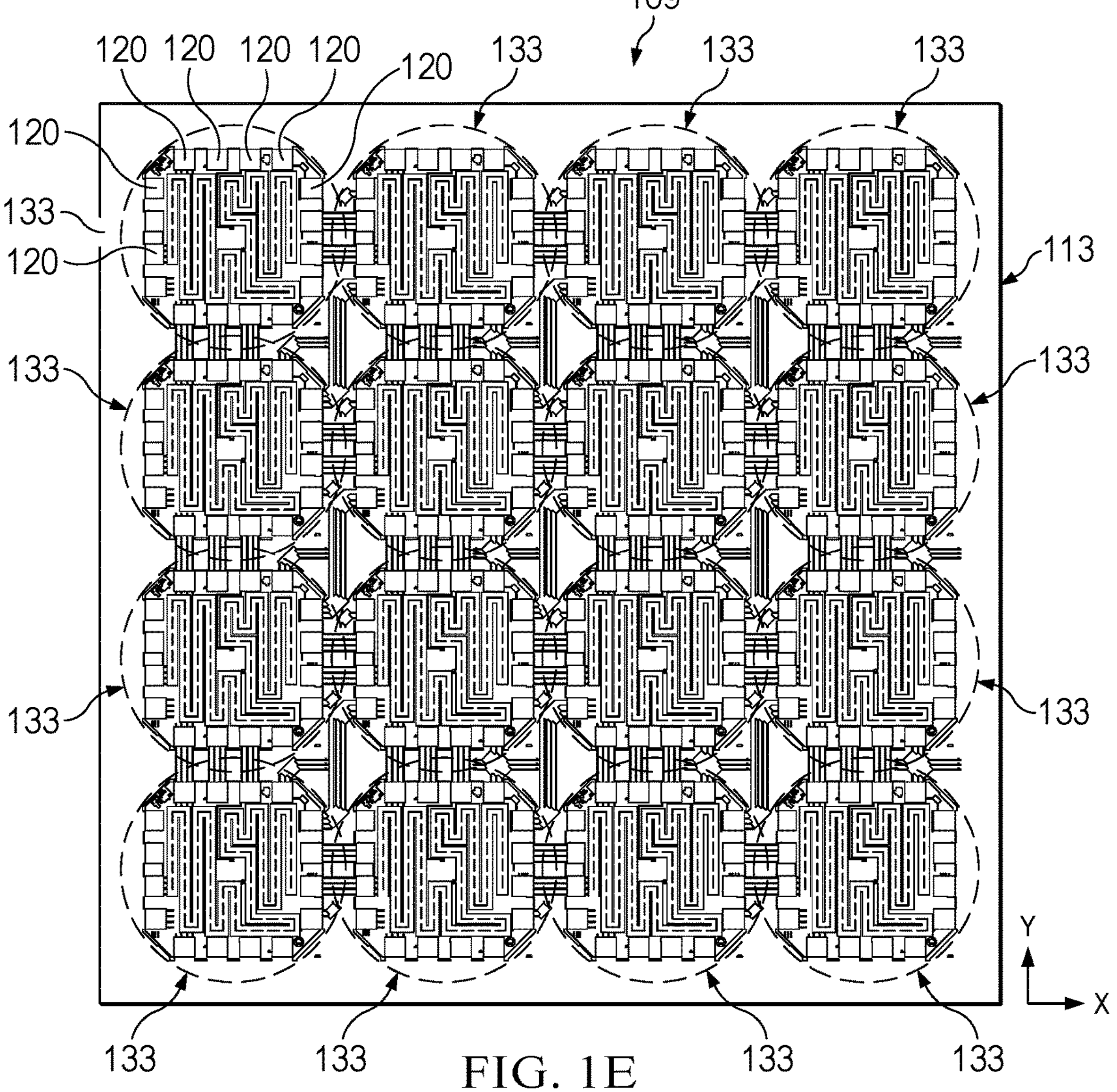
FIG. 1E is a partial top section view of a third metallization level of the semiconductor die in the electronic device taken along line 1E-1E of FIG. 1.
Figure 1F:
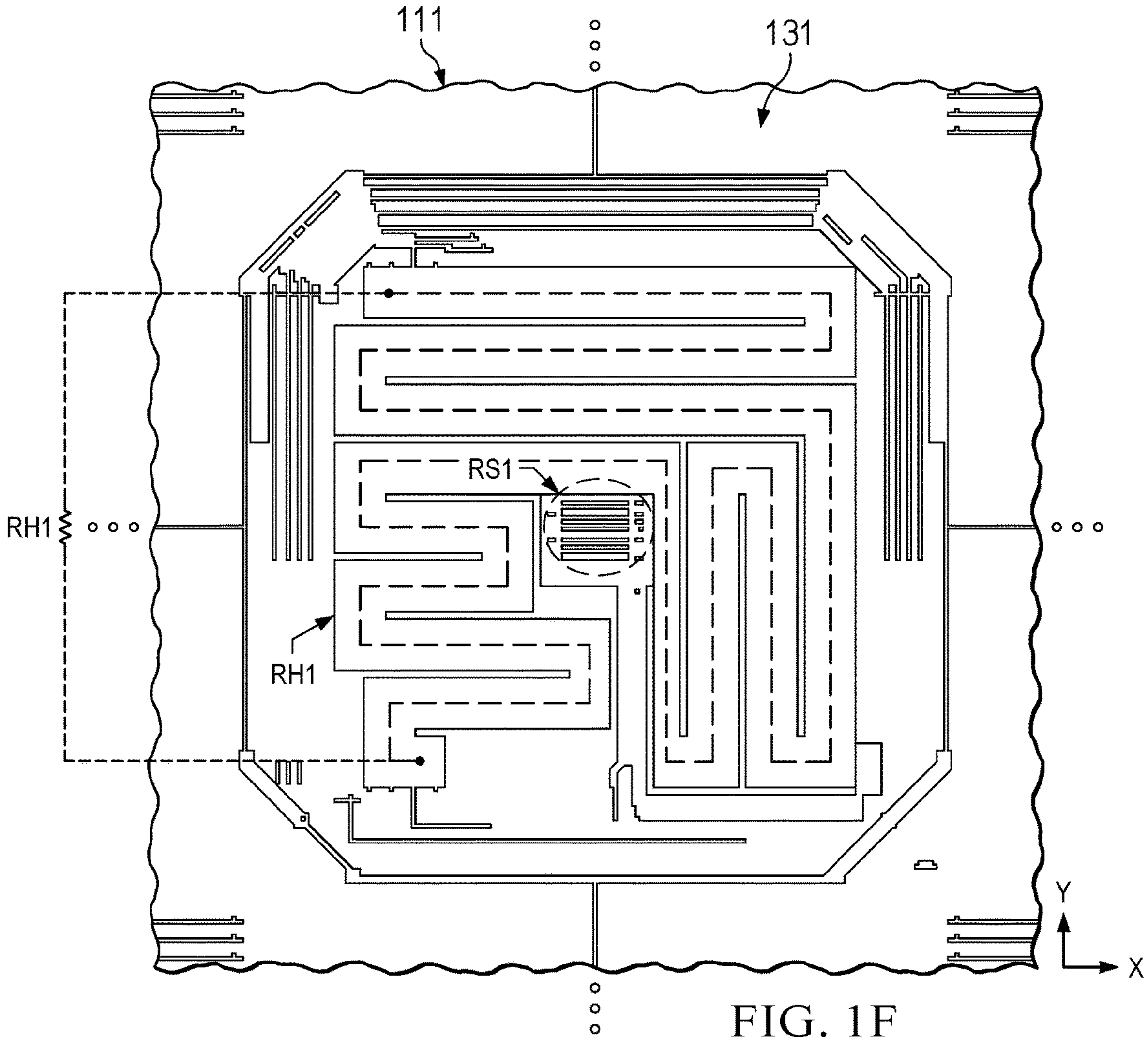
FIG. 1F is a partial top section view of one unit region of the first metallization level of the semiconductor die in the electronic device of FIG. 1.
Figure 1G:
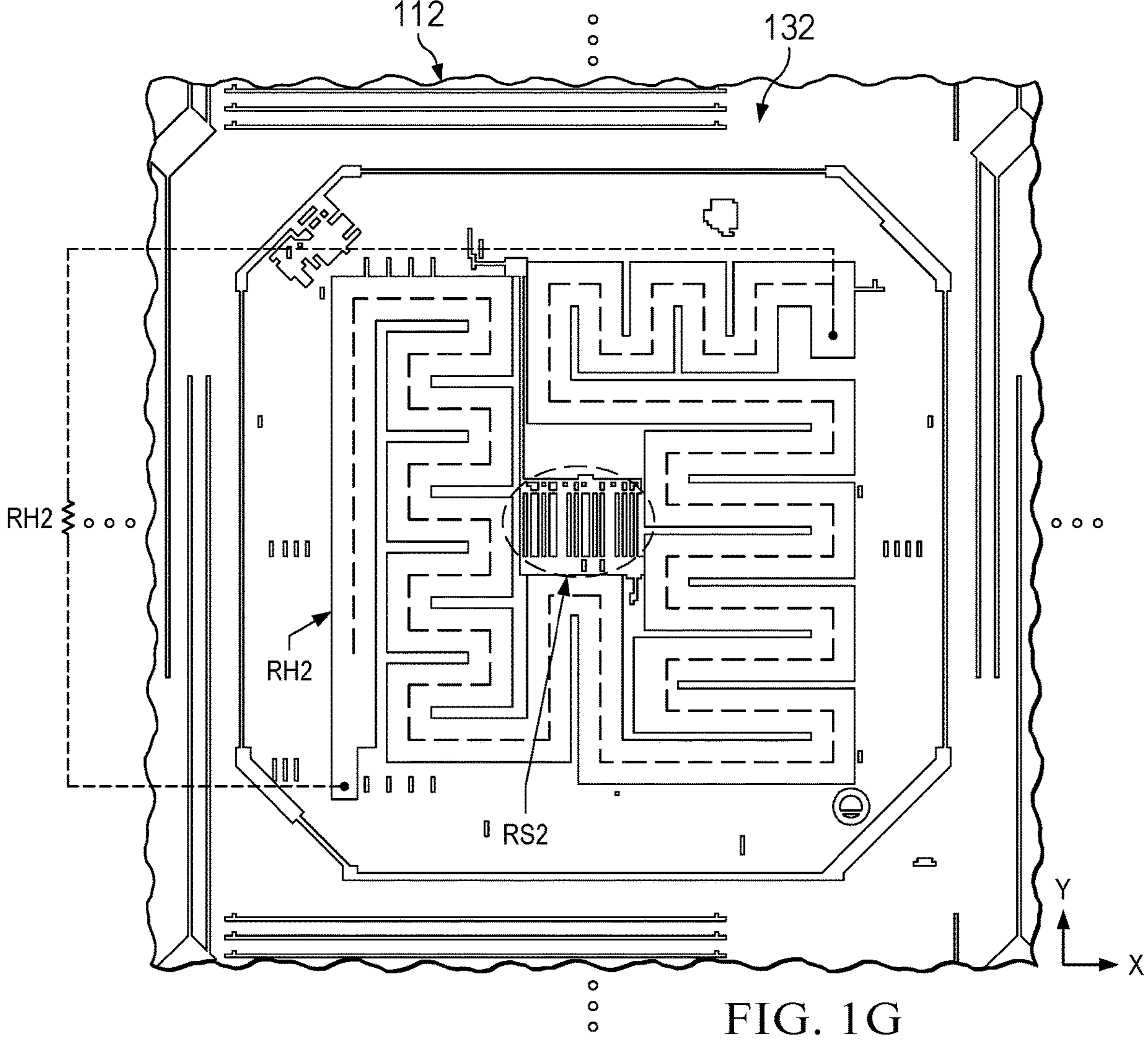
FIG. 1G is a partial top section view of one unit region of the second metallization level of the semiconductor die in the electronic device of FIG. 1.
Figure 1H:
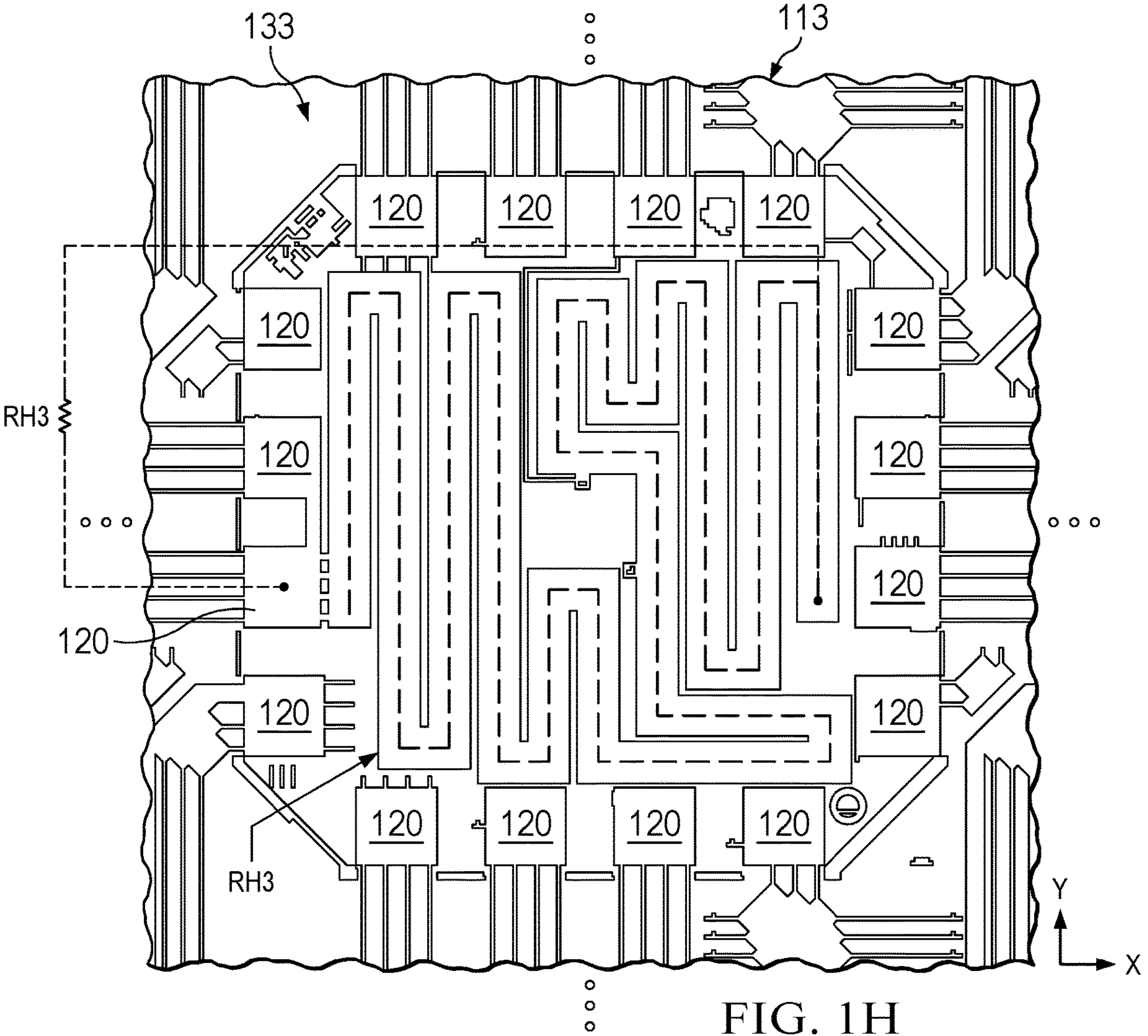
FIG. 1H is a partial top section view of one unit region of the third metallization level of the semiconductor die in the electronic device of FIG. 1.
Figure 1I:
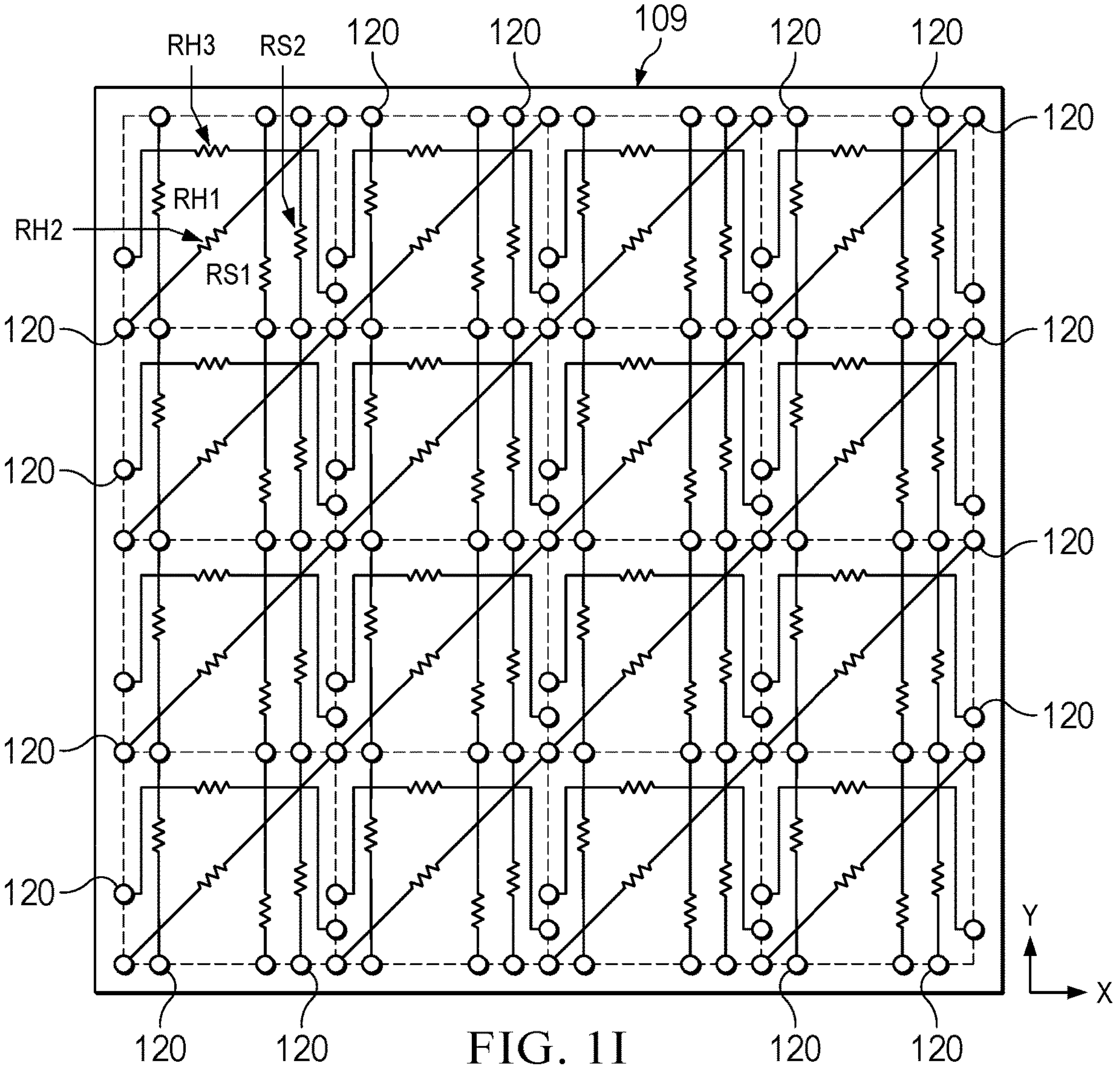
FIG. 1I is a partial schematic view of the heater resistors and sense resistors of the multilevel metallization structure in the electronic device of FIG. 1.
Figure 1J:
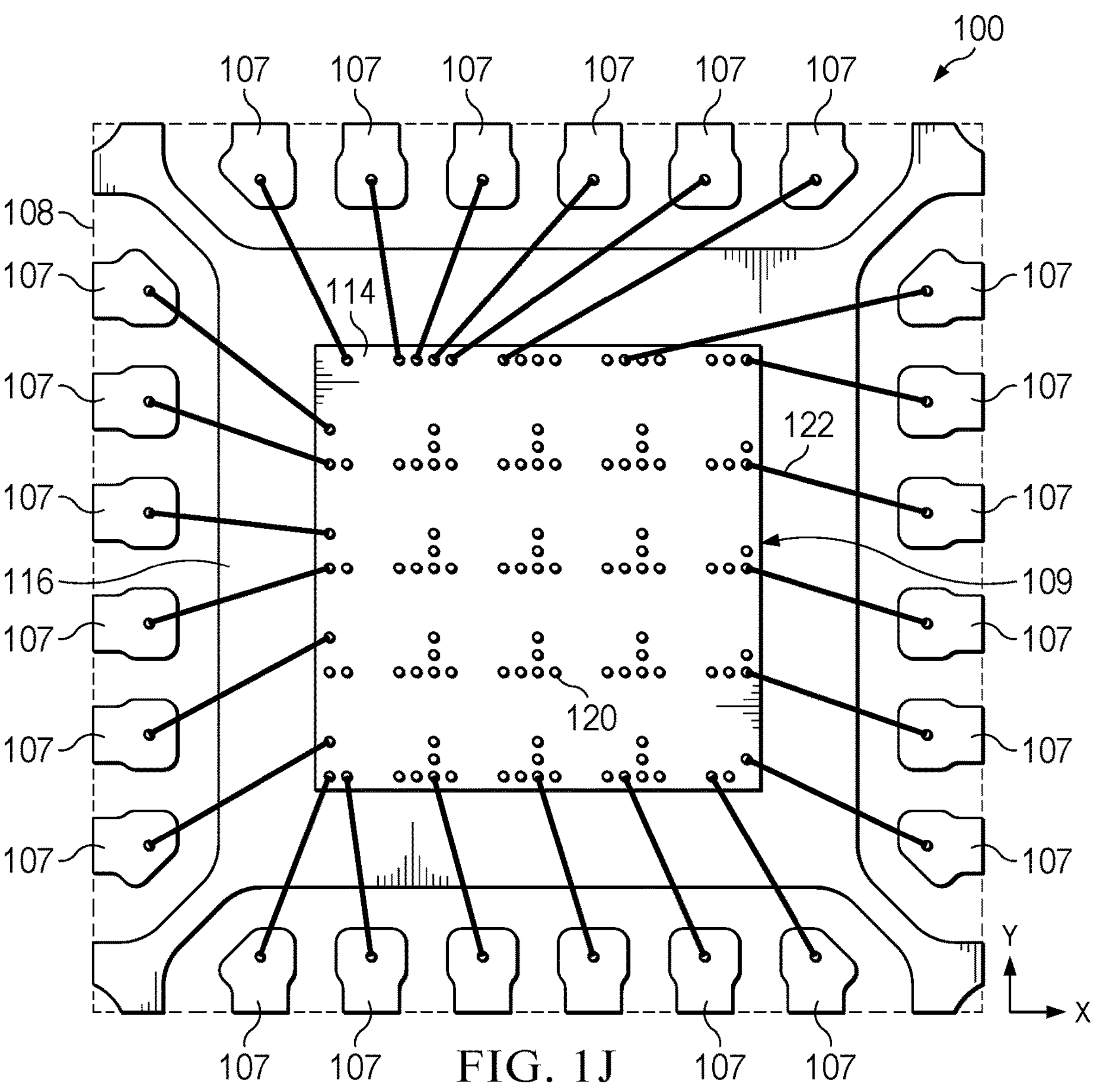
FIG. 1J is a partial top plan view of the semiconductor die attached to a die attach pad with bond wires forming electrical connections between conductive bond pad features of the semiconductor die and leads of a quad flat no lead package in the electronic device of FIG. 1.

FIGS. 1-1J show an example thermal test chip electronic device 100. FIG. 1 shows a partial side elevation view of the electronic device 100, FIG. 1A shows a top perspective view of the electronic device 100, FIG. 1B shows a partial side elevation view of a semiconductor die in the electronic device 100, FIG. 1C shows a partial top section view of a first metallization level of the semiconductor die in the electronic device taken along line 1C-1C of FIG. 1, FIG. 1D shows a partial top section view of a second metallization level of the semiconductor die in the electronic device taken along line 1D-1D of FIG. 1, FIG. 1E shows a partial top section view of a third metallization level of the semiconductor die in the electronic device taken along line 1E-1E of FIG. 1, FIG. 1F shows a partial top section view of one unit region of the first metallization level of the semiconductor die in the electronic device 100, FIG. 1G shows a partial top section view of one unit region of the second metallization level of the semiconductor die in the electronic device 100, FIG. 1H shows a partial top section view of one unit region of the third metallization level of the semiconductor die in the electronic device 100. FIG. 1I shows a partial schematic view of the heater resistors and sense resistors of the multilevel metallization structure in the electronic device 100, and FIG. 1J shows a partial top plan view of the semiconductor die attached to a die attach pad with bond wires forming electrical connections between conductive bond pad features of the semiconductor die and leads of a quad flat no lead (QFN) package in the electronic device 100.

Other implementations can use any suitable form and type of package, including without limitation no lead and leaded packages. In a given implementation, the package type and size can be selected to correspond with a packaged electronic device under development, for example, so that the test chip electronic device 100 can be installed in a socket or soldered onto corresponding conductive circuit board pads of a host printed circuit board, which may also be under design development, in order to evaluate thermal performance of the installed device 100 as well as other electronic components installed on the circuit board, packaging materials and structures, and other features and components of a system under design development.

The electronic device 100 of FIGS. 1-1J provides a thermal test chip that can be installed in a system under development, such as by soldering to a circuit board, and includes a multilevel metallization structure with metal based heating resistors and one or more sensing resistors to facilitate evaluation of thermal performance of the system. The implementation of the heater/sensor can be done at any level of the metallization structure and need not start with the initial or bottom metal level. In addition, the heater and sense resistors can be implemented using any type of metal material, including initial metallization structure layers (e.g., SiCr, polysilicon, etc.). In certain examples, the metal based heating and sensing structures provide programmatic adaptation to simulate thermal conditions to evaluate different electronic device designs and configurations, such as junction temperatures of transistors, to facilitate location and configuration of transistors or other components of an integrated circuit during design and development, and to assess thermal performance of other system components and structures in a timely cost-efficient manner. The described examples provide technology agnostic solutions for simulating thermal behavior of an electronic device and a system under design as well as measuring junction to ambient temperature, junction to case temperature, and/or temperature profiles generally in an automated fashion.

The described solutions may provide significant benefits compared with existing methods for measuring junction temperature on a silicon die such as expensive thermal test chips with diode-based heaters fabricated in silicon of the test chip that are generally limited to 150 mm or 200 mm wafers, needs front end flow processing for fabrication, and cannot measure thermal gradients. The described examples, moreover, can provide better temperature measurement resolution and accuracy compared with thermal camera measurements which commonly only detect averaged results of rising temperature. In addition, the described solutions provide significant cost and development time advantages compared with temperature measurements using a body diode of a field effect transistor (FET), which are expensive and typically not scalable for package and board evaluations during design and development of new products and systems. In some examples, the described solutions include the ability to selectively activate individual unit regions of an array of rows and columns, and also optional diagonal heater resistor activation as described further below.

The example electronic device 100 of FIGS. 1-1J is illustrated in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. As best shown in FIGS. 1 and 1A, the electronic device 100 has conductive metal leads 107 at least partially exposed outside a package structure 108, such as a molded plastic, and the electronic device has opposite first and second (e.g., bottom and top) sides 101 and 102, respectively, which are spaced apart from one another along the third direction Z. The package structure 108 and the electronic device 100 have laterally opposite third and fourth sides 103 and 104 spaced apart from one another along the first direction X, and opposite fifth and sixth sides 105 and 106 spaced apart from one another along the second direction Y in the illustrated orientation. The sides 101-106 in one example have substantially planar outer surfaces. In other examples, one or more of the sides 101-106 have curves, angled features, or other non-planar surface features.

As best shown in FIGS. 1 and 1B, the electronic device 100 includes a semiconductor die 109 having a semiconductor layer 110 and a multilevel metallization structure on the semiconductor layer 110. In one example, the semiconductor layer 110 has no circuitry and no electronic components. In the illustrated example, the semiconductor layer 110 is or includes silicon or other semiconductor material, and the multilevel metallization structure includes a first metallization level 111 on or over the semiconductor layer 110, a second metallization level 112 on or over the first metallization level 111, and a third metallization level 113 on or over the second metallization level 112, where the second metallization level 112 is spaced apart from the semiconductor layer 110 along the third direction Z and the metallization levels 111, 112, and 113 form a vertical stacked arrangement in the illustrated orientation of the electronic device 100. In addition, the semiconductor die 109 in the illustrated example includes a protective overcoat (PO) layer 114 on or over a portion of the third metallization level 113. The semiconductor die 109 is enclosed by the package structure 108. The third metallization level 113 is the final or top level of the multilevel metallization structure in the illustrated example. In other implementations, the multilevel metallization structure can have any integer number of two or more levels, with an optional protective overcoat layer 114 on or over a portion of the final level. As further shown in FIG. 1B, the semiconductor die 109 is attached to a die attach pad 116, for example, using conductive or non-conductive adhesive (not shown). The final third level 113 in the illustrated example has conductive metal features 120, portions of which are exposed through the protective overcoat layer 114. In the illustrated implementation, the conductive metal features 120 are copper or aluminum bond pads and the electronic device 100 includes bond wires 122 that form electrical connections to respective ones of the conductive features 120. In other implementations, different types and forms of conductive features 120 can be used, including without limitation conductive metal bond pads for wire bond connections, copper or other metal pillars, bumps, solder balls, etc., and other package types and forms can be used, including without limitation wafer chip scale packages (WCSP) with metal pillars for flip-chip mounting, ball grid arrays (BGA), etc.

The multilevel metallization structure provides one or more metal based heating resistors and one or more metal sense resistors to facilitate thermal testing. In some implementations, the multilevel metallization structure includes a single unit region with a single metal heating resistor in one of the metallization levels 111, 112, or 113. In other implementations, two or more of the metallization levels includes a corresponding heating resistor. In these or other implementations, one or more of the metallization levels 111-113 includes more than one heating resistor. In the above or other implementations, one or more of the metallization levels 111-113 includes a sense resistor. In these or other implementations, the multilevel metallization structure includes more than one sense resistor.

Referring also to FIGS. 1C-1E, the example multilevel metallization structure of the electronic device 100 includes an array of unit regions, numerically designated in the drawings as 131, 132, and 133 in the respective metallization levels 111, 112, and 113 shown in FIGS. 1C, 1D, and 1E, respectively. The unit regions are arranged in rows along a first direction X and columns along the second direction X. Each unit region 131, 132, and 133 includes an instance of at least one heater resistor and at least one sense resistor. In the illustrated example, each unit region of the first second and third metallization levels 111, 112, and 113 includes an instance of a respective heater resistor RH1, RH2, and RH3, and the first and second metallization levels 111 and 112 include instances of respective sense resistors RS1 and RS2 for each unit region of the array. The conductive metal features 120 of the multilevel metallization structure are electrically coupled to respective terminals of the heater resistors RH1, RH2, and RH3 and the sense resistors RS1 and RS2, and at least some of the conductive metal features 120 are electrically coupled to respective ones of the conductive leads 107 as shown in FIG. 1J. This allows an external test system to selectively activate (e.g., provide current to) individual ones and/or series connected groups of the heater resistors RH1, RH2, and RH3 in select unit regions, for example, along selected columns, rows, and/or diagonal directions of the array, and also to sense local temperatures of the unit regions using all or selected ones or groups of the sense resistors RS1 and RS2, for example, as illustrated and described further below in connection with FIGS. 14-32. In one example, the heater resistors and sense resistors are or include conductive metal, such as copper or aluminum or alloys thereof as discussed further below. In another example, the heater resistors and sense resistors are or include another conductive material, such as polycrystalline silicon (polysilicon) or silicon chromium (SiCr). In further examples, the heater resistors and sense resistors are or include nickel-chromium (e.g., NiCr), tantalum nitride (e.g., TaN), gold, thick copper, damascene copper, or other conductive metal.

Referring also to FIGS. 1C-1E, FIG. 1C shows the first metallization level 111 of the semiconductor die 109 in the electronic device 100 taken along line 1C-1C of FIG. 1, including the unit regions 131 in four rows and four columns of a 4×4 array. The first metallization level 111 and the other metallization levels 112 and 113 each include patterned metal features, such as a metal that is or includes copper, aluminum, etc., as well as an insulator or dielectric material that extends between the metal features and between levels of the multilevel metallization structure. The metal features of the individual metallization levels 111-113 can include traces or lines as well as conductive metal vias making interconnections between metallization levels and can be formed by any suitable technique such as single or dual damascene processes. FIG. 1D shows the second metallization level 112 along line 1D-1D of FIG. 1 including unit regions 132 and FIG. 1E shows the third metallization level 113 of the semiconductor die 109 along line 1E-1E of FIG. 1, in the four rows and four columns of a 4×4 array.

FIGS. 1F-1H show further details of one of the unit regions 131, 132, 133 of the 4×4 array in the multilevel metallization structure. FIG. 1F shows a partial top section view of one unit region 131 of the first metallization level 111 of the semiconductor die 109 in the electronic device 100, which includes an instance of a first heater resistor RH1 formed as a serpentine metal structure in a first X-Y plane. FIG. 1F also schematically illustrates the instance of a first heater resistor RH1 with schematically illustrated ends or terminals of the instance of the first heater resistor RH1, which are aligned in this example along the second direction Y. This facilitates interconnection of the instances of the first heater resistor RH1 along columns of the 4×4 array, and the multilevel metallization structure can include internal connections to form a series circuit of instances of the first heater resistor RH1 along the second direction, with end connections of the series circuits connected to exposed conductive bond pad features 120 for bond wire connections to leads 107 of the electronic device 100. As further shown in FIG. 1F, the unit region 131 includes an instance of the first sense resistor RS1.

FIG. 1G shows a partial top section view of one unit region 132 of the second metallization level 112 of the semiconductor die 109 in the electronic device 100. The unit region 132 includes an instance of a second heater resistor RH2 formed as a serpentine metal structure in a second X-Y plane. FIG. 1G also schematically illustrates the instance of a second heater resistor RH2 with schematically illustrated ends or terminals of the instance of the second heater resistor RH2, which are aligned in this example along the diagonal direction of the unit region 132. This facilitates interconnection of the instances of the second heater resistor RH2 along diagonal directions of the 4×4 array, and the multilevel metallization structure can include internal connections to form a series circuit of instances of the second heater resistor RH2 along the diagonal direction, with end connections of the series circuits connected to exposed conductive bond pad features 120 for bond wire connections to leads 107 of the electronic device 100. As further shown in FIG. 1G, the unit region 132 includes an instance of the second sense resistor RS2.

FIG. 1H shows a partial top section view of one unit region 133 of the third metallization level 113 of the semiconductor die 109 in the electronic device 100. The unit region 133 includes an instance of a third heater resistor RH3 formed as a serpentine metal structure in a third X-Y plane. FIG. 1H also schematically illustrates the instance of a third heater resistor RH3 with schematically illustrated ends or terminals of the instance of the third heater resistor RH3, which are aligned in this example along the first direction X of the unit region 133. This facilitates interconnection of the instances of the third heater resistor RH3 along rows of the 4×4 array, and the multilevel metallization structure can include internal connections to form a series circuit of instances of the third heater resistor RH3 along the first direction X, with end connections of the series circuits connected to exposed conductive bond pad features 120 for bond wire connections to leads 107 of the electronic device 100.

Referring also to FIGS. 1I and 1J, FIG. 1I schematically illustrates the heater resistors RH1, RH2, and RH3 as well as the sense resistors RS1 and RS2 of the multilevel metallization structure in the electronic device 100. FIG. 1I also shows example locations of the conductive features 120 of the final third metallization level 113, some or all of which can be exposed through the protective overcoat layer 114 (FIGS. 1 and 1B). FIG. 1J shows a partial top plan view of the semiconductor die 109 attached to the die attach pad 116 with bond wires 122 forming electrical connections between conductive bond pad features 120 of the semiconductor die 109 and respective ones of the leads 107 of a quad flat no lead (QFN) package structure 108 in the electronic device 100.

In one implementation, the multilevel metallization structure 111, 112, 113 includes a set of series circuits including the instances of the heater resistor RH1 in the respective unit regions 131, 132, 133 along columns of the array, with each respective series circuit including a pair of the conductive metal features 120 electrically coupled to end terminals of the instances of the heater resistor RH1 of the respective series circuit. In this or another implementation, the multilevel metallization structure 111, 112, 113 includes a set of second series circuits including at least one of the instances of the second heater resistor RH2 in respective unit regions 131, 132, 133 along diagonal directions of the array, each respective second series circuit including a second pair of the conductive metal features 120 electrically coupled to end terminals of the instances of the second heater resistor RH2 of the respective second series circuit. In these or another implementation, the multilevel metallization structure 111, 112, 113 includes a set of third series circuits including the instances of the third heater resistor RH3 in the respective unit regions 131, 132, 133 along one or more rows of the array, with each respective third series circuit including a pair of the conductive metal features 120 electrically coupled to end terminals of the instances of the third heater resistor RH3 of the respective third series circuit. In further implementations, the electronic device can include any number of metallization levels with one or more unit regions having one or more heater resistors and/or one or more sense resistors in a given unit region, and the unit regions can, but need not, be identical. In these or other implementations, the heater resistors can be of the same or similar resistance, or the heater resistances can be different, for example, where the instances of the first heater resistor RH1 have a resistance value or range that is different than the resistance value or range of the instances of the second heater resistor RH2. In these or other implementations, the sense resistors can be of the same or similar resistance, or the sense resistances can be different, for example, where the instances of the first sense resistor RS1 have a resistance value or range that is different than the resistance value or range of the instances of the second sense resistor RS2. In these or another implementation, the heater resistors have lower resistances than the sense resistors, for example, where the heater resistors RH1, RH2, and RH3 are approximately 10Ω and the sense resistors RS1 and RS2 are approximately 1.3 kΩ to facilitate operation of the thermal test chip electronic device 100 to receive heating current using the heating resistor(s) and measure temperature using the high resistance sense resistor(s).

Referring now to FIGS. 2-14, FIG. 2 shows a method 200 of fabricating a thermal test chip electronic device and an included test method that uses the test chip electronic device 100 of FIGS. 1-1J for thermal performance testing of a circuit board. The method 200 in one example uses a starting semiconductor wafer for making the electronic device 100. FIG. 3 shows an example silicon or SOI wafer 110, which can be of any suitable size, for example, a 300 mm diameter silicon wafer. In the illustrated example, the semiconductor wafer 110 does not include any circuits or electronic components, and the heater and sense resistors are instead created in the subsequently formed multilayer metallization structure.

Figure 2:
FIG. 2 is a flow diagram of a method of fabricating a thermal test chip electronic device and using the test chip for thermal performance testing of a circuit board.
Figure 2:
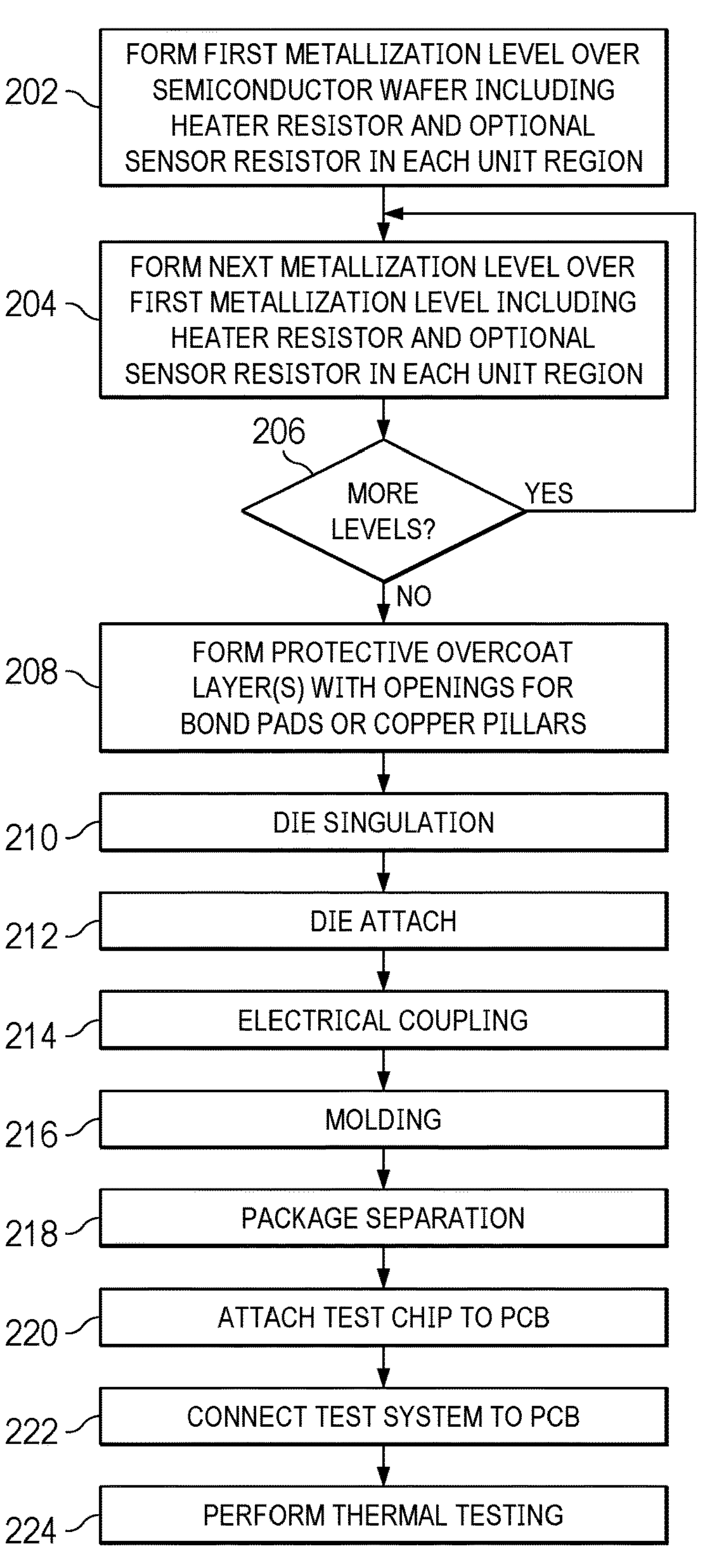
Figure 3:
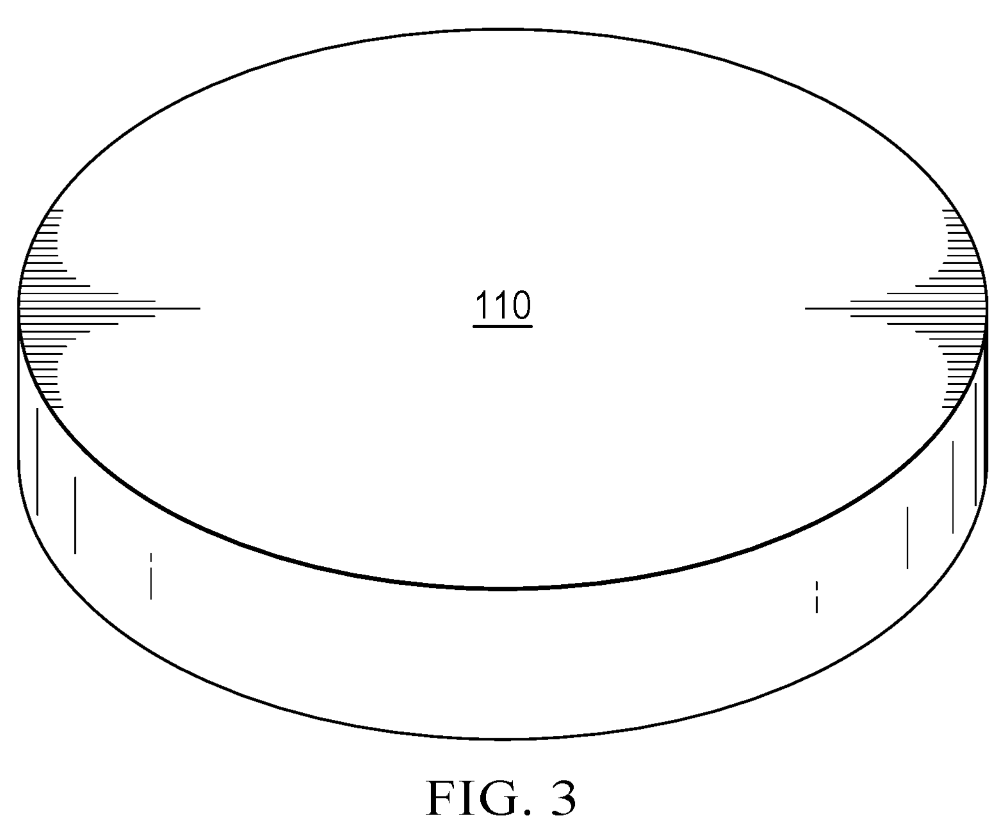
FIG. 3 is a top perspective view of a semiconductor wafer use for making the electronic device of FIG. 1.
Figure 4:
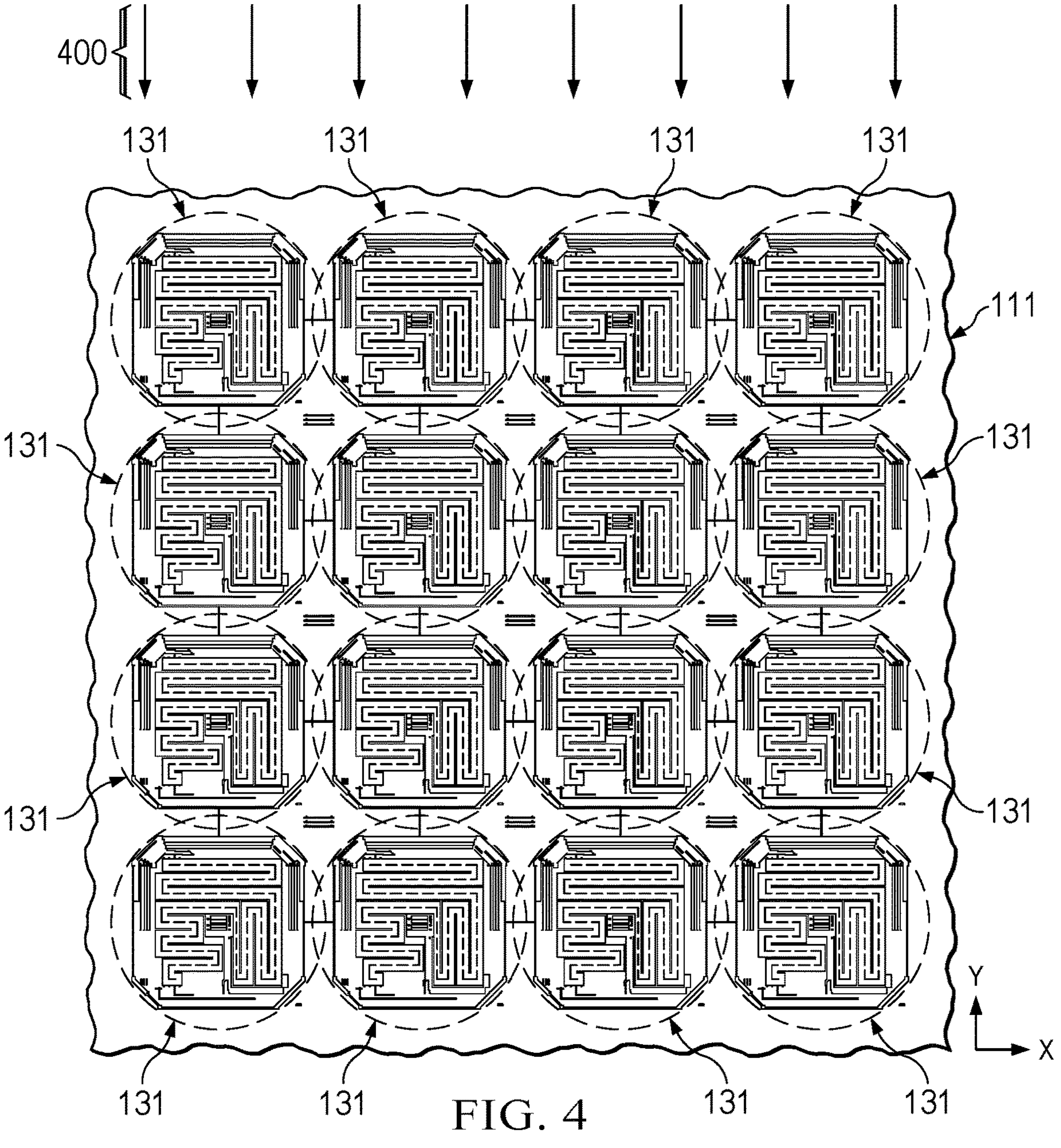
FIG. 4 is a partial top plan view of a portion of the wafer undergoing a first metallization level formation process to form a first metallization level of the electronic device of FIG. 1.

The multilayer metallization structure processing begins at 202 in FIG. 2, including formation of a first metallization level over (e.g., directly on) the semiconductor wafer 110. FIG. 4 shows a partial top plan view of a portion of the semiconductor wafer 110 undergoing a first metallization level formation process 400 that forms the first metallization level 111 above the semiconductor wafer 110. In one example, the metallization level formation process 400 is a single damascene process that deposits an insulator or dielectric (e.g., silicon dioxide) over the top side of the semiconductor wafer 110 and the process includes a patterned etch to form recesses or openings into which metal is deposited (e.g., aluminum, copper, alloys thereof, etc.) to form metal first vias and another similar single damascene process to form first metal line or trace features. In another example, since no electrical connections are needed to the underlying semiconductor wafer 110, the first metallization level formation process 400 can include a single deposition of a dielectric layer above (e.g., directly on) the top side of the semiconductor wafer 110, followed by patterned etching of the dielectric layer to form openings for the first metal level traces or lines to define the first heater resistor and the first sense resistor in each unit region 131 for the example 4×4 array. The structures are then planarized, such as by chemical mechanical polishing (CMP) to form a planar top surface with exposed topsides of the metal features and top sides of the dielectric between the metal features as shown in FIG. 4. In yet another implementation, a dual damascene process can be used to form the first metallization level 111 at 202.

Figure 5:
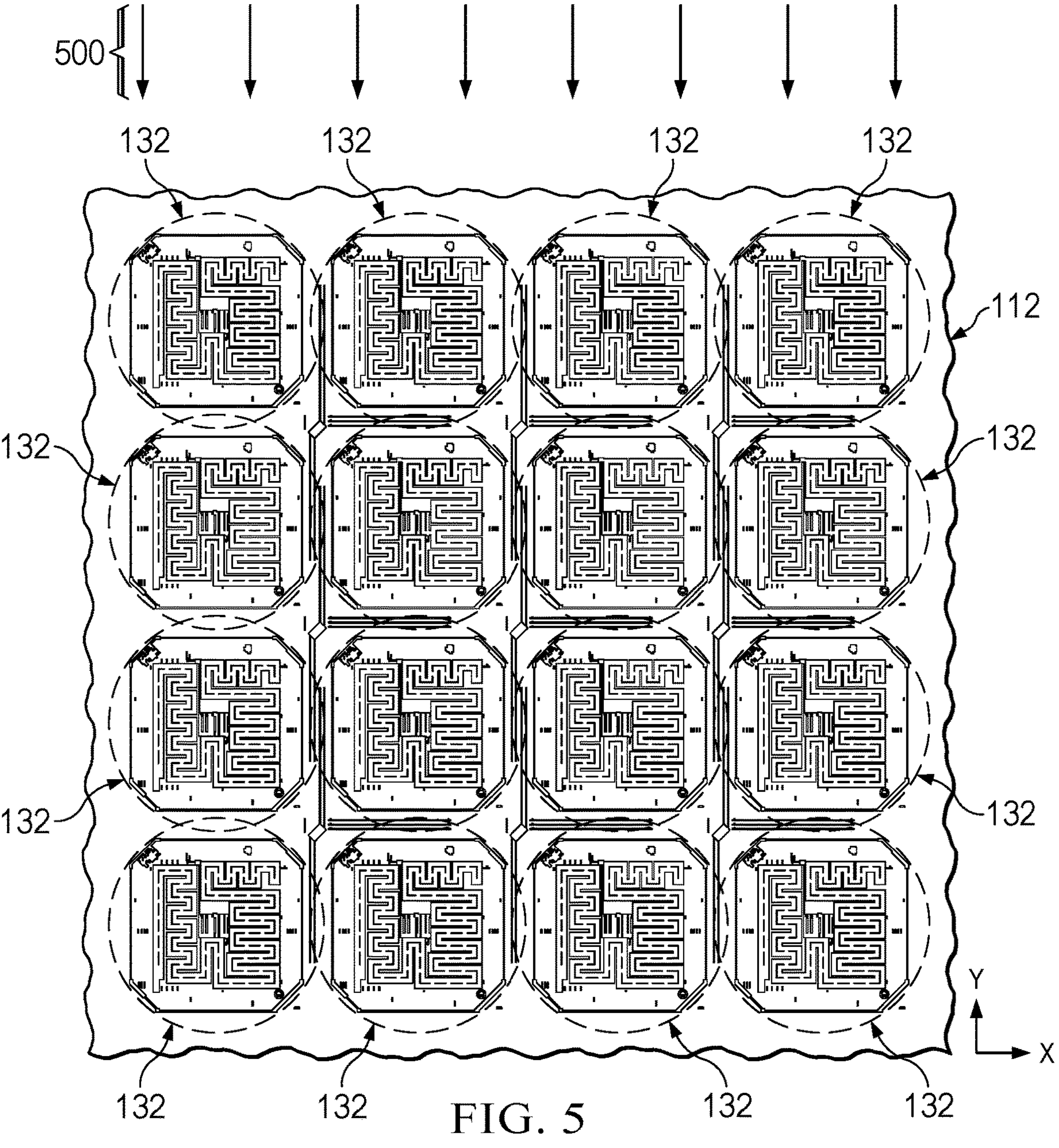
FIG. 5 is a partial top plan view of a portion of the wafer undergoing a second metallization level formation process to form a second metallization level of the electronic device of FIG. 1.

The method 200 continues with forming a next metallization level at 204 in FIG. 2. FIG. 5 shows one example, in which a second metallization level formation process 500 is performed, that forms the second metallization level 112 above the first metallization level 111. In one implementation, the second metallization level formation process 500 at 204 is or includes the same or similar processing steps as the process 400 used in forming the first metallization level 111. In one example, the second metallization level formation process 500 is a single damascene process that deposits a second insulator or dielectric layer (e.g., silicon dioxide) over the top side of the first metallization level 111, and the process includes a patterned etch to form recesses or openings into which metal is deposited (e.g., aluminum, copper, alloys thereof, etc.) to form metal second vias followed by planarization and another similar single damascene process to form a second metal line or trace features. In another example a dual damascene process can be used to form the second metallization level 112 at 204. The second metallization level formation process 500 forms second metal level traces or lines to define the second heater and sense resistors in each unit region 132 as shown in the top view of FIG. 5.

Figure 6:
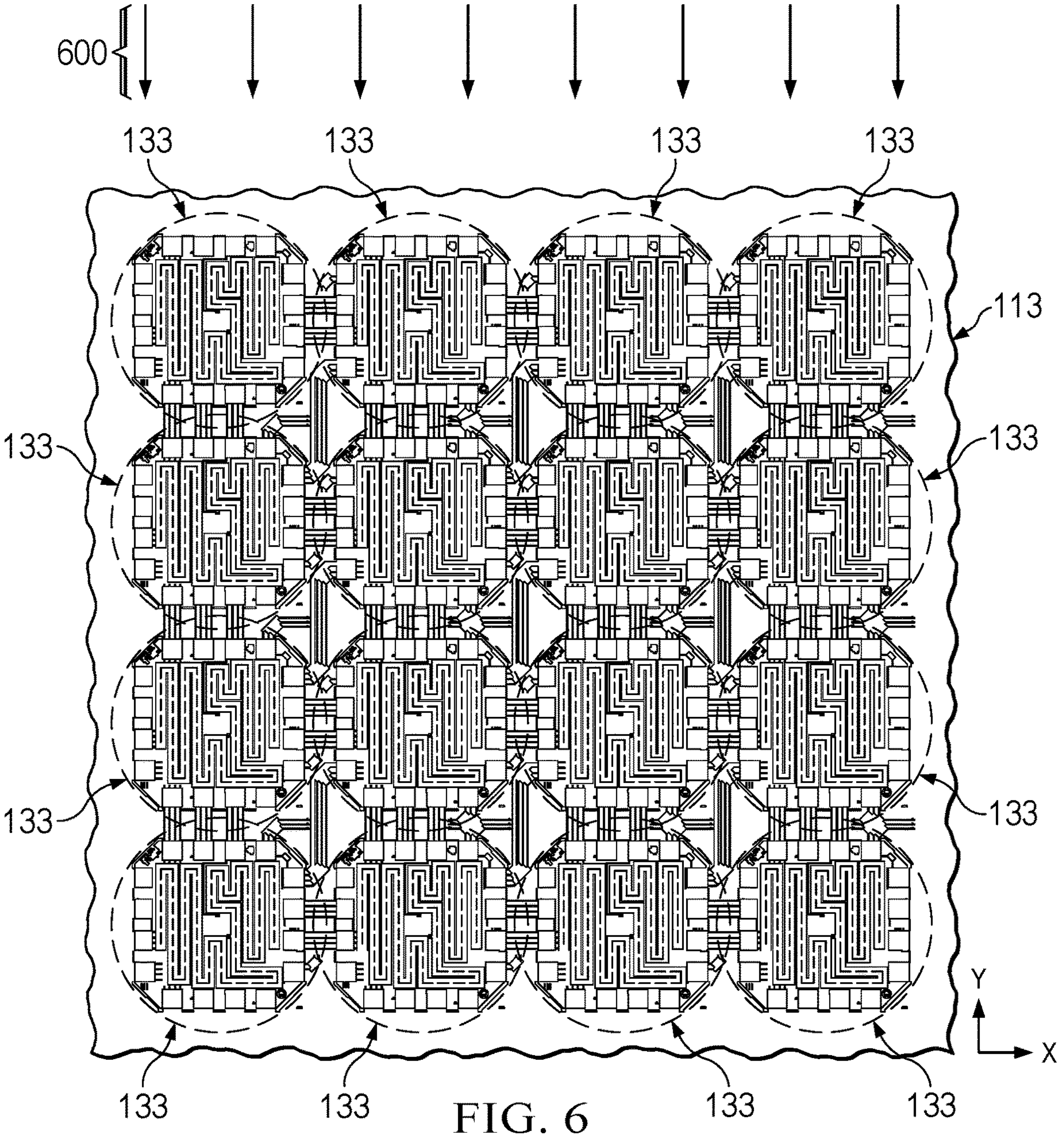
FIG. 6 is a partial top plan view of a portion of the wafer undergoing a third metallization level formation process to form a third metallization level of the electronic device of FIG. 1.

The method 200 of FIG. 2 accommodates any integer number of two or more metallization levels, and a determination is made at 206 in FIG. 2 as to whether more levels are needed for a given design. If so (YES at 206), the processing at 204 is repeated for the next level. FIG. 6 shows one example, in which a third metallization level formation process 600 is performed, that forms the unit regions 133 of the third metallization level 113 above the second metallization level 112. In one implementation, the third metallization level formation process 600 at 204 is or includes the same or similar processing steps as the process 500 used in forming the second metallization level 112 with different masks. In one example, the third metallization level formation process 600 is a single damascene process that deposits a third insulator or dielectric layer (e.g., silicon dioxide) over the top side of the second metallization level 112, and the process includes a patterned etch to form recesses or openings into which metal is deposited (e.g., aluminum, copper, alloys thereof, etc.) to form metal third vias followed by planarization and another similar single damascene process to form a third metal line or trace features as shown in FIG. 6. In another example a dual damascene process can be used to form the third metallization level 113 at 204. The third metallization level formation process 600 forms third metal level traces or lines to define the third heater resistor instances and the conductive features 120 (e.g., bond pads) in each unit region 133 as shown in FIG. 6.

Figure 7:
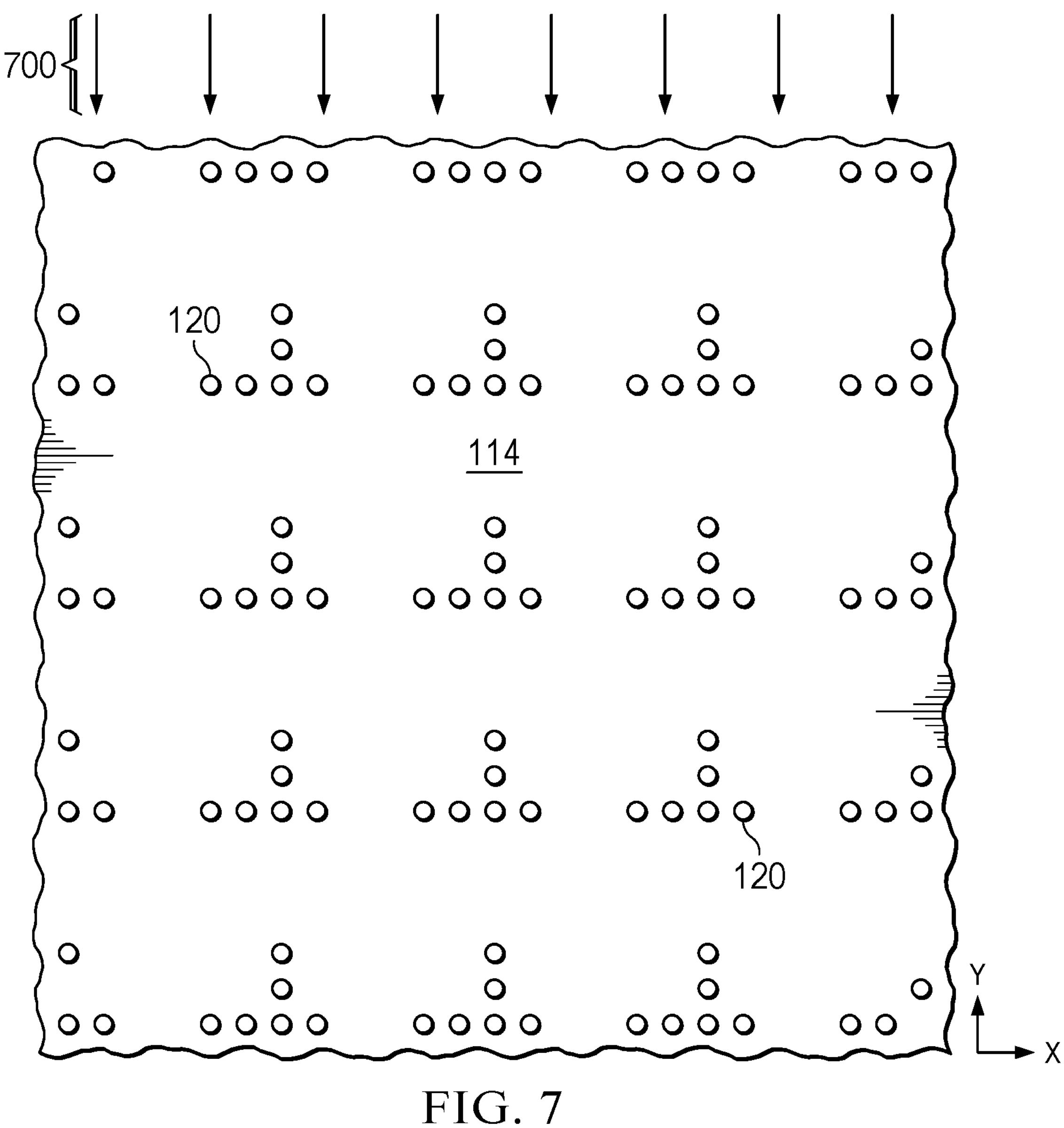
FIG. 7 is a partial top plan view of a portion of the wafer undergoing a protective overcoat layer formation process to form a protective overcoat layer on the electronic device of FIG. 1.

The method 200 continues until the desired number of metallization levels have been fabricated (NO at 206) and includes an optional protective overcoat layer formation at 208. FIG. 7 shows one example, in which a deposition process 700 is performed that deposits an oxide or other suitable protective overcoat layer or layers 114 on the top side of the final (e.g., third) metallization level 113 at 206. As shown in the top view of FIG. 7, the protective overcoat layer 114 in one example exposes the upper portions of the conductive features 120 (e.g., the bond pads, pillars, bumps, WSCP and/or BGA structures, etc.) for subsequent electrical connection by bond wires, flip chip soldering, flip chip conductive adhesive attachment, or other suitable electrical connection technique to provide electrical connection of the heater and sense resistors of the array to leads of the finished electronic device 100.

Figure 8:
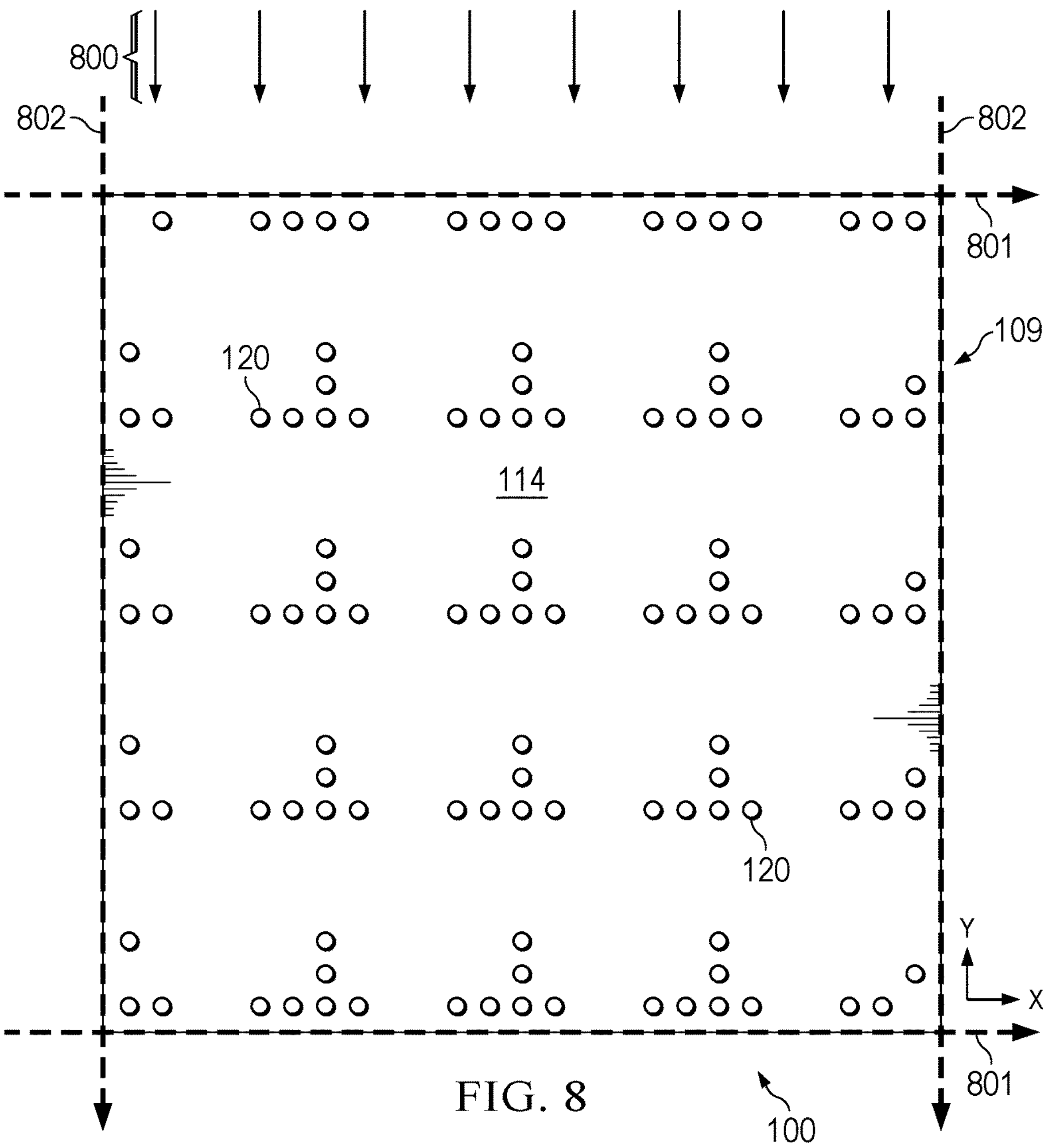
FIG. 8 is a partial top plan view of a portion of the wafer undergoing a die singulation process to separate the die of the electronic device of FIG. 1 from the starting wafer.

At 210 in FIG. 2, the semiconductor die 109 is singulated or otherwise separated from the processed wafer. FIG. 8 shows one example, in which a laser or saw cutting singulation or separation process 800 is performed that cuts through the wafer 110 and the multilevel metallization structure along first lines 801 along the first direction X, and along second lines 802 along the second direction Y. The die singulation process 800 separates the semiconductor die 109 from the processed wafer.

Figure 9:
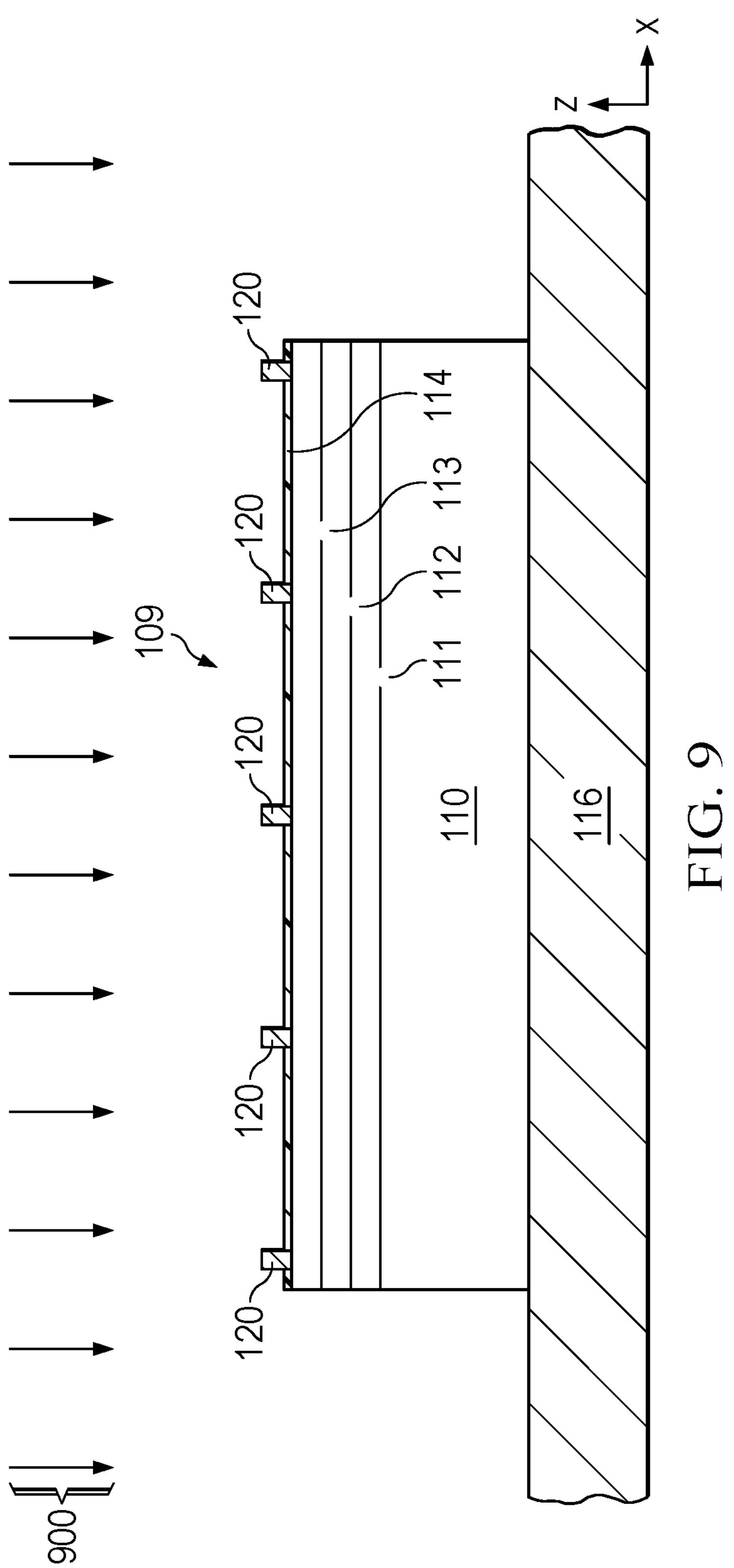
FIG. 9 is a partial sectional side elevation view of one unit area of a starting lead frame panel undergoing a die attach process to attach the semiconductor die to a die attach pad.
Figure 10:
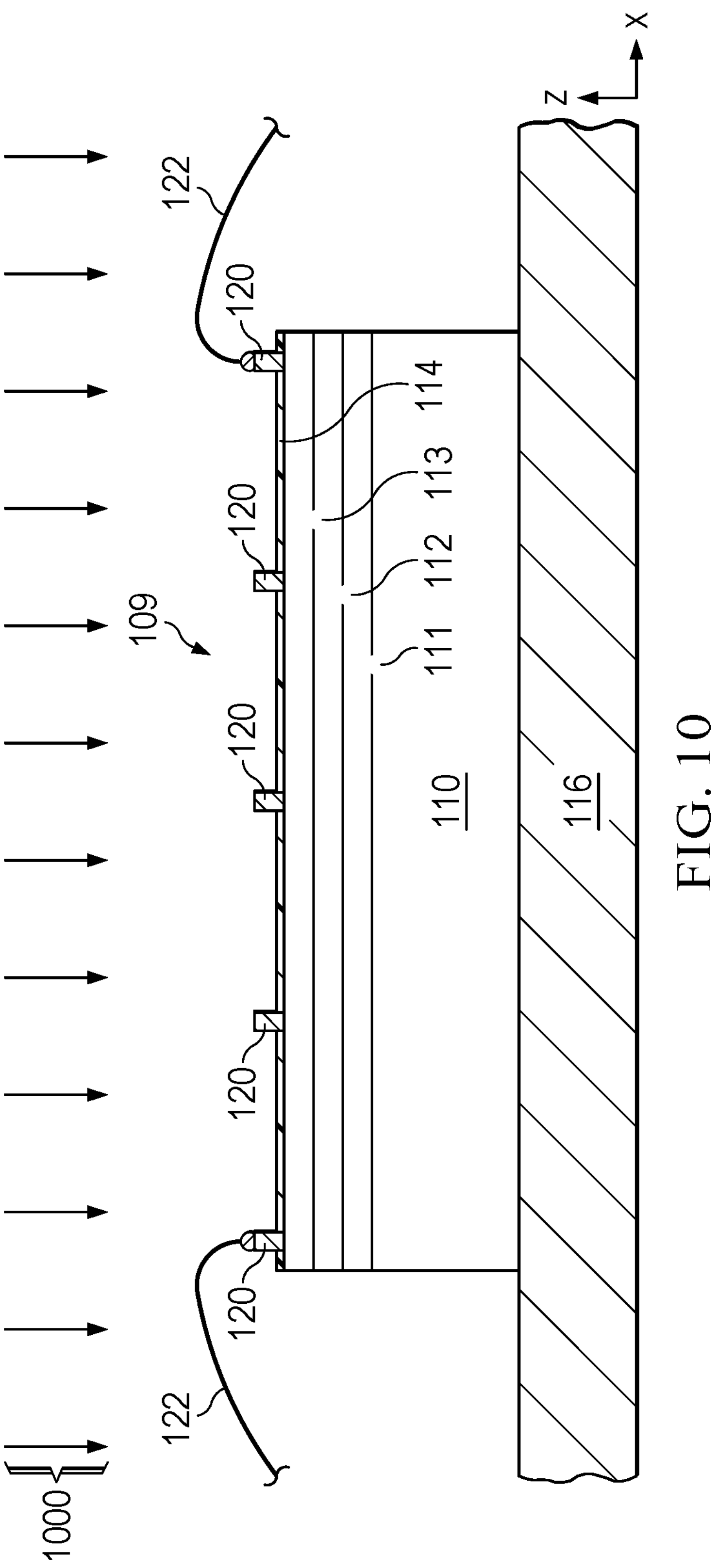
FIG. 10 is a partial sectional side elevation view of the unit area of the lead frame panel undergoing a wirebonding process to electrically connect conductive bond pads of the semiconductor die to conductive leads.

The method 200 continues at 212 and FIG. 2 with die attach processing, and electrical connection at 214. In one example, the semiconductor die 109 is attached at 212 in FIG. 2 to a die attach pad 116 by a die attach process 900 as shown in FIG. 9, and a wire bonding process 1000 is performed at 214 as shown in FIG. 10 to form bond wire electrical connections 122 from specific ones of the conductive features 120 of the semiconductor die 109 and leads 107 of the electronic device (e.g., FIGS. 1 and 1B above). In another example, the conductive features 120 of the semiconductor die 109 are or include copper pillars or solder balls (not shown), and the die attach processing at 212 and the electrical connection processing at 214 are implemented by flip chip die attach and soldering of the conductive features 122 corresponding conductive features of a single or multilayer package substrate (e.g., FIGS. 38-38B below). The flip chip attachment and/or wire bonding at 214 provides electrical coupling of the heater and sense resistors of the multilevel metallization structure of the semiconductor die 109 two corresponding conductive leads 107, for example, as illustrated and described above in connection with FIG. 1J.

Figure 11:
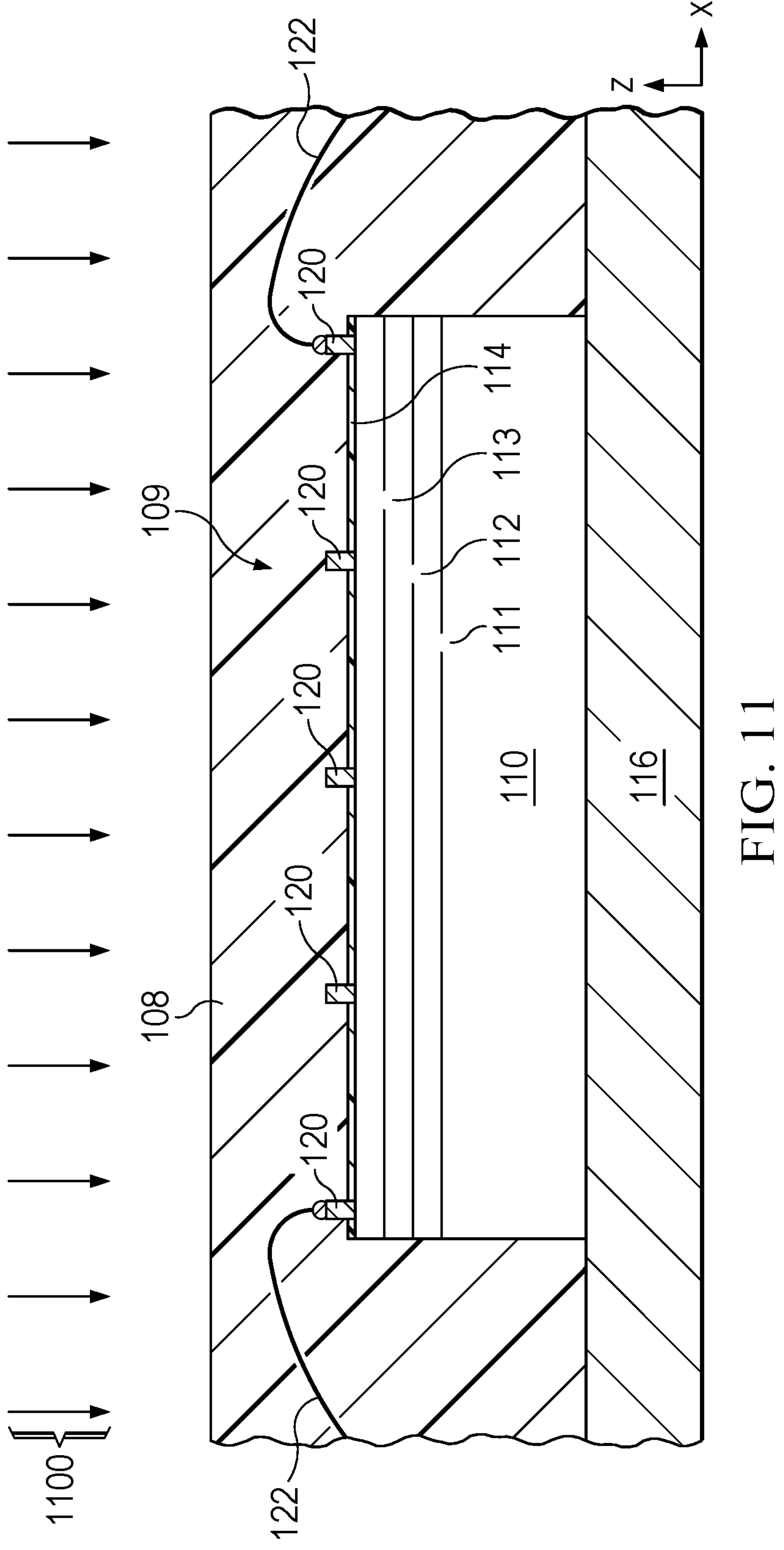
FIG. 11 is a partial sectional side elevation view of the unit area of the lead frame panel undergoing a molding process to form a package structure.
Figure 12:
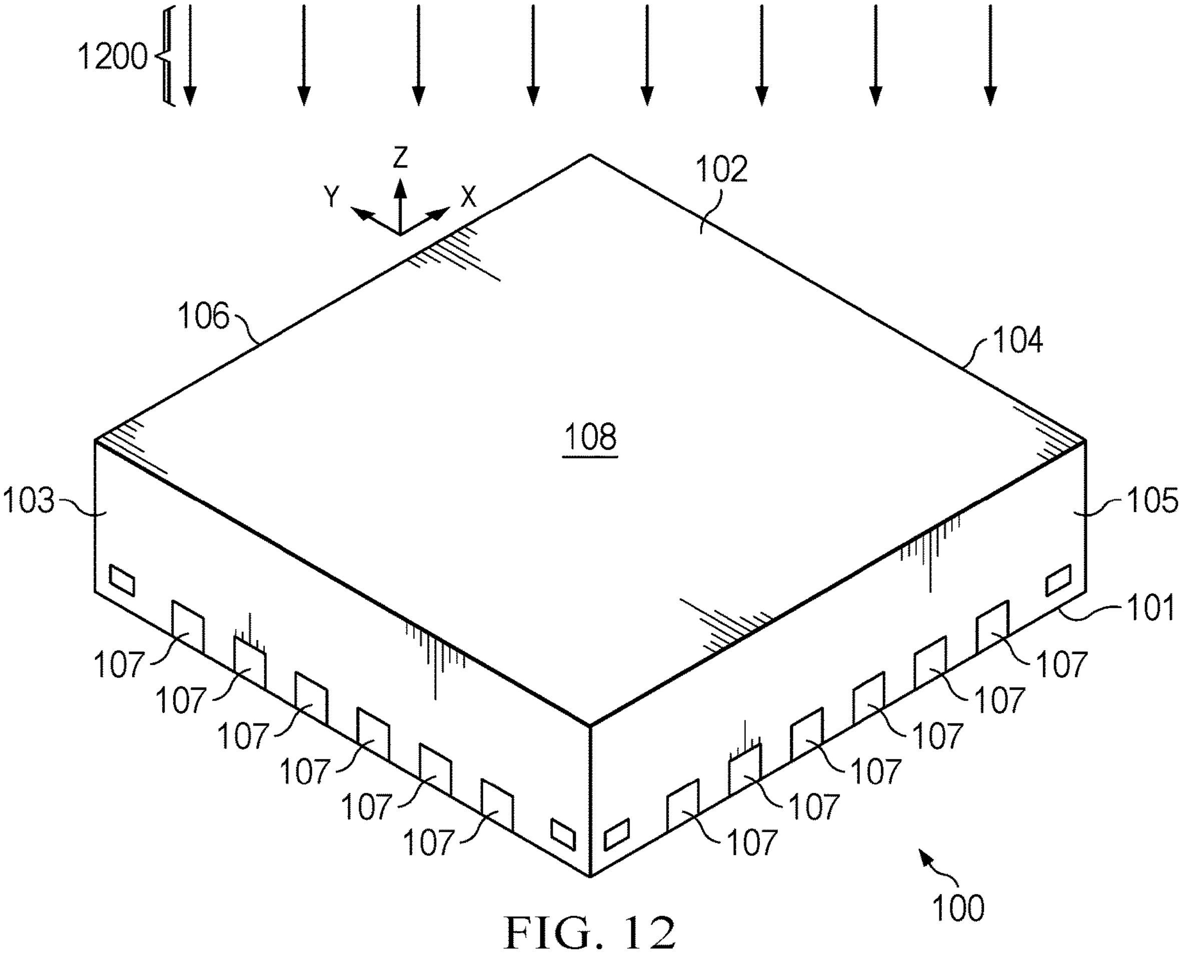
FIG. 12 is a partial top perspective view of the unit area of the lead frame panel undergoing a package separation process to separate the electronic device of FIG. 1 from the lead frame panel.

The method 200 also includes molding or other package formation processing at 216 in FIG. 2. FIG. 11 shows one example, in which a molding process 1100 is performed that forms the molded package structure 108 that encloses the metallization levels 111, 112, and 113, as well as the semiconductor layer 110 and portions of the conductive leads 107. As discussed above, the illustrated example is a QFN electronic device 100. In other implementations, different package forms and sizes and configurations can be used. The method 200 includes package separation at 218. FIG. 12 shows one example, in which a package separation process 1200 is performed that separates the packaged electronic device 100 from a panel array. In one example, the [package separation process is or includes a cutting step or steps, such as laser or saw cutting operations.

Figure 13:
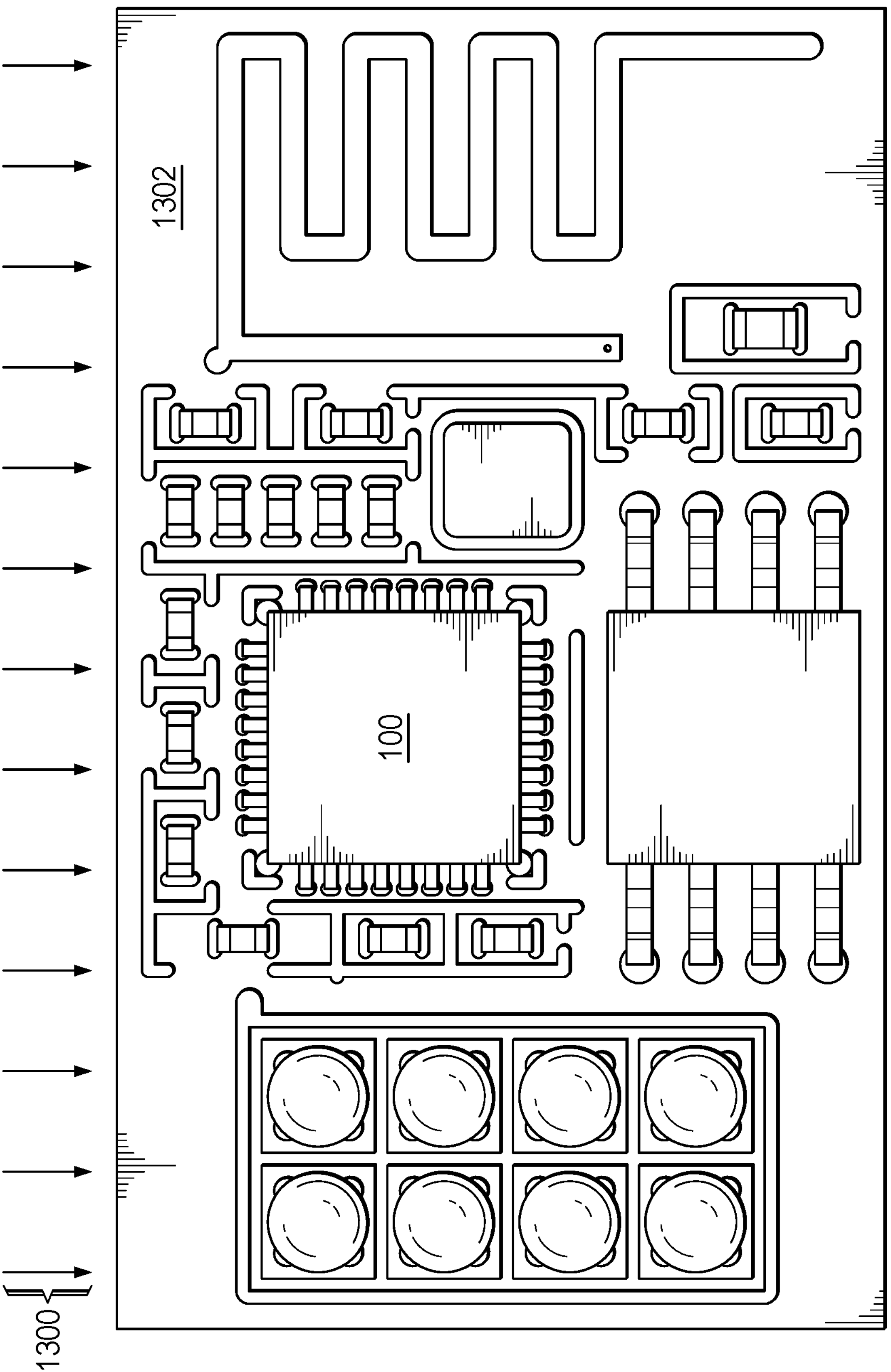
FIG. 13 is a partial top plan view of a circuit board undergoing a process to attach the test chip electronic device of FIG. 1 to the circuit board.
Figure 14:
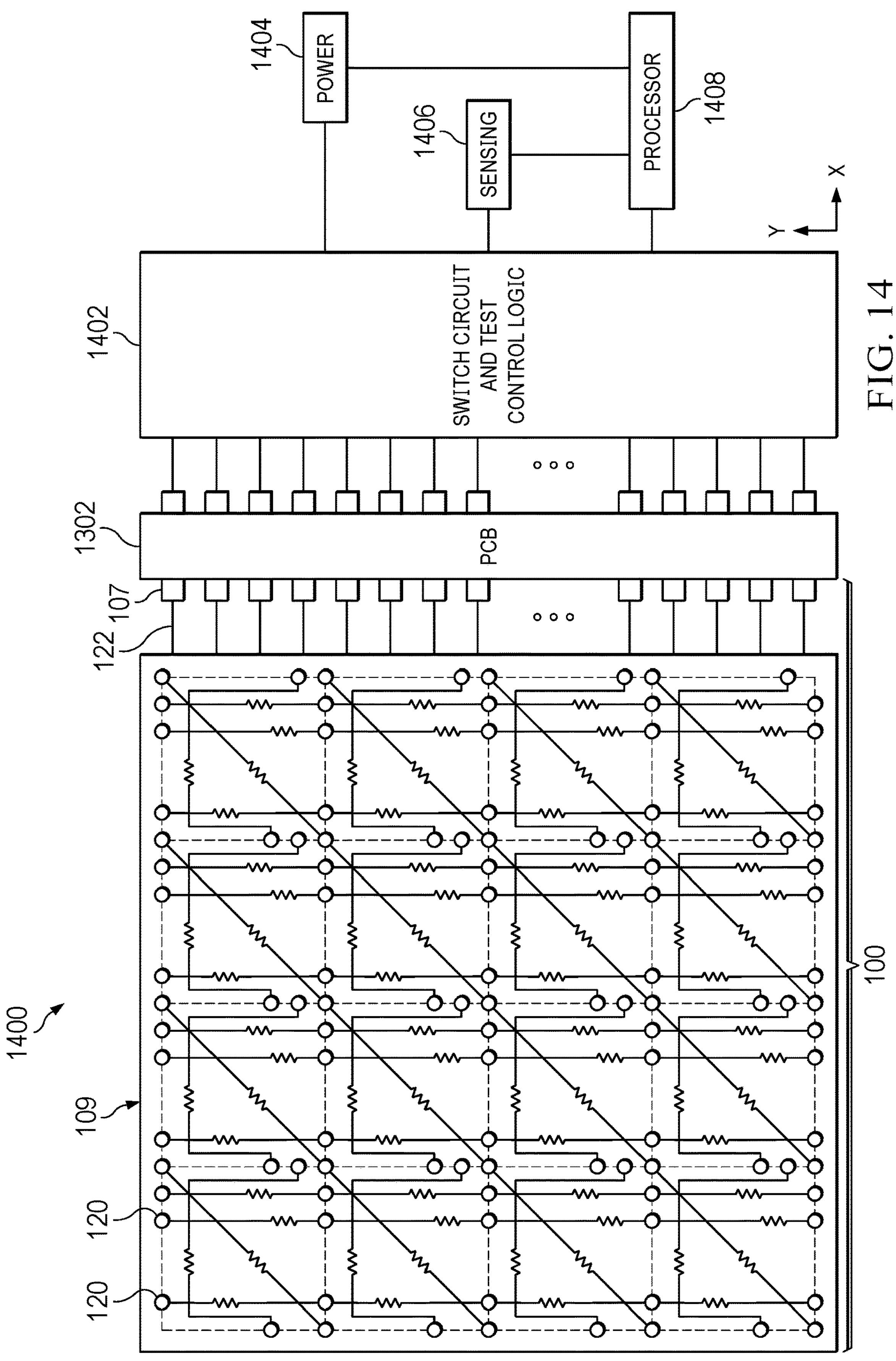
FIG. 14 is a schematic diagram of a thermal test system including the test chip of FIG. 1 attached to the circuit board for thermal testing.
Figure 15:
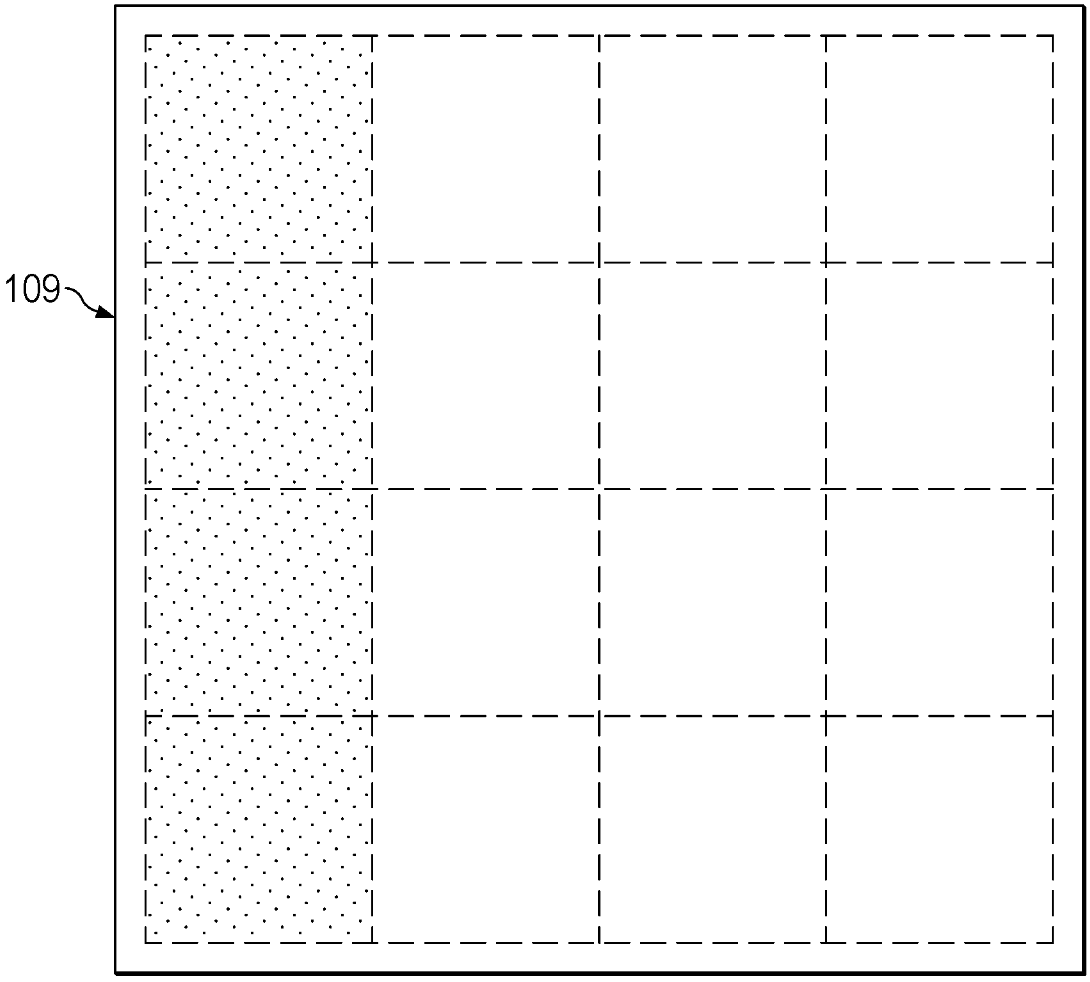
FIGS. 15-32 are simplified top plan views showing heater resistor activation states for an array of unit regions in the multilevel metallization structure in the electronic device of FIG. 1 during thermal testing.
Figure 16:
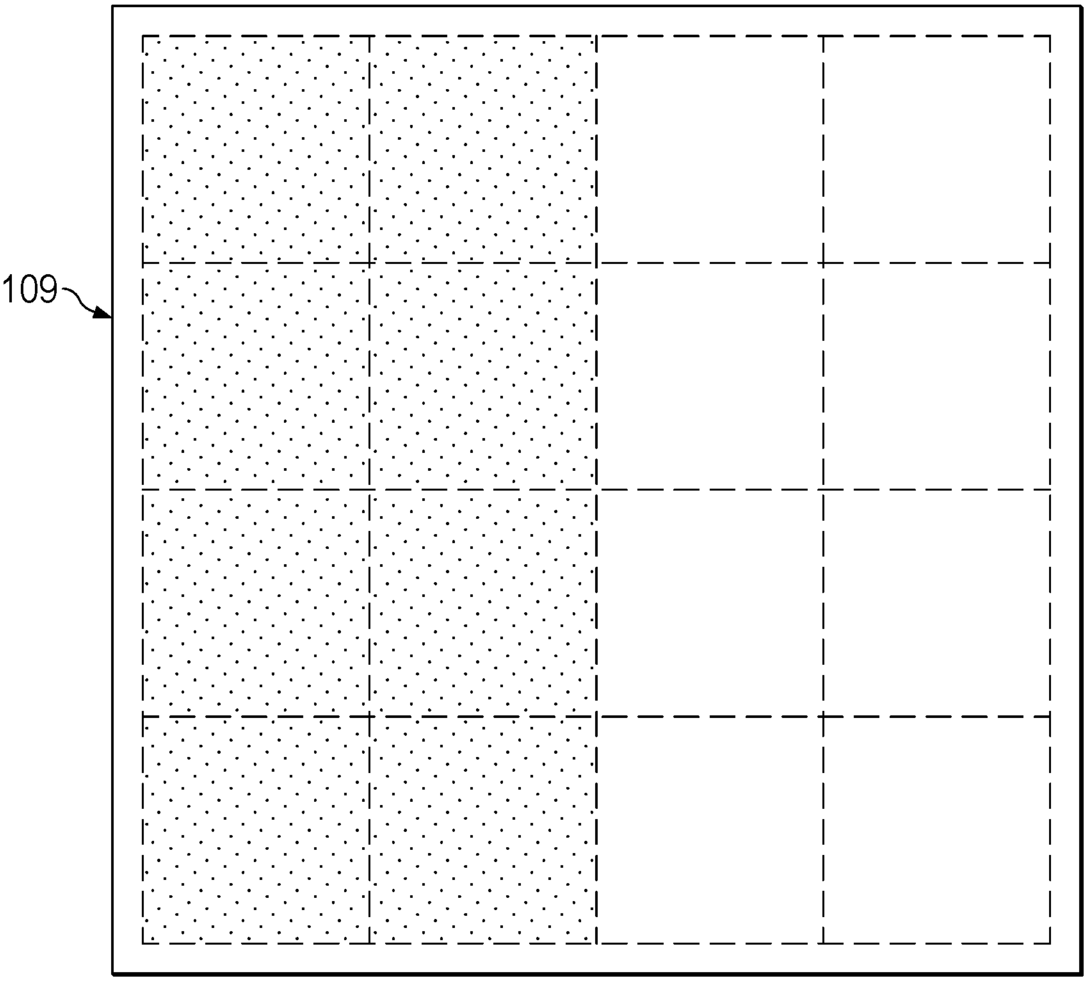
Figure 17:
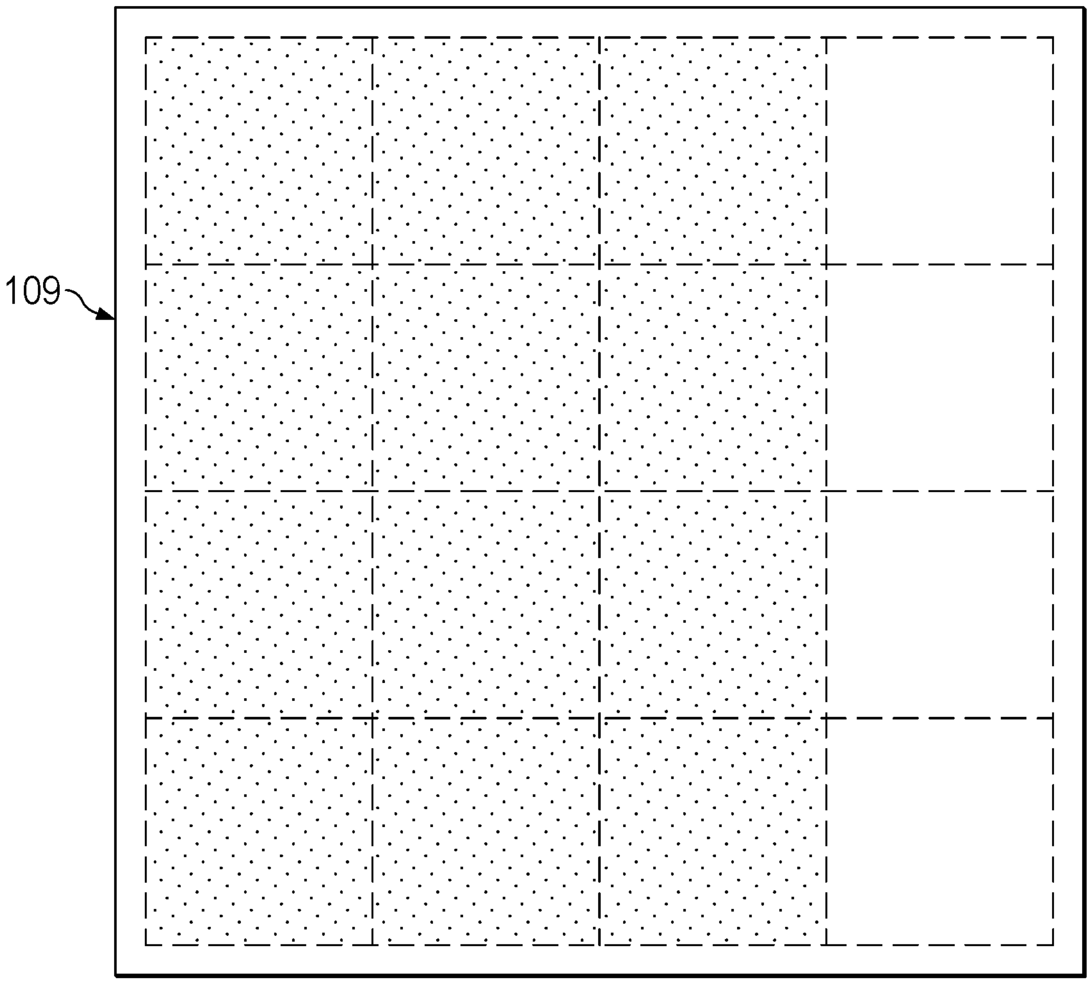

Referring also to FIGS. 13 and 14, the method 200 of FIG. 2 includes a test method or process for thermally testing a circuit or system under development using the thermal test chip electronic device 100. As previously mentioned, moreover, the QFN electronic device 100 in this example includes the shape and lead configuration corresponding to an electronic device design under development, and the thermal test chip electronic device 100 can be installed (e.g., solder) in or on a structure of a system under development, such as a printed circuit board. At 220 in FIG. 2, the method 200 includes attaching the test chip electronic device 100 to a printed circuit board. FIG. 13 shows one example, in which a device or component placement and soldering process 1300 is performed that solders the test chip electronic device 100 to corresponding conductive pads on a top side of a multilayer printed circuit board 1302. As shown in FIG. 13, moreover, the circuit board system being evaluated can include one or more further components or electronic devices also soldered to the circuit board 1302.

At 222 in FIG. 2, a test system is operatively connected to the circuit board. FIG. 14 shows an example test system 1400, in which the example thermal test chip electronic device 100 is electrically connected to the circuit board 1302 (e.g., labeled PCB) with the conductive features (e.g., bond pads) 120 of the multilevel metallization structure and the bond wires 122 providing electrical connection of the metal-based heater and sense resistors to the leads 107 of the electronic device 100, and the circuit board 132 providing associated electrical connections (e.g., through conductive solder pads and associated conductive traces and/or vias, not shown) to a switch circuit and test control logic circuit 1402 of the test system that is operatively connected to the circuit board (e.g., by suitable electrical connectors, not shown). The test system 1400 also includes a power circuit 1404 that is configured to provide current to activate selected ones of the heater resistors, and a sensing circuit 1406 configured to sense a signal of selected ones of the sense resistors.

As shown in FIG. 14, the switching circuit 1402 is coupled between the circuit board 1302, the power circuit 1404, and the sensing circuit 1406. The switching circuit 1402 in one example is or includes programmed or programmable logic circuitry including transistors or other types of switch circuits in order to provide selective electrical connection or other operative coupling of outputs of the power circuit 1404 to specific ones of the heater resistors RH1, RH2, RH3 of the semiconductor die 109, as well as to provide selective electrical connection of inputs of the sensing circuit 1406 to specific ones of the sense resistors RS1, RS2 during powered operation of the circuit board 1302 and the other electronic components thereof in order to perform a thermal test of the circuit board 1302 and the system under development. The system 1400 in one example also includes a processor 1408 configured with processor-executable programming instructions to implement automated thermal testing of the system under development, including programmed or programmable operation of the switching circuit 1402, the power circuit 1404 and/or the sensing circuit 1406 during thermal testing.

In operation in one example, the switching circuit 1402 selectively couples the power circuit 1404 to the selected ones of the heater resistors RH1, RH2 and selectively couples the sensing circuit 1406 to the selected ones of the sense resistors RS1 to test a thermal performance of the circuit board 1302. The switching circuit 1402 in one example includes internal test control logic circuits (not shown) configured to perform a thermal test, or controlled switching operations thereof. In this or another example, the switching circuit 1402 provide switching control operations that are controlled by execution of program instructions by the processor 1408. In this or another implementation, for example, where the multilevel metallization structure 111, 112, 113 includes a set of series circuits including the instances of the first and/or third heater resistors RH1, RH3 in respective unit regions 131, 132, 133 along columns or rows of the array, the switching circuit 1402 is configured to selectively couple the power circuit 1404 to one or more selected series circuits to provide the current to the instances of the first heater resistor RH1 in one or more corresponding selected columns or rows of the array. In this or another implementation, for example, where the multilevel metallization structure 111, 112, 113 includes a set of second series circuits including at least one of the instances of the second heater resistor RH2 in respective unit regions 131, 132, 133 along diagonal directions of the array, the switching circuit 1402 is configured to selectively couple the power circuit 1404 to one or more selected second series circuits to provide the current to the instances of the second heater resistor RH2 in one or more corresponding selected diagonal directions of the array during thermal testing operation.

Figure 18:
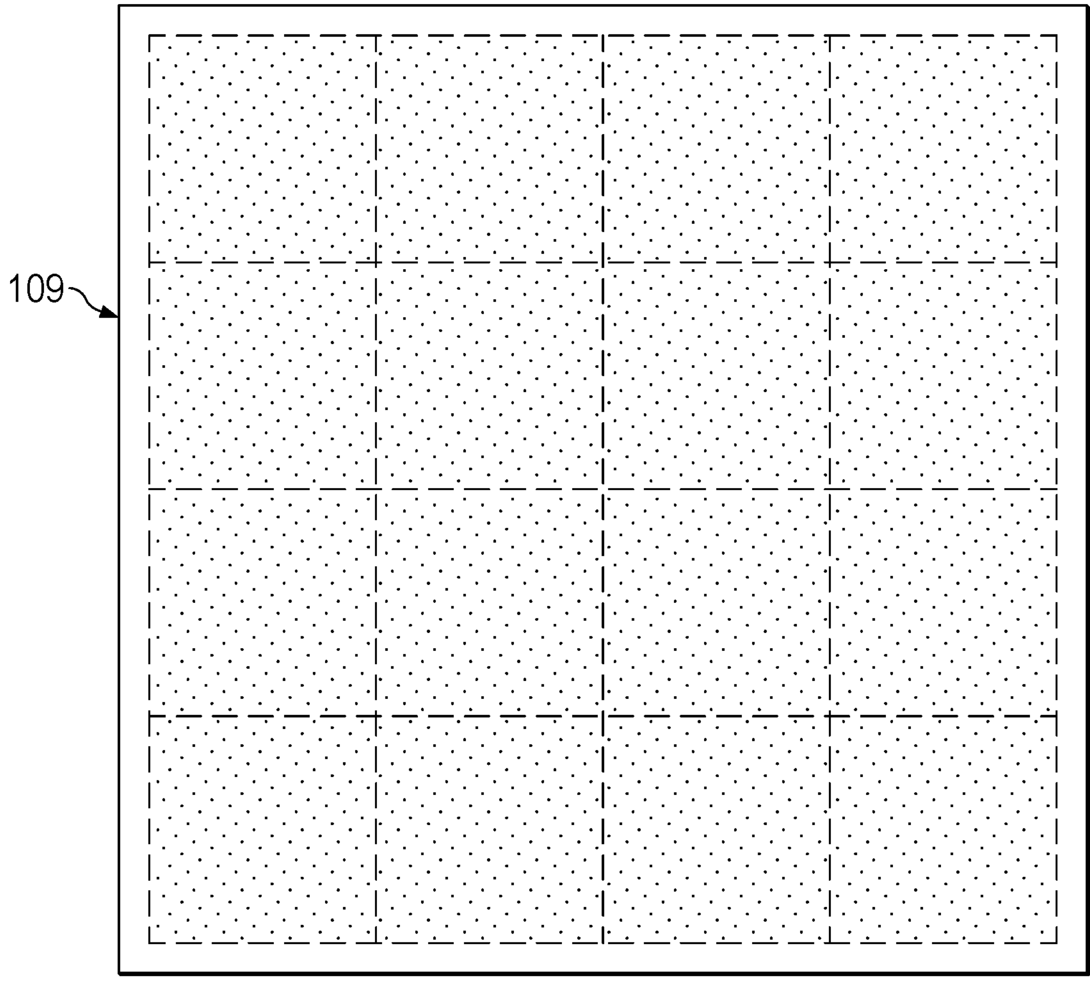
Figure 19:
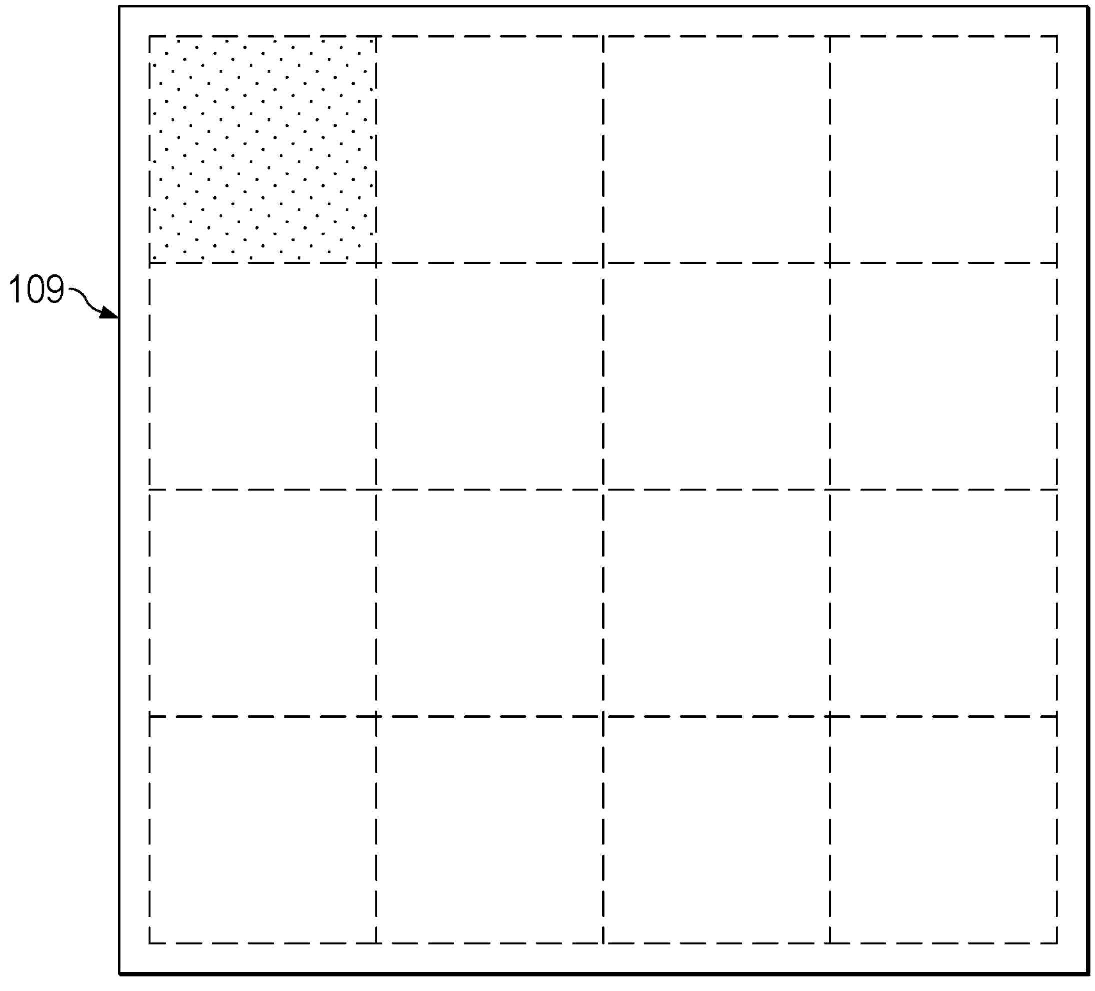
Figure 20:
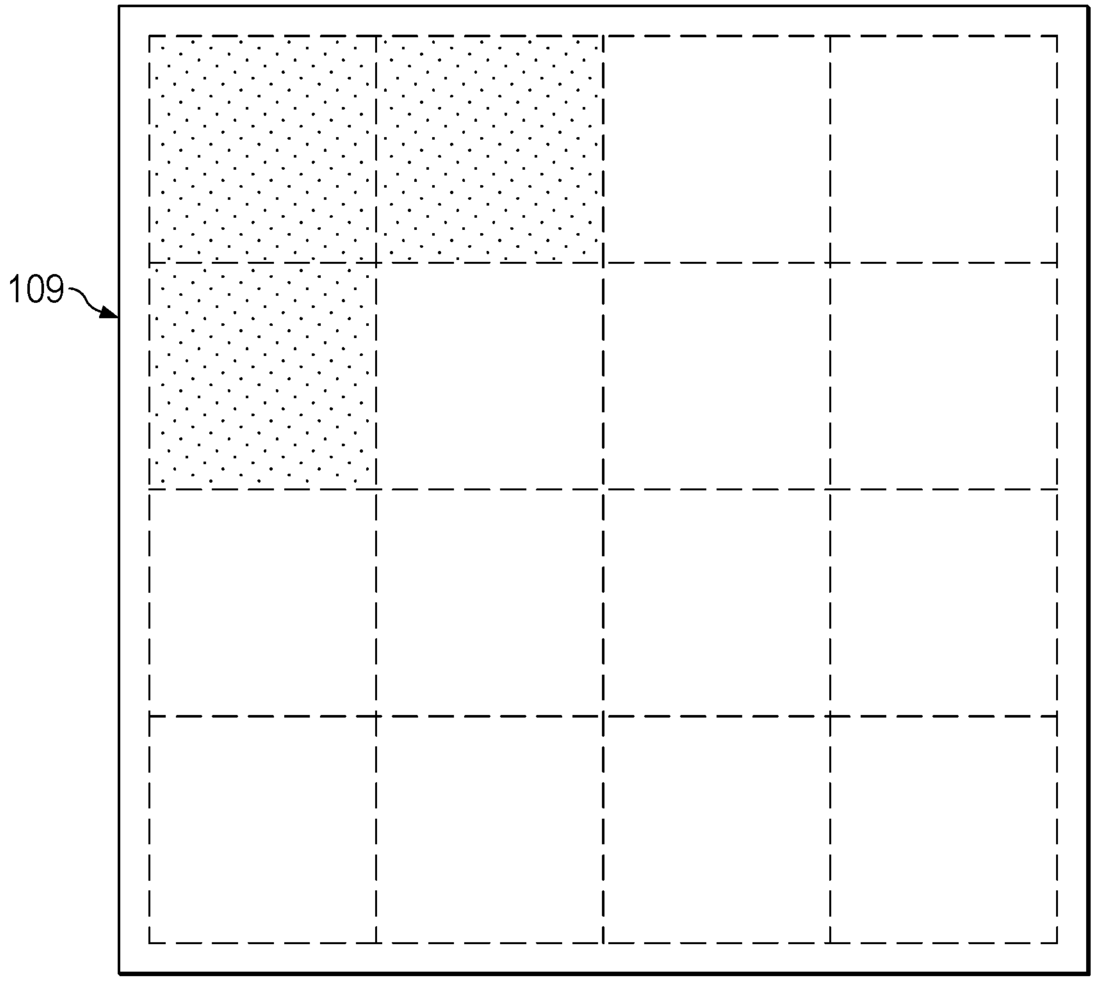
Figure 21:
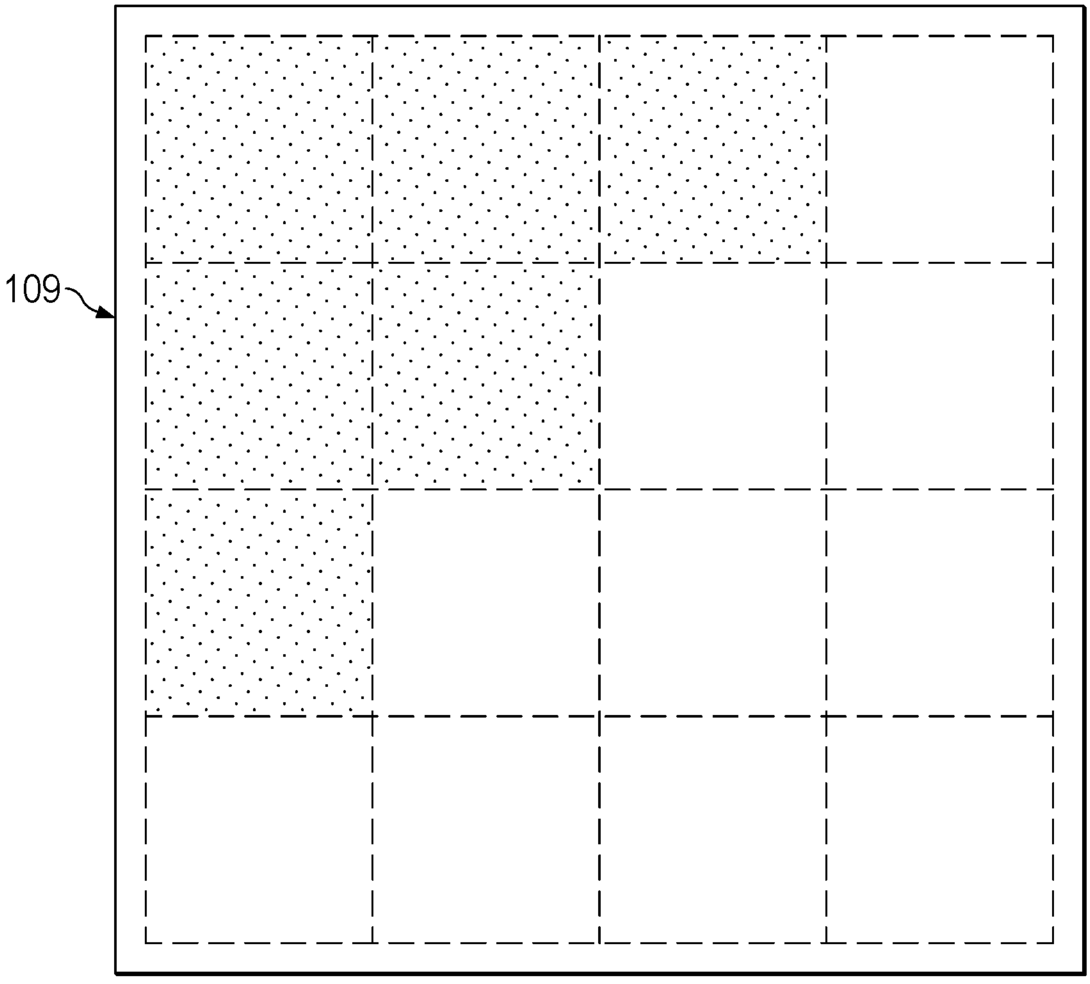
Figure 22:
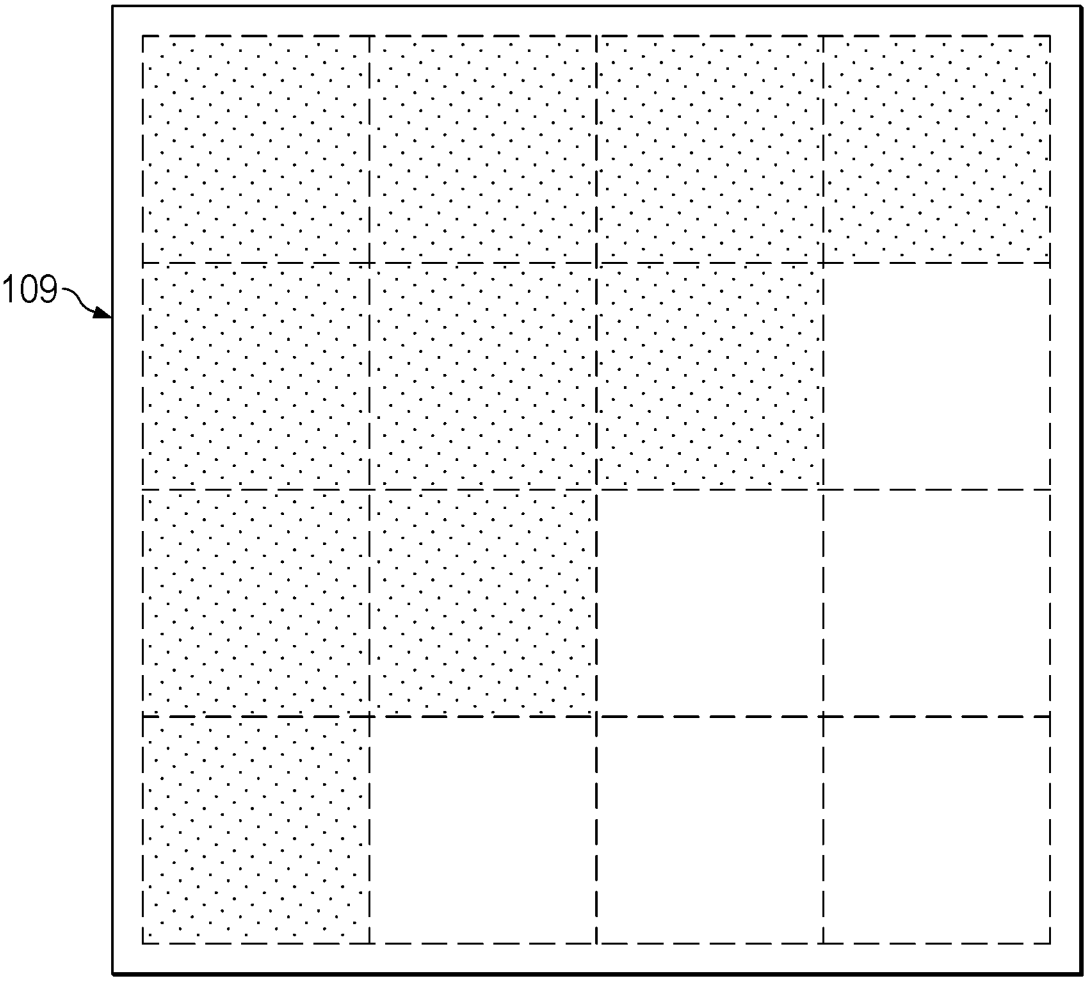
Figure 22A:
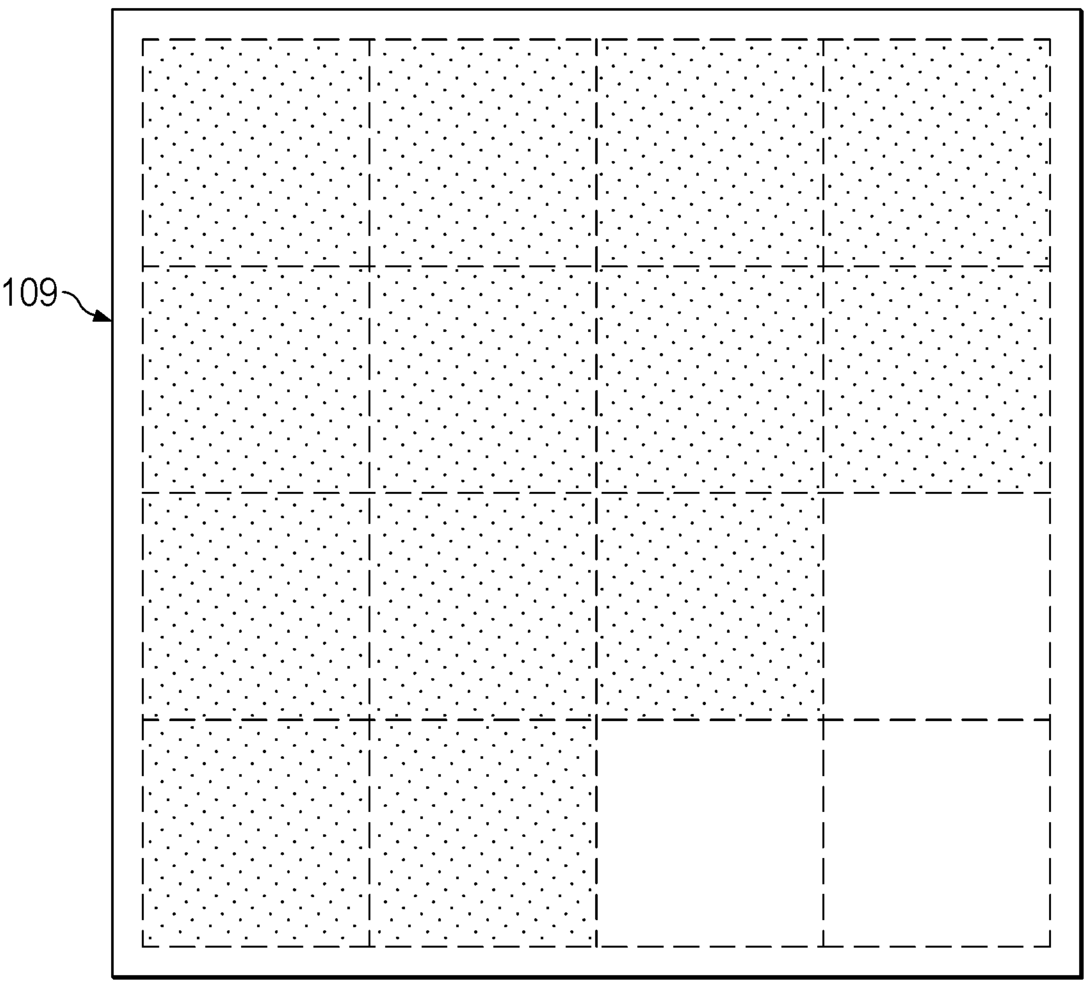
Figure 23:
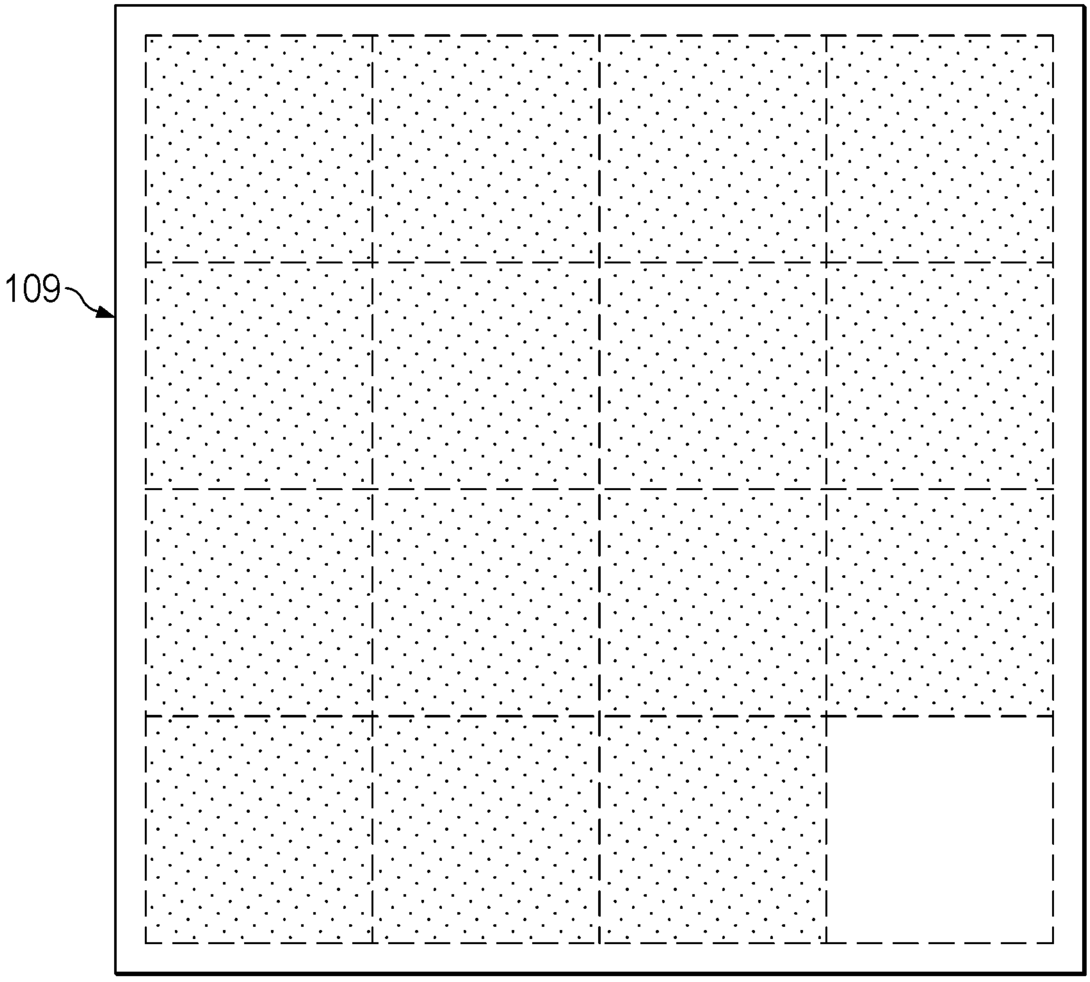

FIGS. 15-32 show non-limiting example heater resistor activation states for the example 4×4 array of unit regions 131, 132, 133 in the multilevel metallization structure of the electronic device 100 during thermal testing. The non-limiting examples illustrate the adaptability of the described examples and other implementations to provide localized heating, for example, to simulate or mimic an actual or anticipated product implementation. FIGS. 15-18 show a progressive sequence in one example thermal test using the metal-based resistors of the semiconductor die 109 as part of the thermal test chip electronic device 100. In this example, the first heater resistors RH1 in a first series circuit are activated in FIG. 15 (e.g., by selective provision of heating current from the power circuit 1404 of FIG. 4), while the second, third, and fourth columns have no heating resistors activated. In this or another example, the sensing circuit 1406 senses the temperature of the unit areas of the array continuously or at predetermined times during a test sequence, for example, under control of the processor 1408. The sequence in this example continues in FIG. 16, where the first and second columns of the array include activated instances of the first heater resistor RH1. The sequence continues in FIG. 17 where the instances of the first heater resistor RH1 in the third column of the array are activated, and then all the columns are activated as shown in FIG. 18.

Figure 24:
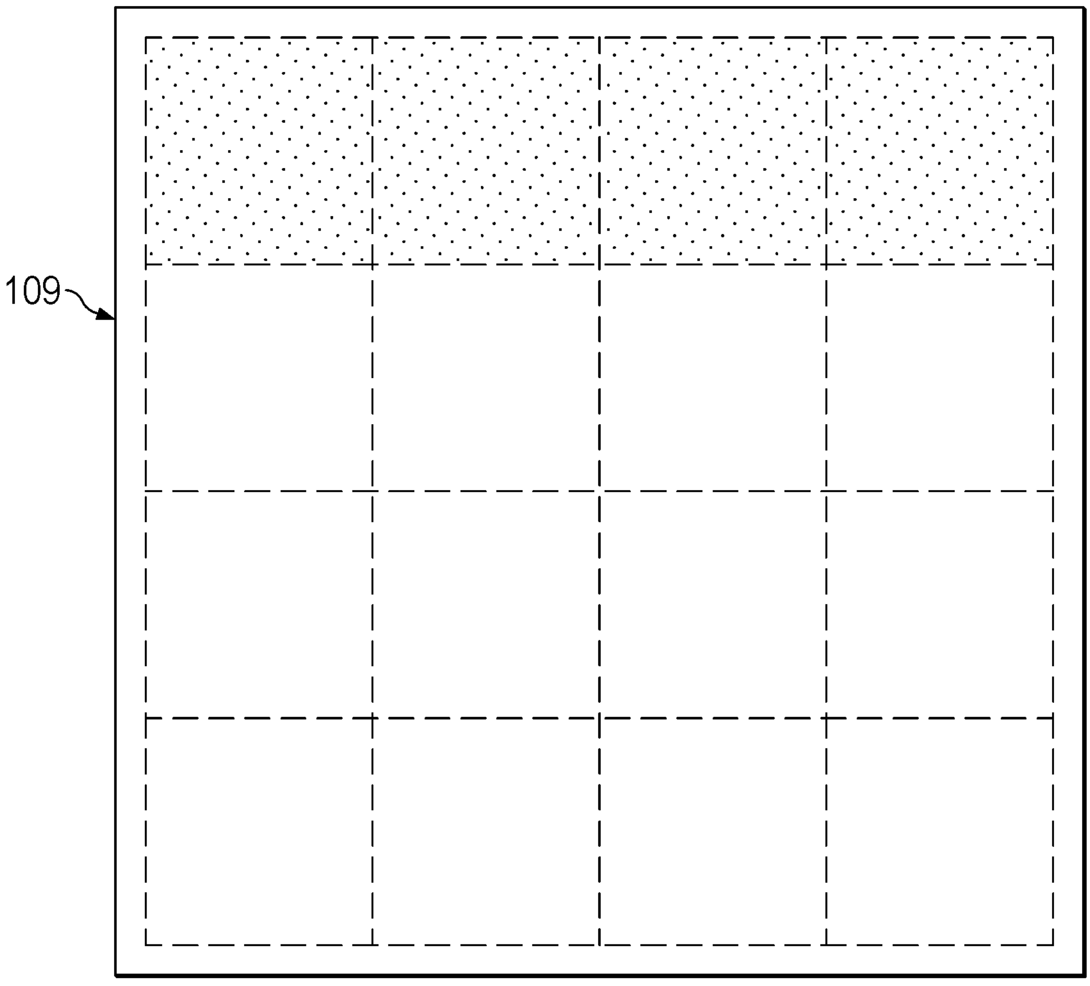
Figure 25:
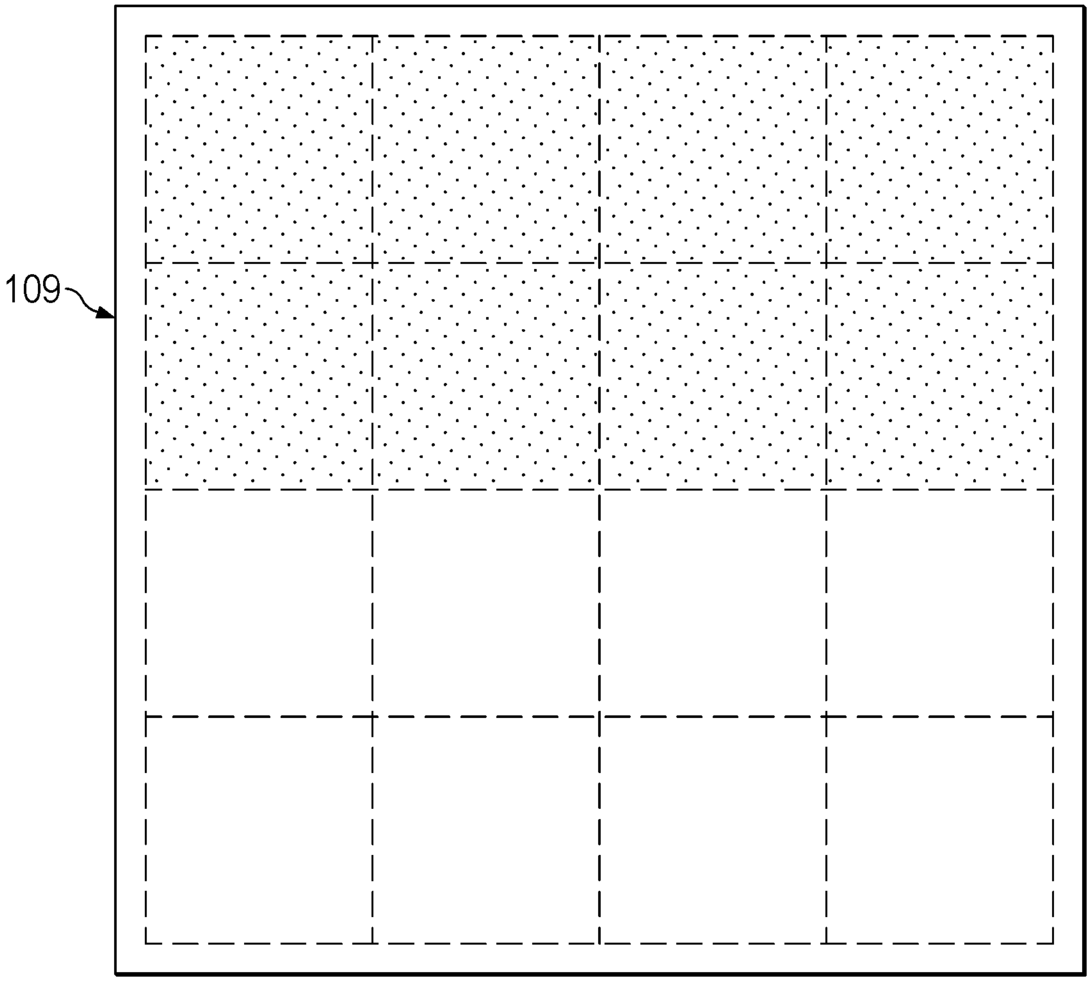
Figure 26:
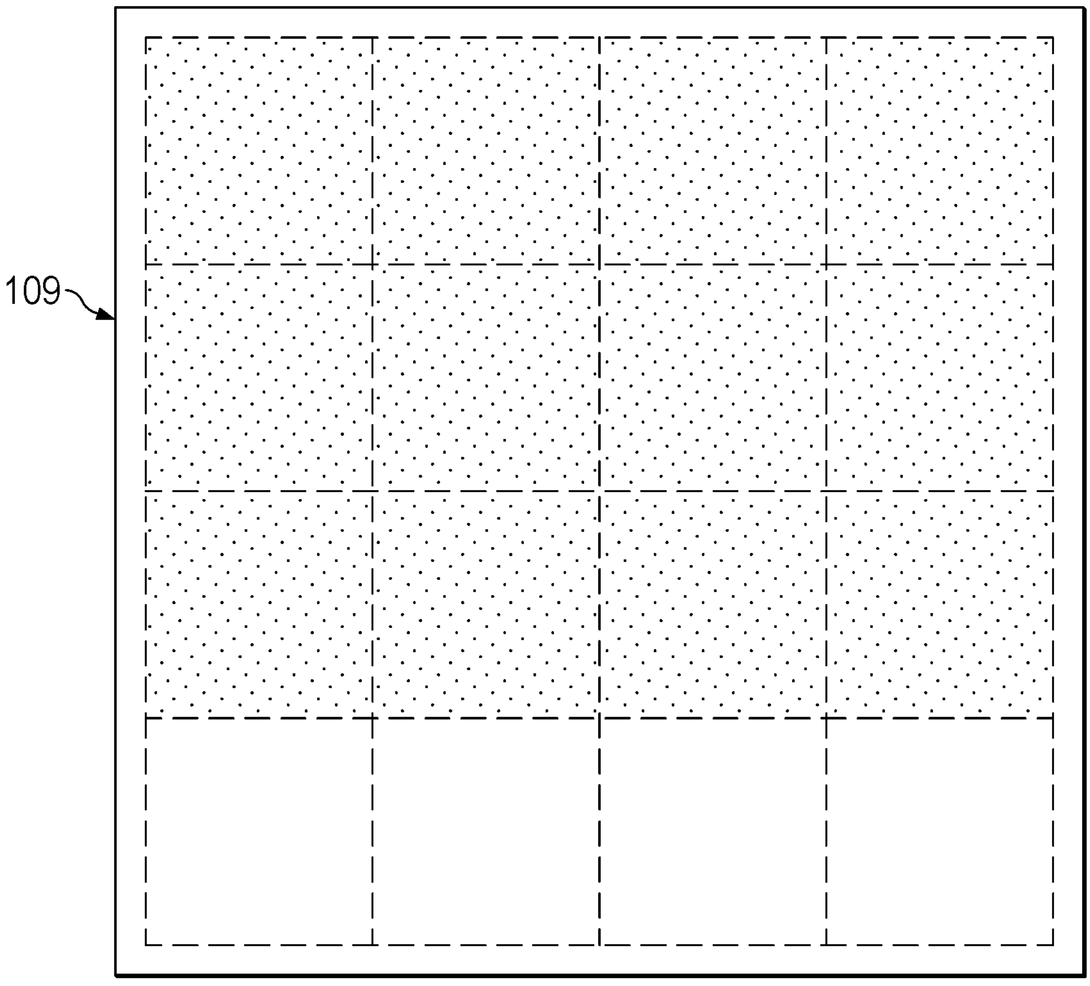

FIGS. 19-23 illustrate a diagonal heater resistor activation sequence example, which can be a single thermal test or part of a test that includes other sequences (e.g., a continuation after the sequence of FIGS. 15-18 described above). A first diagonal series circuit is activated in FIG. 19 (e.g., including a set of one instance of the first heater resistor RH1) in the unit region in the upper left corner of the 4×4 array. A second diagonal series circuit is activated as shown in FIG. 20, and FIGS. 21, 22, 22A, and 23 show further steps in the sequence in which further diagonal series circuits are activated with respective instances of the first heater resistor RH1, including one example of activation of the top left of the array shown in FIG. 22. FIGS. 24, 25, and 26 illustrate further non-limiting examples, including a row-based selective activation of instances of the first heater resistor RH1 in the first row in FIG. 24, the first two rows in FIG. 25, and the first three rows in FIG. 26.

Figure 27:
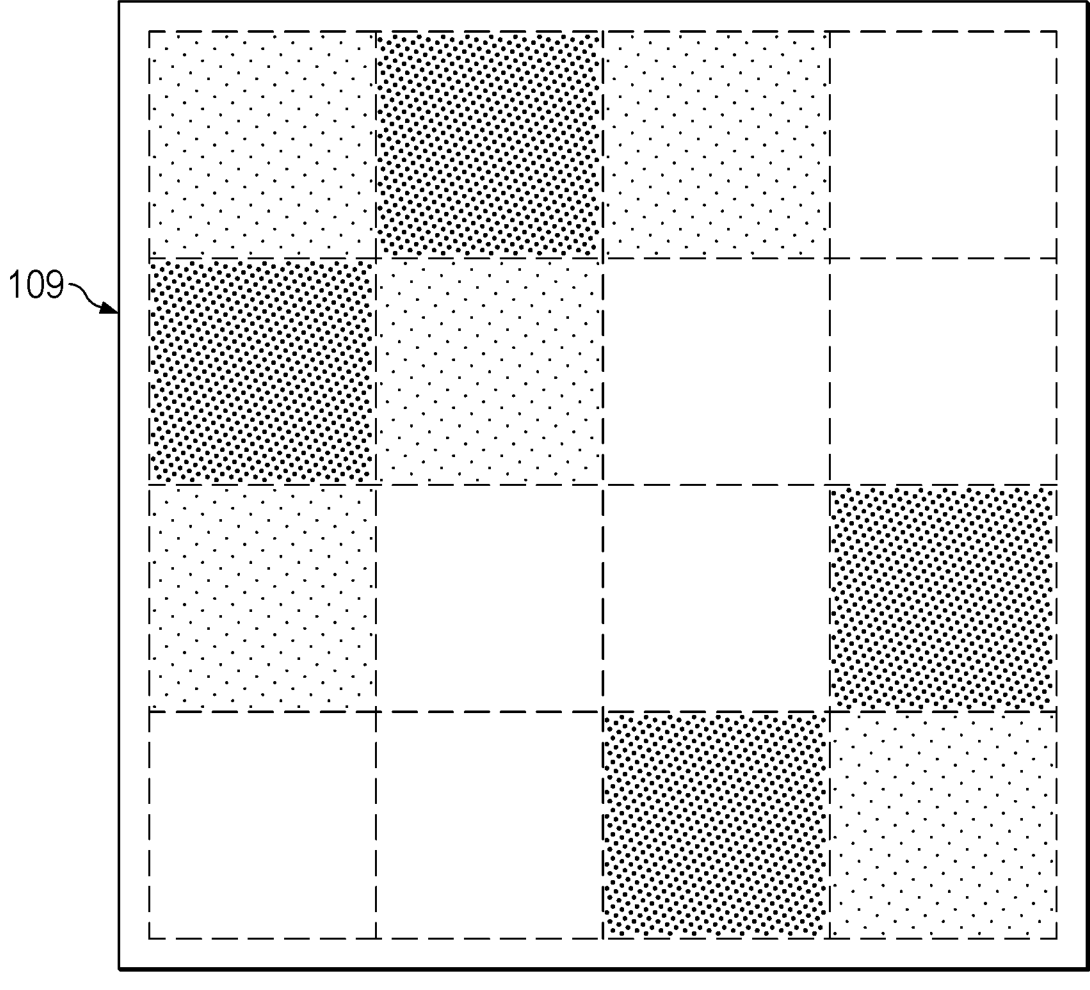
Figure 28:
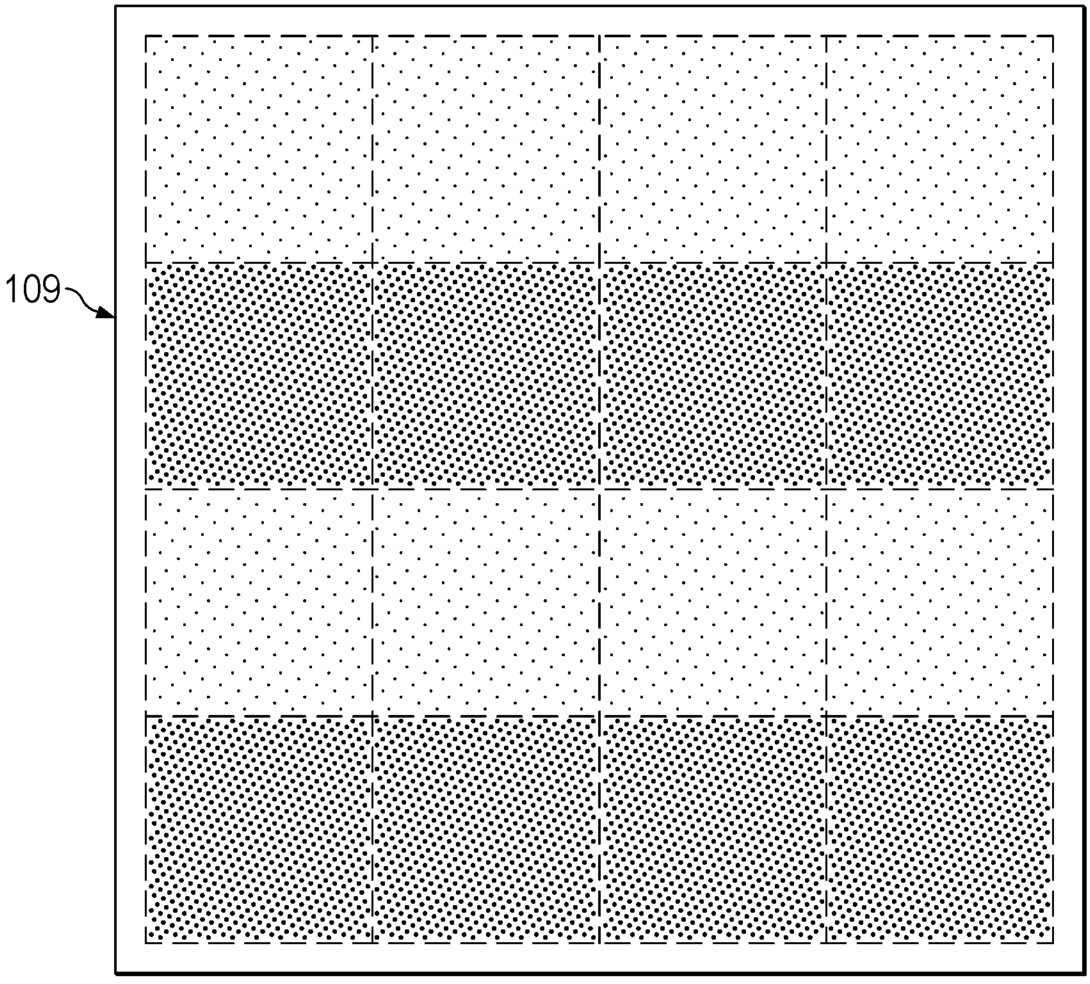
Figure 29:
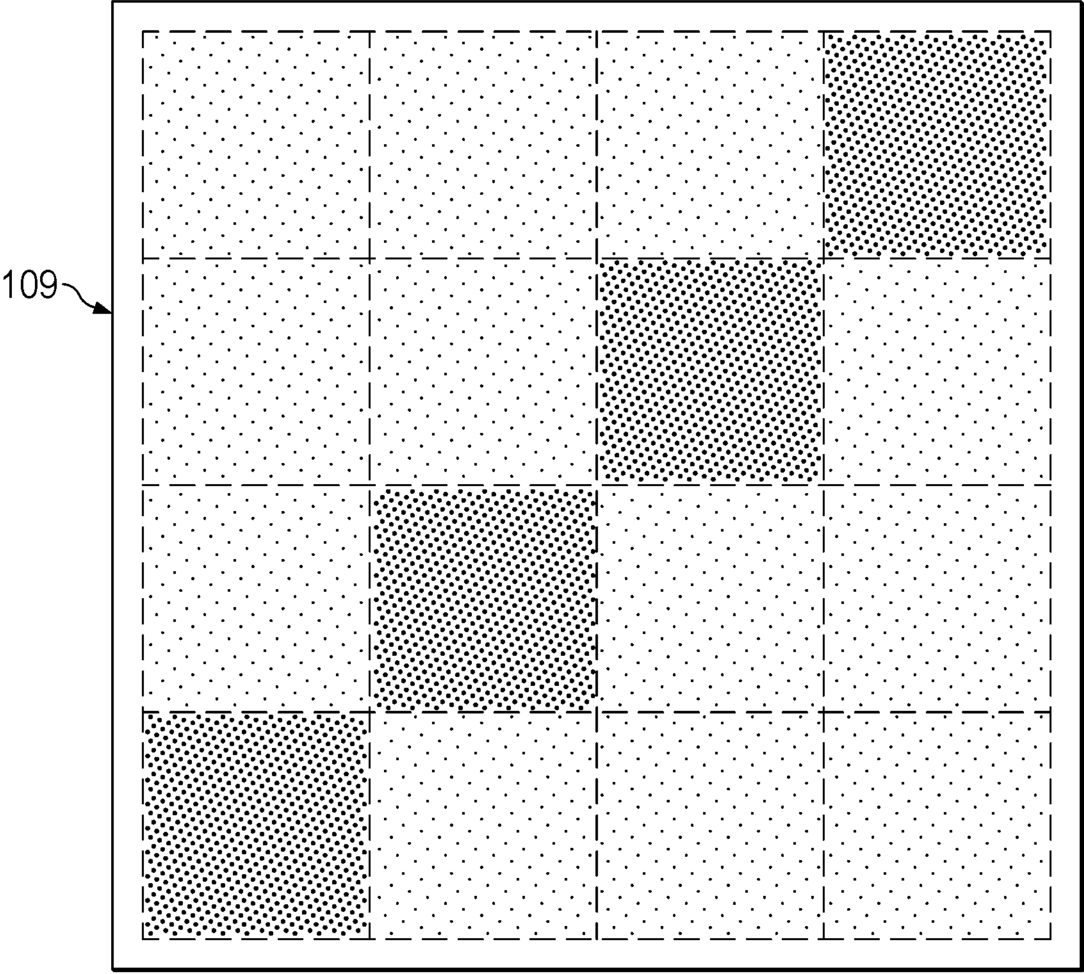
Figure 30:
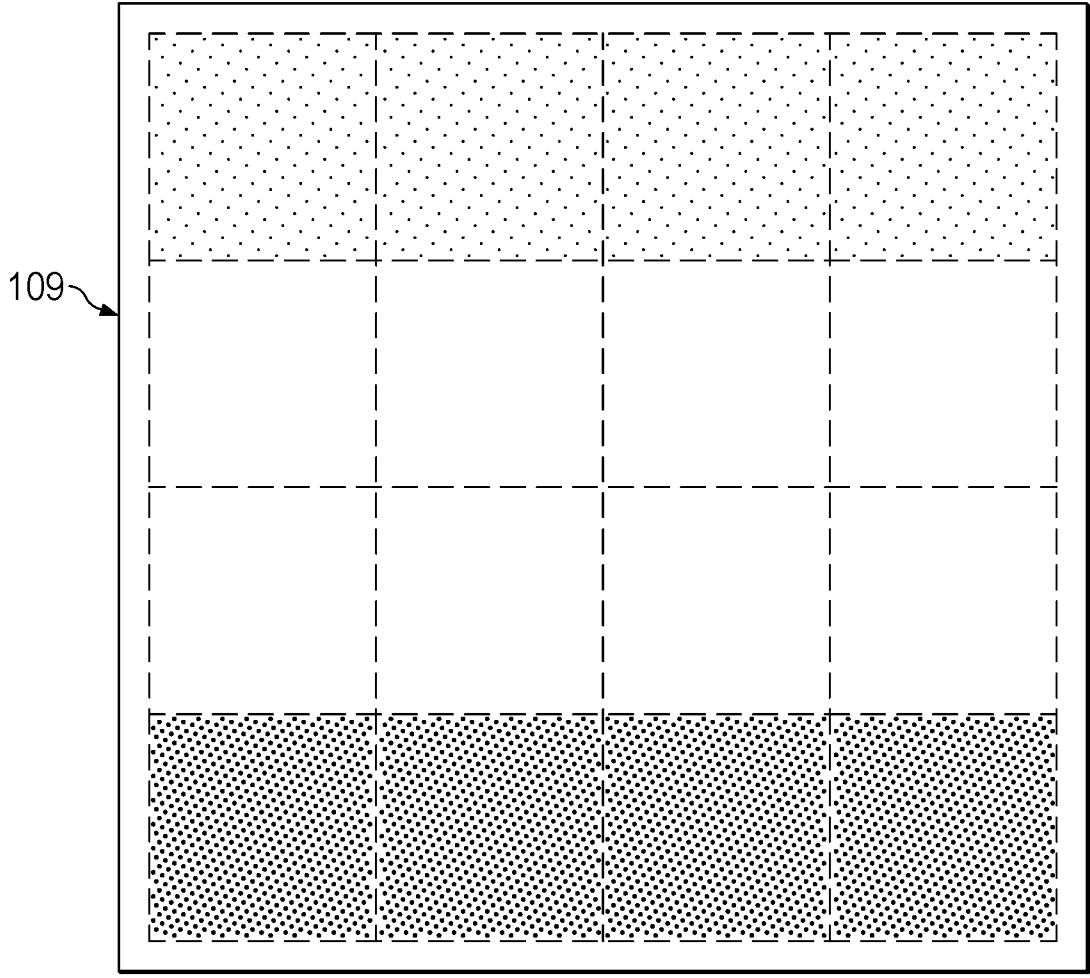
Figure 31:
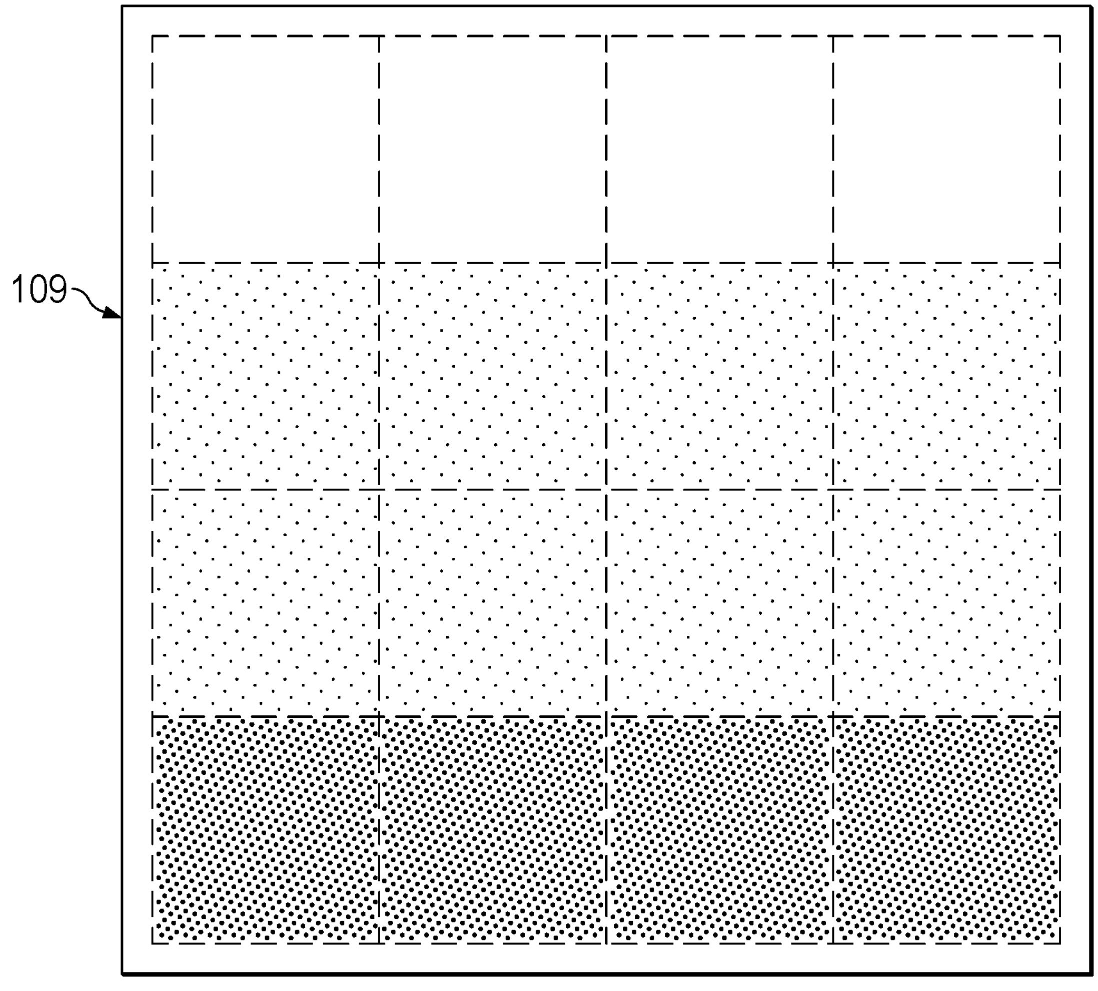
Figure 32:
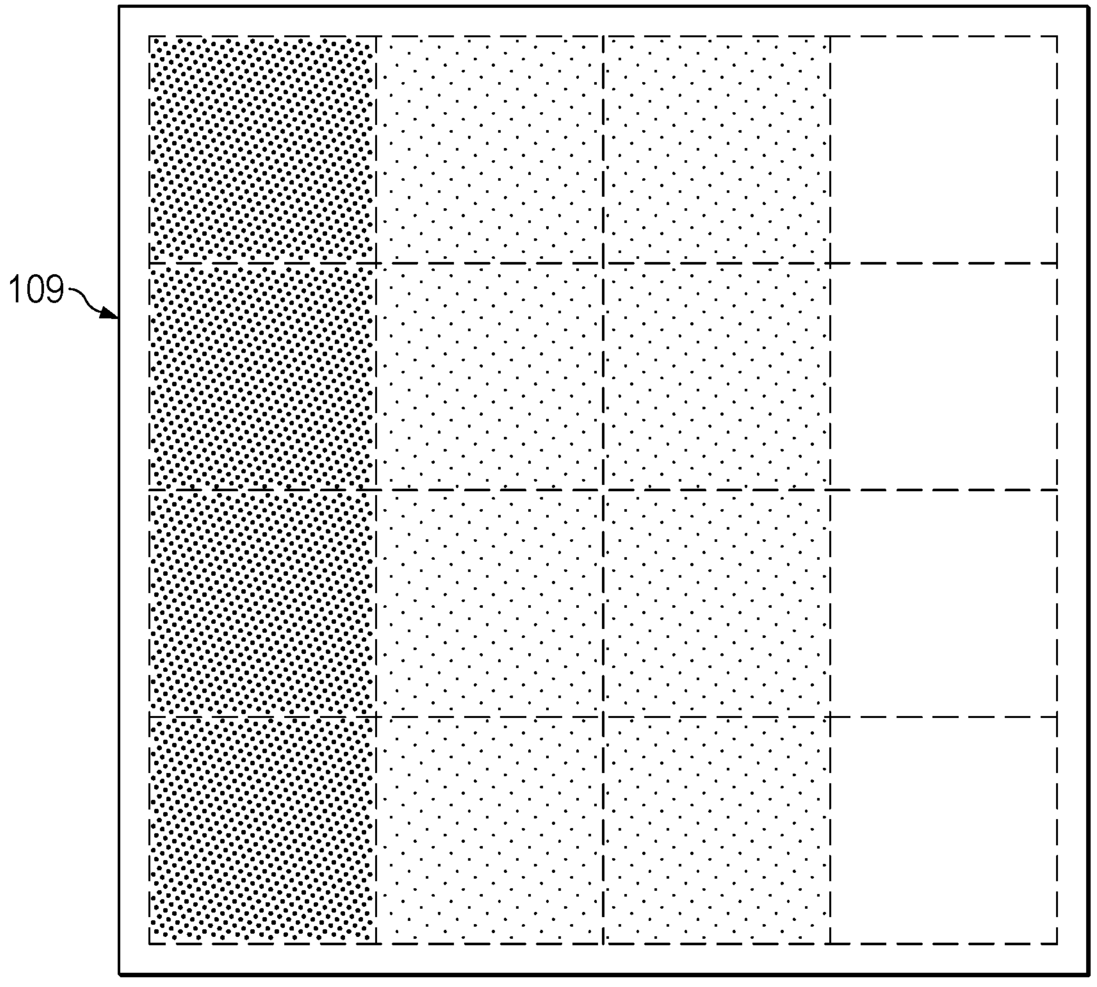

FIGS. 27-32 show further examples of thermal testing at a different (e.g., higher) temperature level at specific locations in corresponding unit regions of the array in certain implementations by concurrent activation of two or more instances of heater resistors in a single or selected set of unit regions. In the example of FIG. 27, instances of one heater resistor are activated (e.g., provided with current from the power circuit 1404 of FIG. 14 above) in the first, third, and final diagonal direction sets of the 4×4 array, and higher temperature heating is provided by concurrent activation of two or more of the associated heater resistor instances of the second and sixth diagonal direction sets of the array, while the fourth and fifth diagonal sets are not activated. FIG. 28 shows another example, in which odd-numbered rows of the array are heated by activation of a single instance of one of the heater resistors in the unit regions of the first and third rows, while the even-numbered (e.g., second and fourth) rows are heated to a higher temperature by concurrent activation of two or more instances of the heater resistors and the second and fourth rows of the array. FIG. 29 shows another example, in which the fourth diagonal set of unit regions have two or more heater resistor instances activated concurrently, while the remainder of the unit regions of the array have a single heater resistor instance activated. Another variant is shown in FIG. 30, in which a single heater resistor instance is activated in the unit regions of the first row of the array, the second and third rows are not activated, and the final (e.g., fourth) role of the array has two or more heater resistor instances activated. FIG. 31 shows yet another example activation pattern, in which the first row of the array is not activated, the second and third rows have a single heater resistor instance activated in each of the associated unit areas, and two or more heater resistor instances are activated in the unit regions of the fourth row. FIG. 32 illustrates a column-based similar implementation of a similar pattern, in which the first column of the array is not activated, the second and third rows have a single heater resistor instance activated in each of the associated unit areas, and two or more heater resistor instances are activated in the unit regions of the fourth column.

Figure 33A:
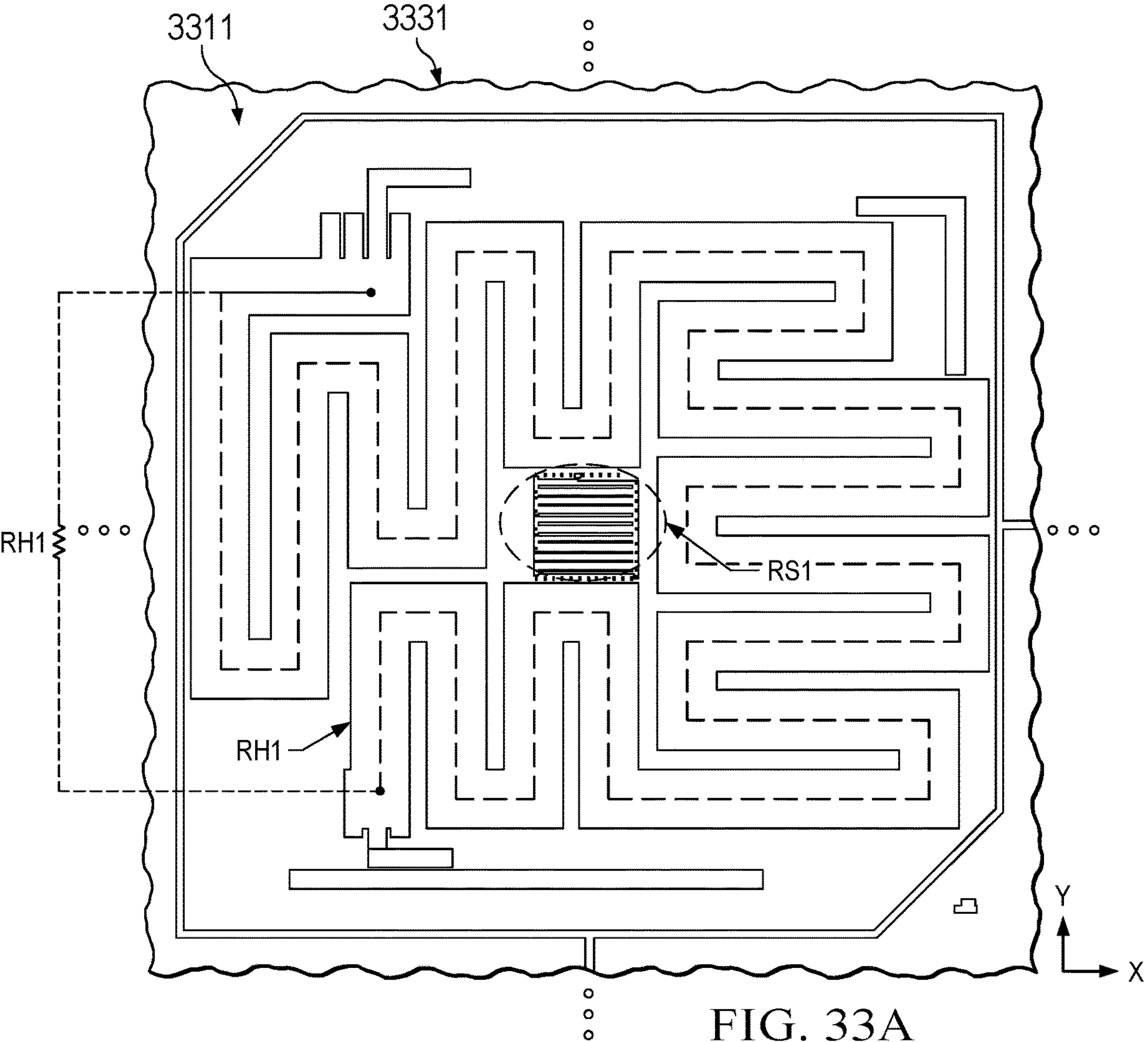
FIGS. 33A-33C show respective first, second, and third metallization levels of another example thermal test chip electronic device.
Figure 33B:
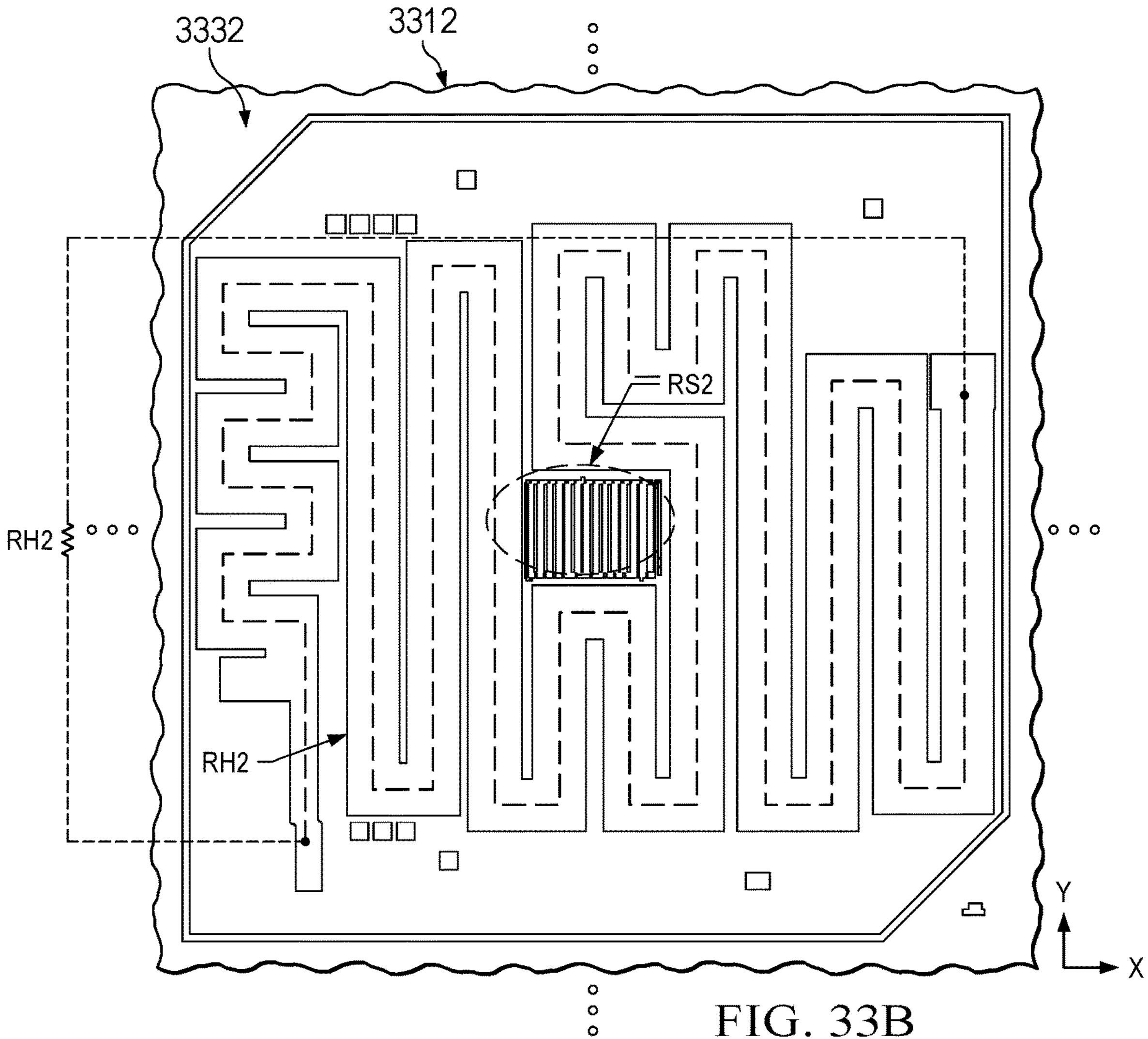
Figure 33C:
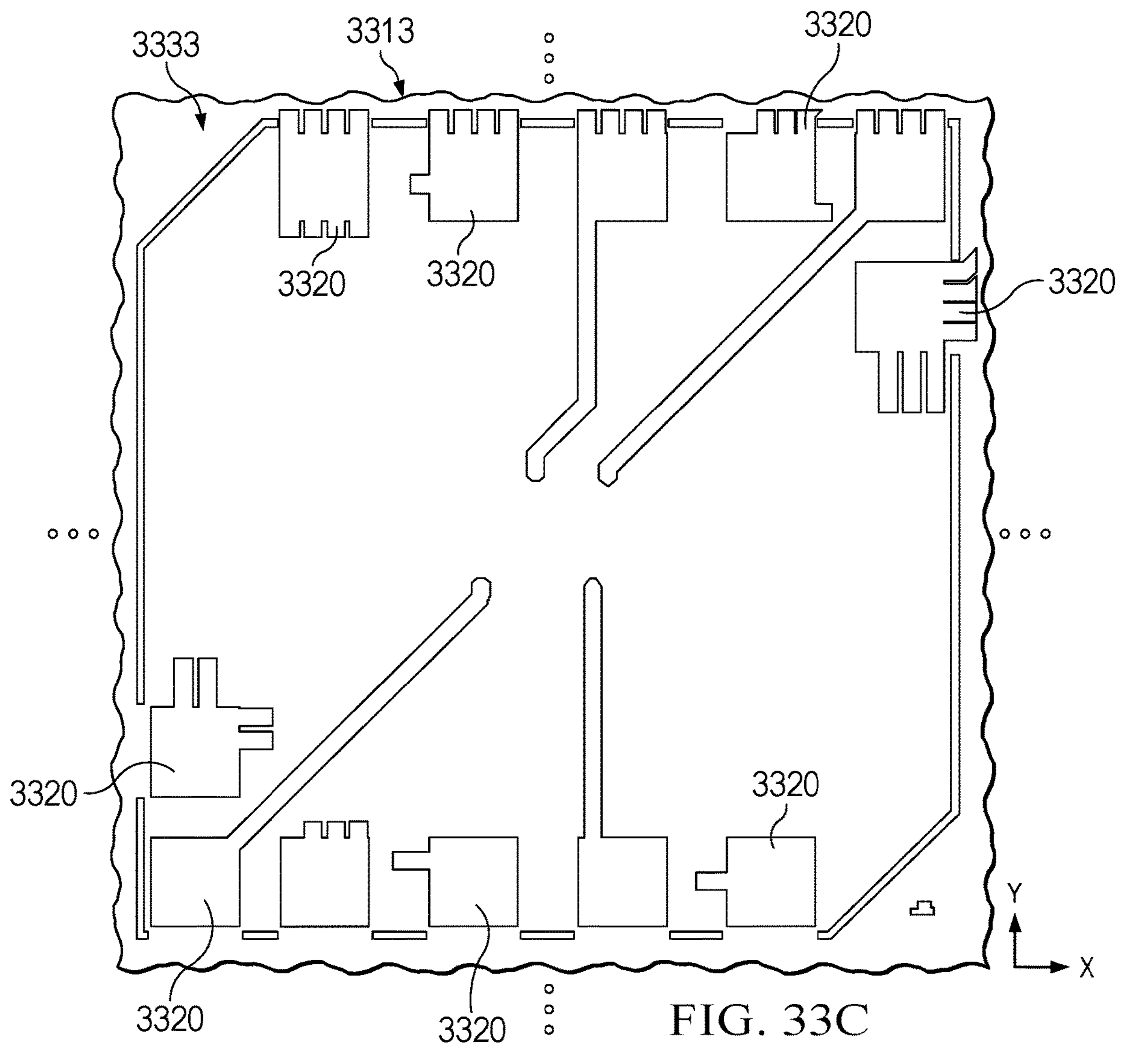

FIGS. 33A-37C show further non-limiting examples of wire bonded electronic device of limitations with semiconductor layers having no electronic circuits or components and multilevel metallization structure is having metal-based heater and sensor resistor unit areas, which may include a single unit area or multiple unit areas arranged in an array of any desired dimension. The example of FIGS. 33A-33C provides top views that show portions of respective first, second, and third metallization levels 3311, 3312 and 3313 with respective unit regions 3331, 3332, and 3333 of another example thermal test chip electronic device with a 1×1 array, in which the first metallization level 3311 includes a first heater resistor RH1 and a first sense resistor RS1 (FIG. 33A), the second metallization level 3312 includes a second heater resistor RH2 and a second sense resistor RS2, and the third metallization level 3313 includes conductive metal features (e.g., bond pads) 3320.

Figure 34A:
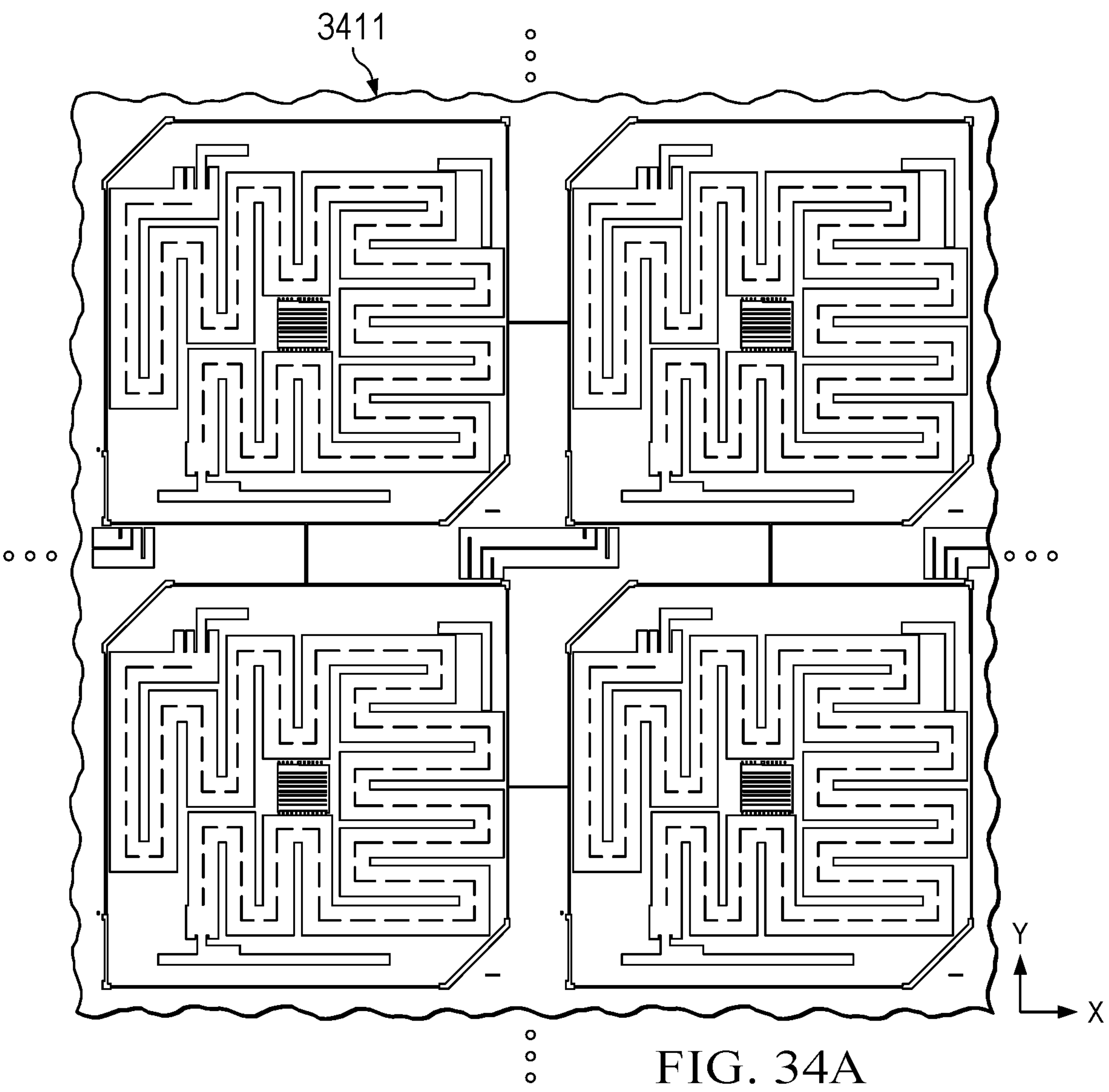
FIGS. 34A-34C show respective first, second, and third metallization levels of another example thermal test chip electronic device with a 2 by 2 array.
Figure 34B:
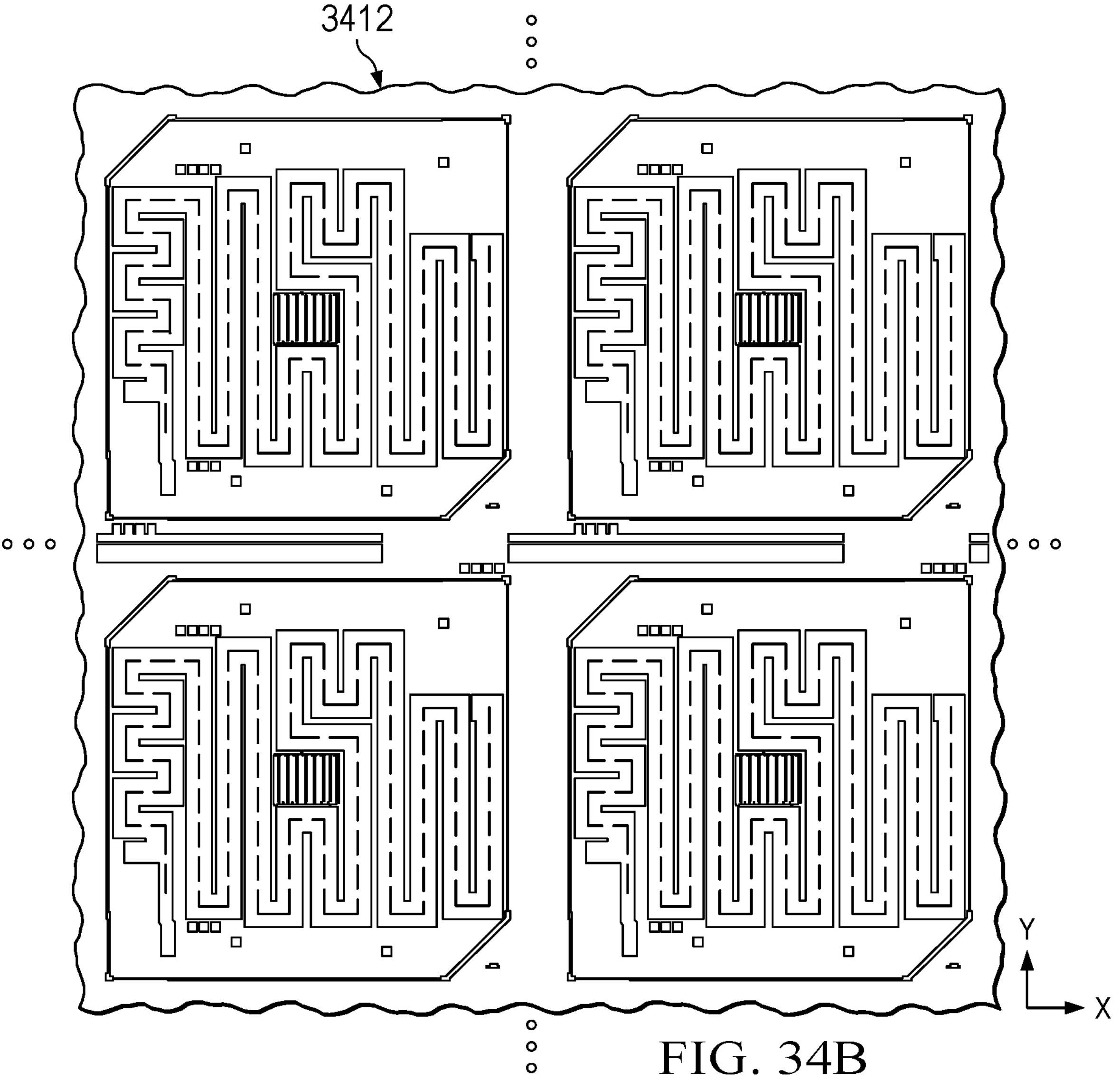
Figure 34C:
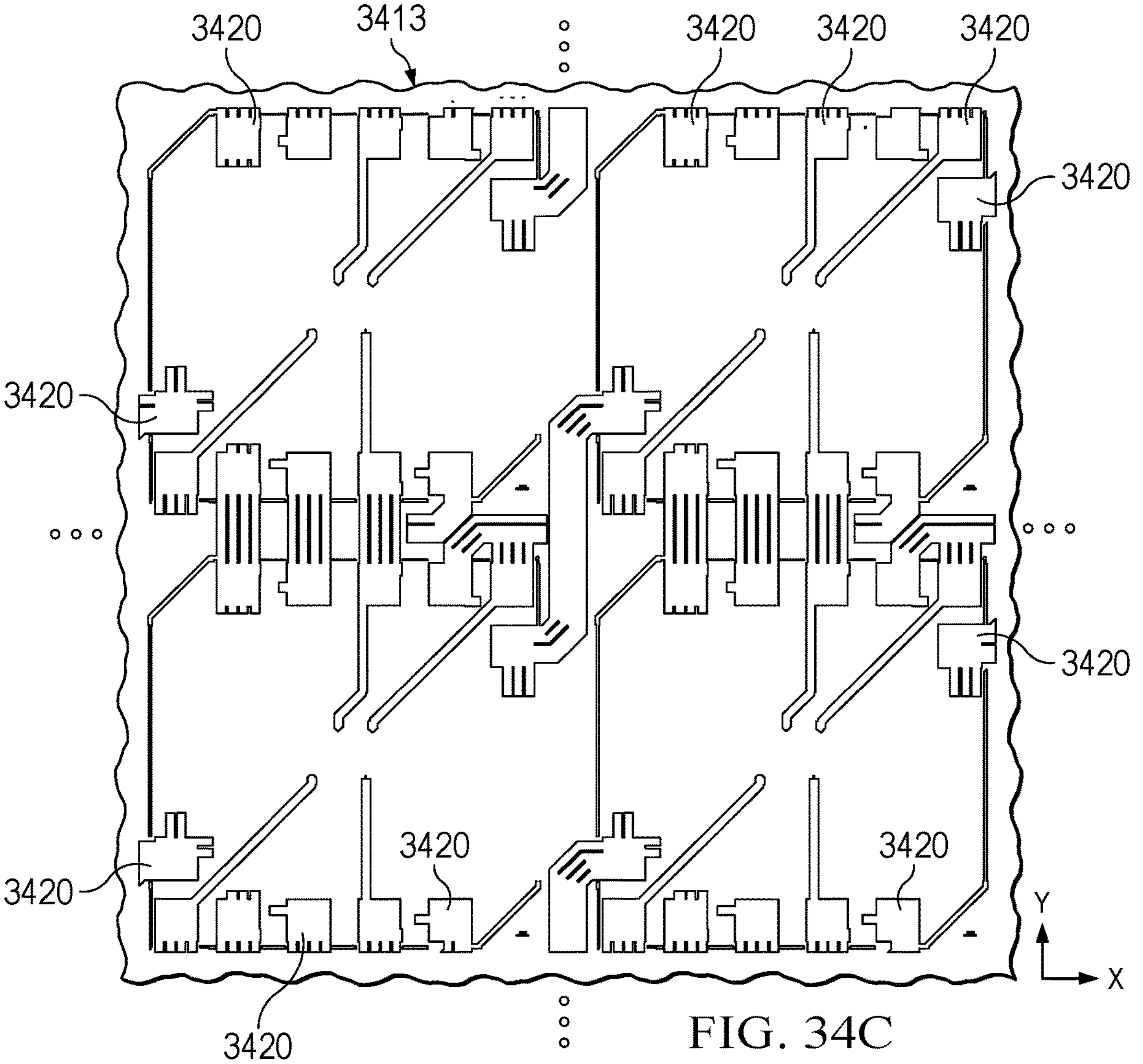

FIGS. 34A-34C show another example with heater resistors in first and second metallization levels and sense resistors in the first and second metallization levels in a 2×2 array. In this example, the electronic device includes respective first, second, and third metallization levels 3411, 3412, and 3413 of another example thermal test chip electronic device, where the first metallization level 3411 (FIG. 34A) has four unit regions with corresponding instances of a first heater resistor and a first sense resistor. In this example, the second metallization level 3412 (FIG. 34B) includes four unit regions with corresponding instances of a second heater resistor and a second sense resistor, and the third metallization level 3413 (FIG. 34C) includes signal routing features and exposed conductive metal features 3420 (e.g., bond pads for wire bond interconnections).

Figure 35A:
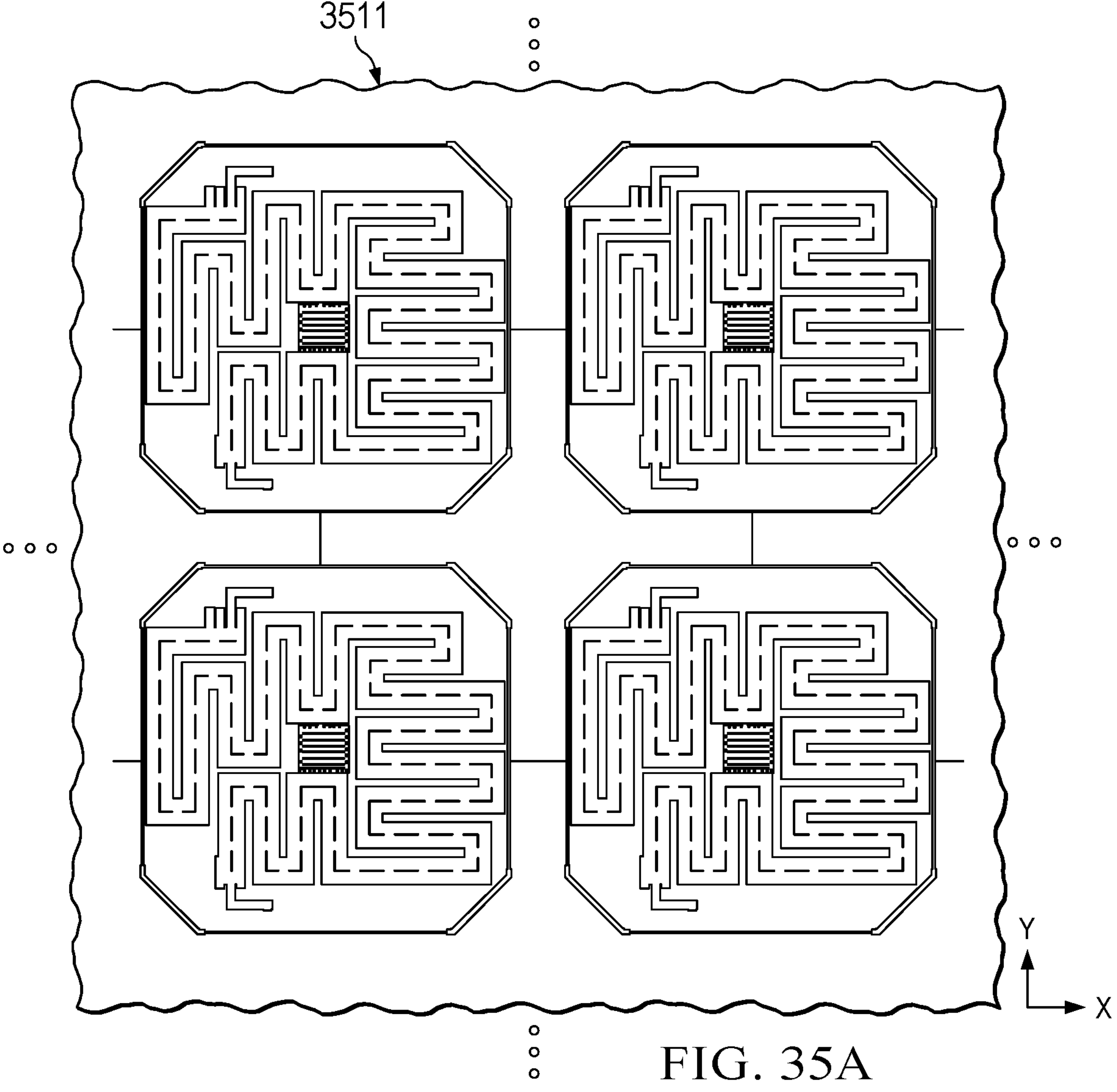
FIGS. 35A-35C show respective first, second, and third metallization levels of another example thermal test chip electronic device with a 2 by 2 array.
Figure 35B:
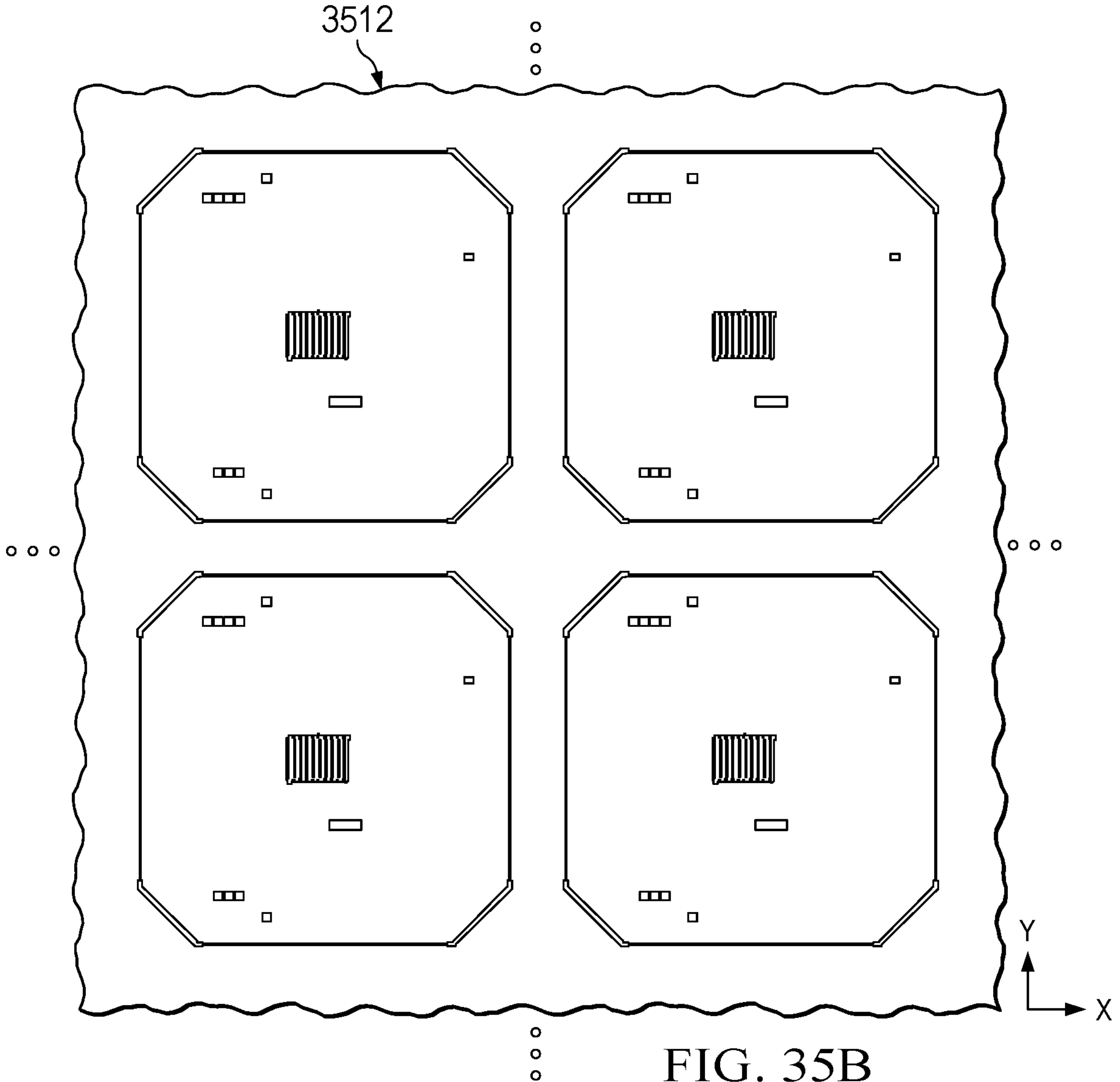
Figure 35C:
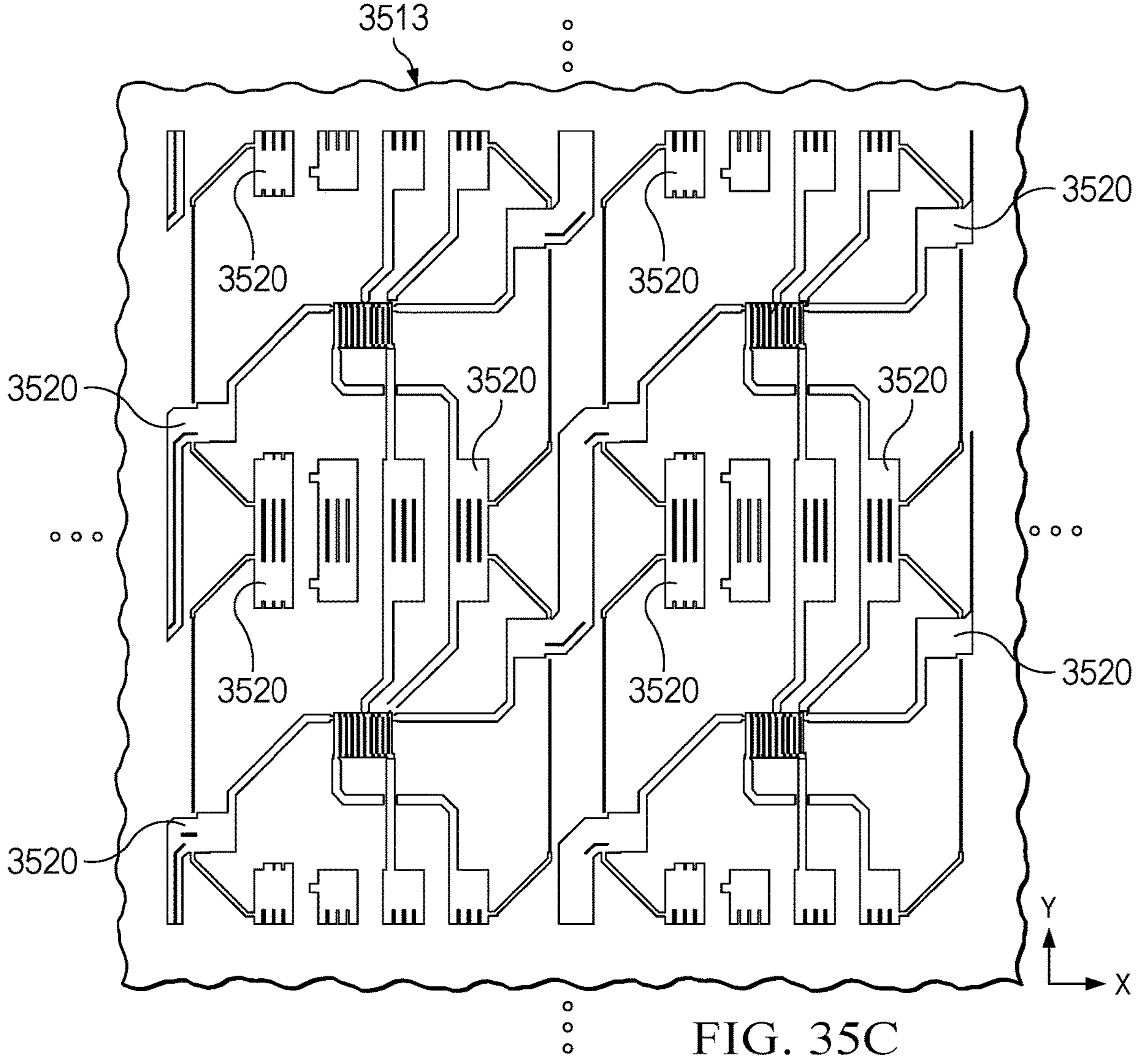

FIGS. 35A-35C show another example electronic device having a multilevel metallization structure with a 2×2 array. This example includes respective first, second, and third metallization levels 3511, 3512, and 3513, in which an instance of a heater resistor is provided in each unit region of the first metallization level 3511 (FIG. 35A), sense resistor instances are provided in each unit region of each of the metallization levels 3511-3513, and the third metallization level 3520 has exposed conductive metal features 3520 (e.g., bond pads for wire bond interconnections).

Figure 36A:
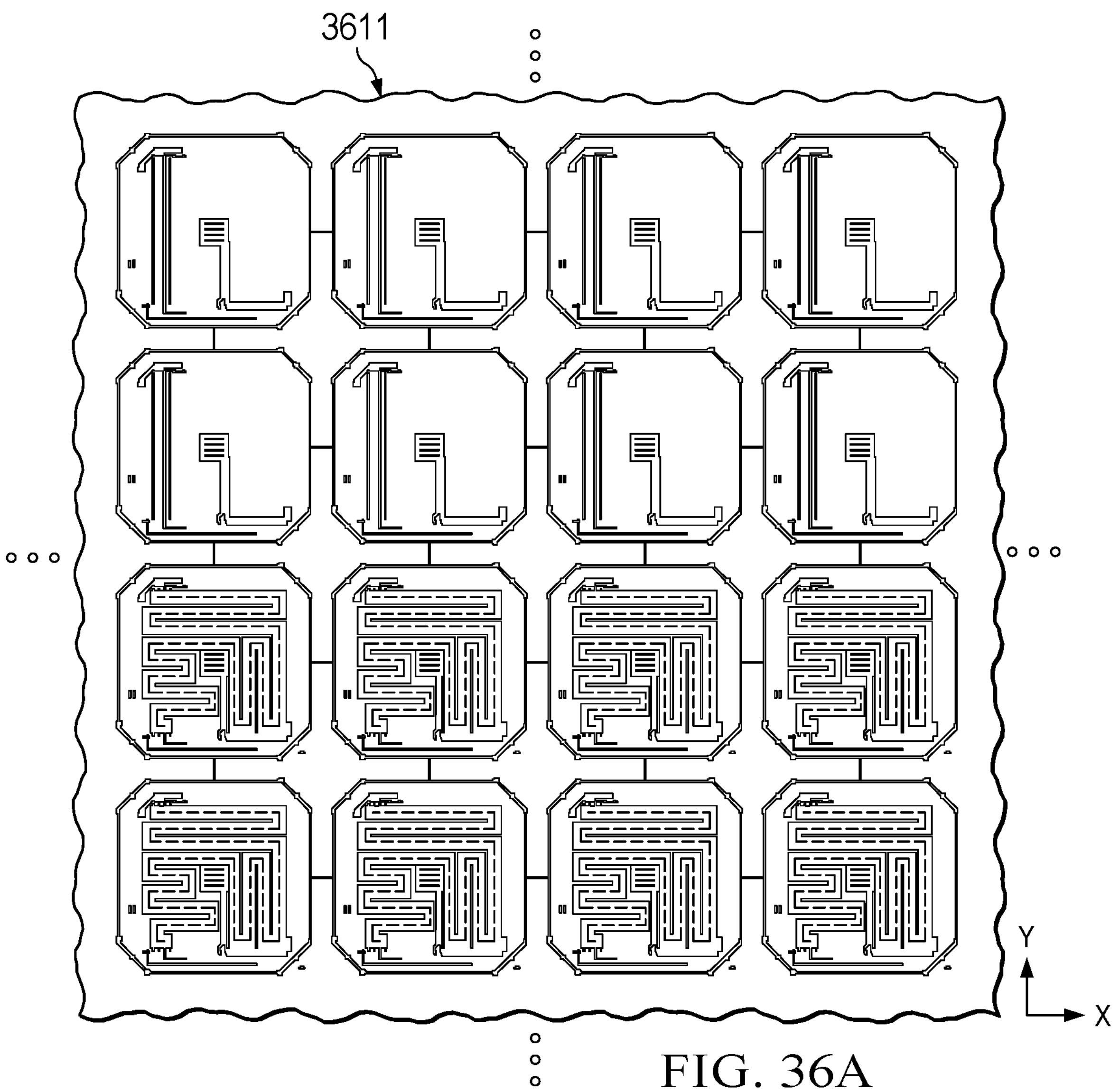
FIGS. 36A-36C show respective first, second, and third metallization levels of another example thermal test chip electronic device with a 4 by 4 array.
Figure 36B:
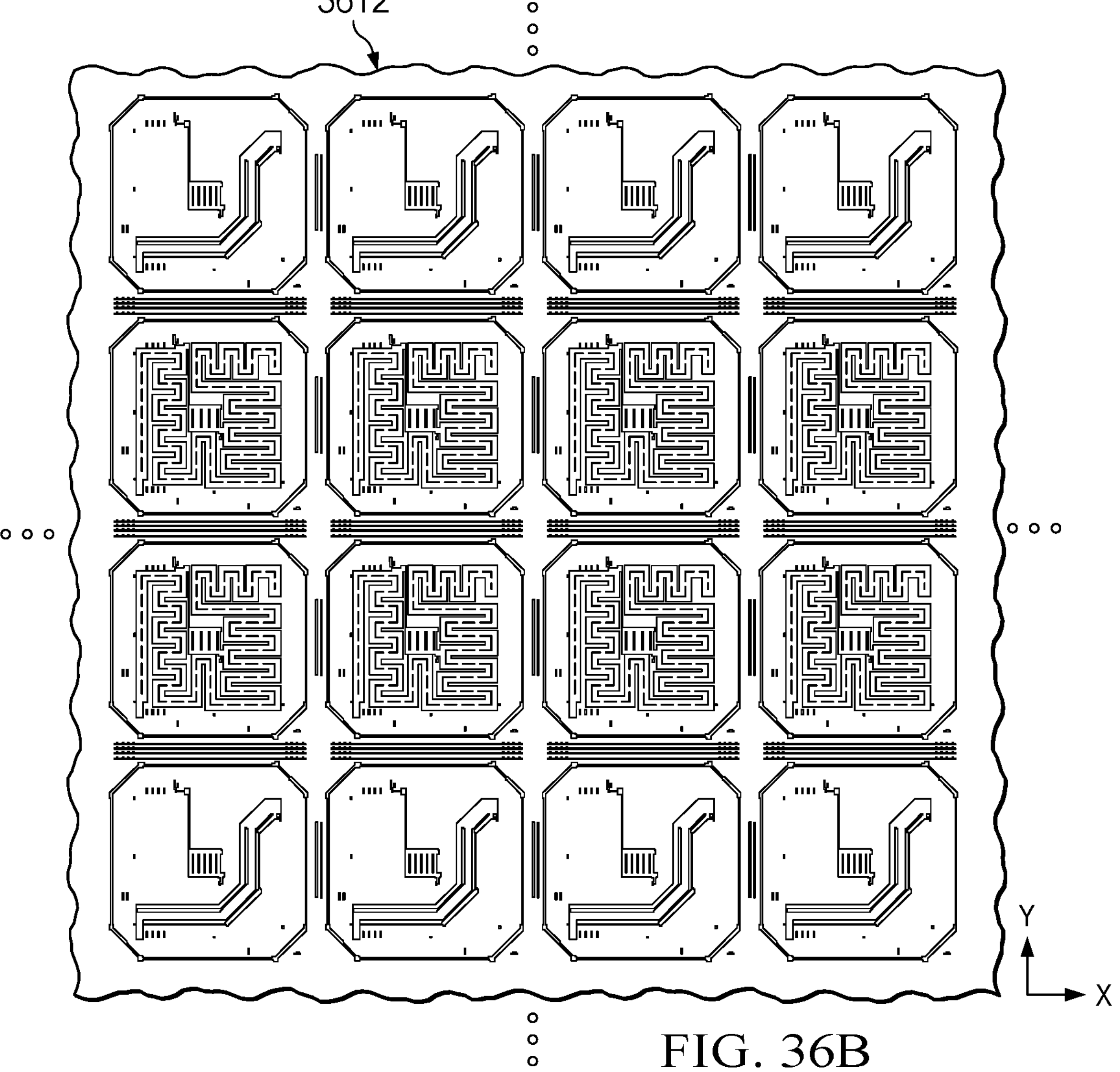
Figure 36C:
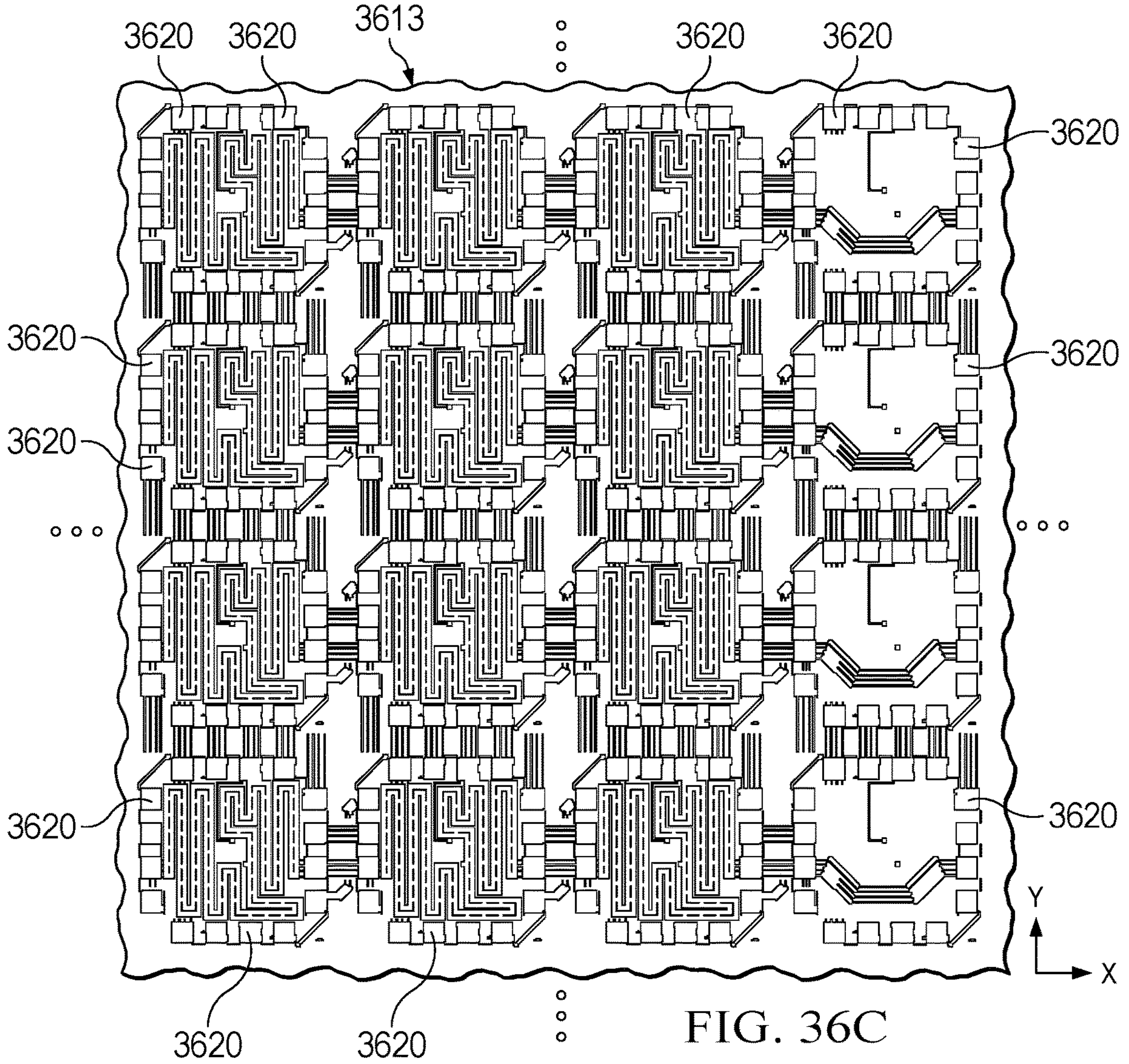

FIGS. 36A-36C show respective first, second, and third metallization levels 3611, 3612, and 3613 of another example wire bonded thermal test chip electronic device with a 4 by 4 array having an instance of a heater resistor in less than all unit regions of each of the metallization levels 3611, 3612, and 3613, as well as instances of sense resistors in fewer than all unit regions of each of the first and second metallization levels 3611 and 3612 (FIGS. 36 and 36B), and the third metallization level 3613 (FIG. 136C) has exposed conductive metal features 3620 (e.g., bond pads for wire bond interconnections).

Figure 37A:
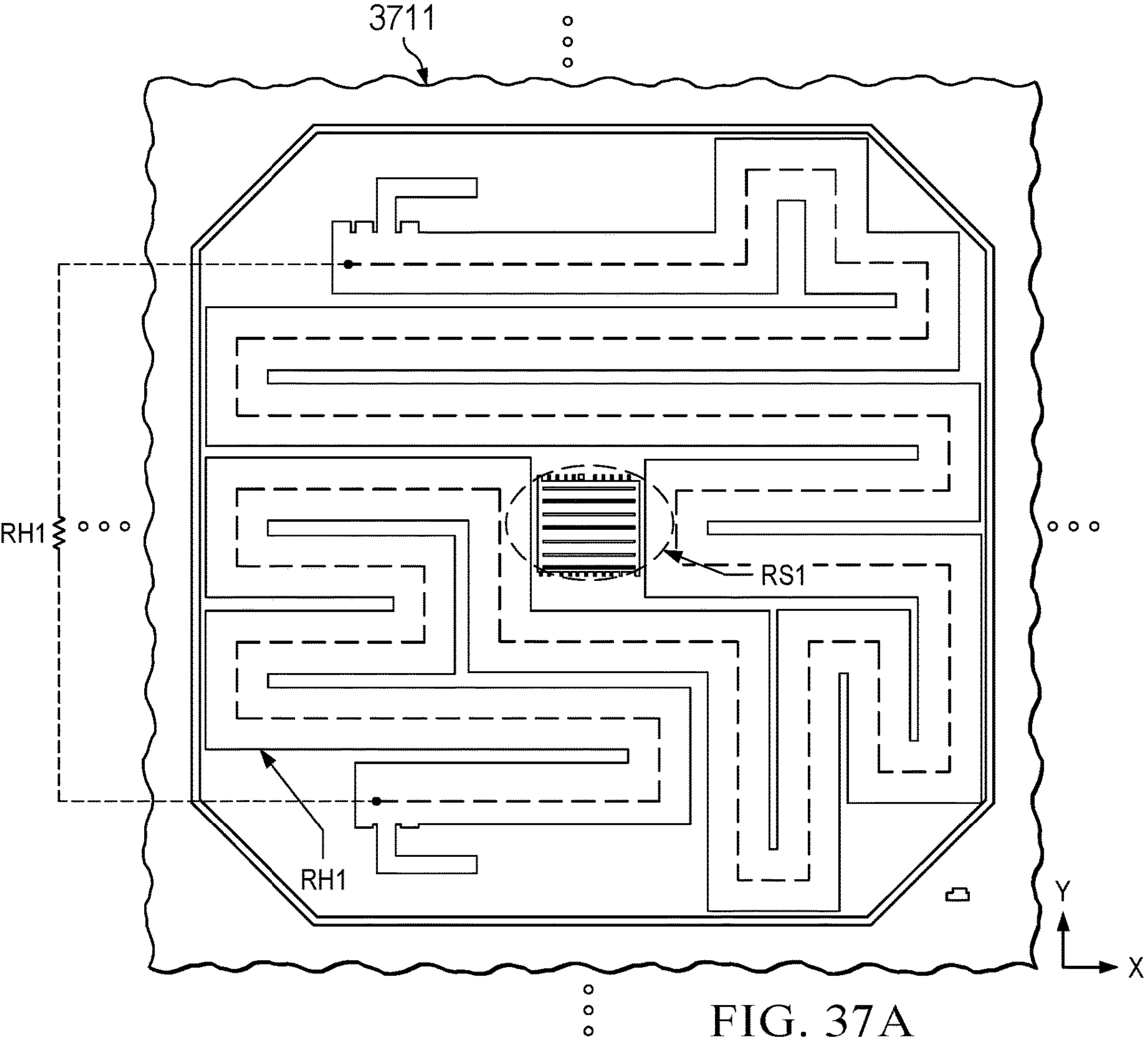
FIGS. 37A-37C show respective first, second, and third metallization levels of another example thermal test chip electronic device.
Figure 37B:
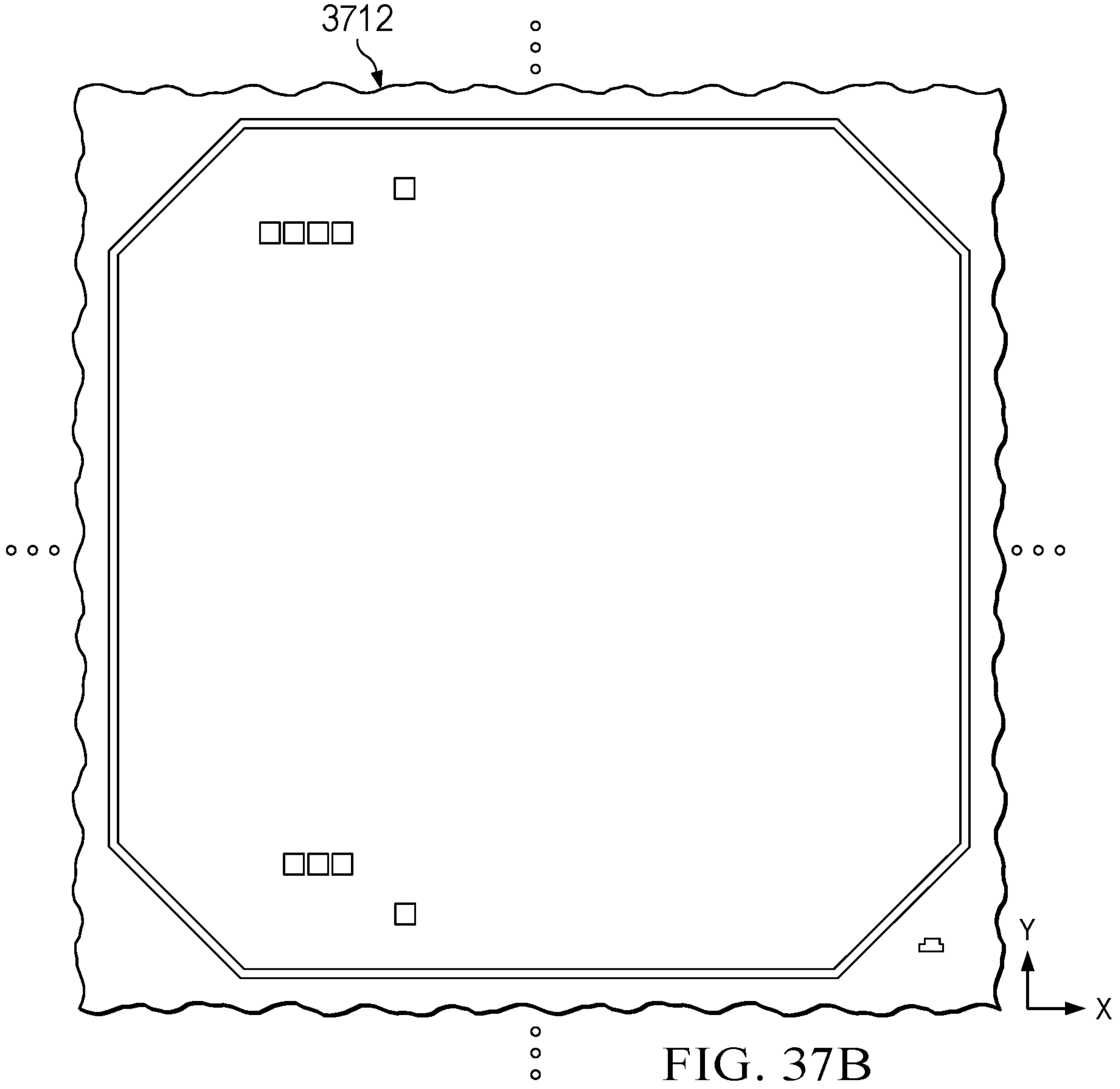
Figure 37C:
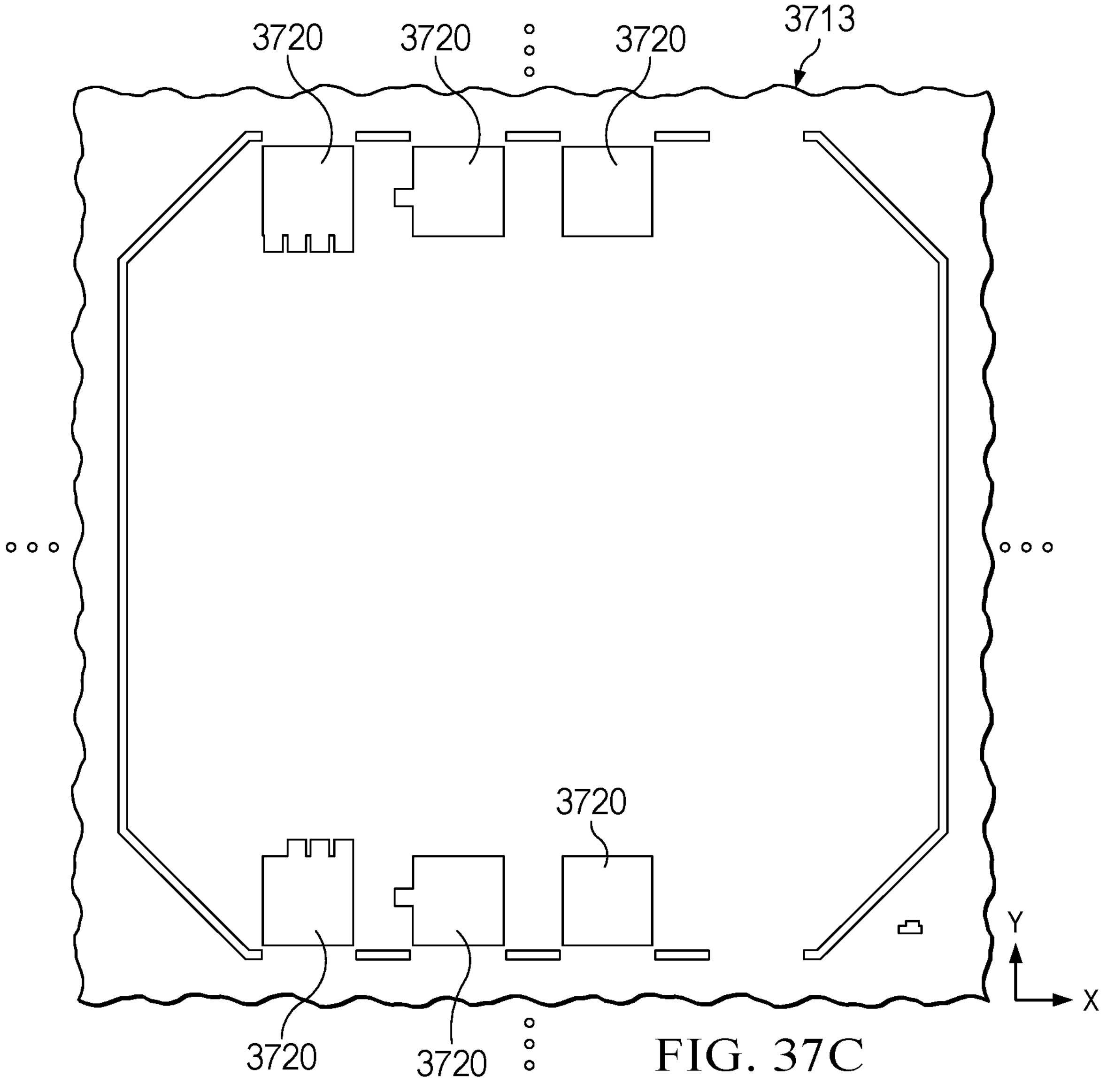

The example of FIGS. 37A-37C provides top views that show portions of respective first, second, and third metallization levels 3711, 3712 and 3713 of another example thermal test chip electronic device with a 1×1 array, in which the first metallization level 3711 includes a first heater resistor RH1 and a first sense resistor RS1 (FIG. 37A), and the third metallization level 3713 (FIG. 37C) includes conductive metal features (e.g., bond pads) 3720.

Figure 38:
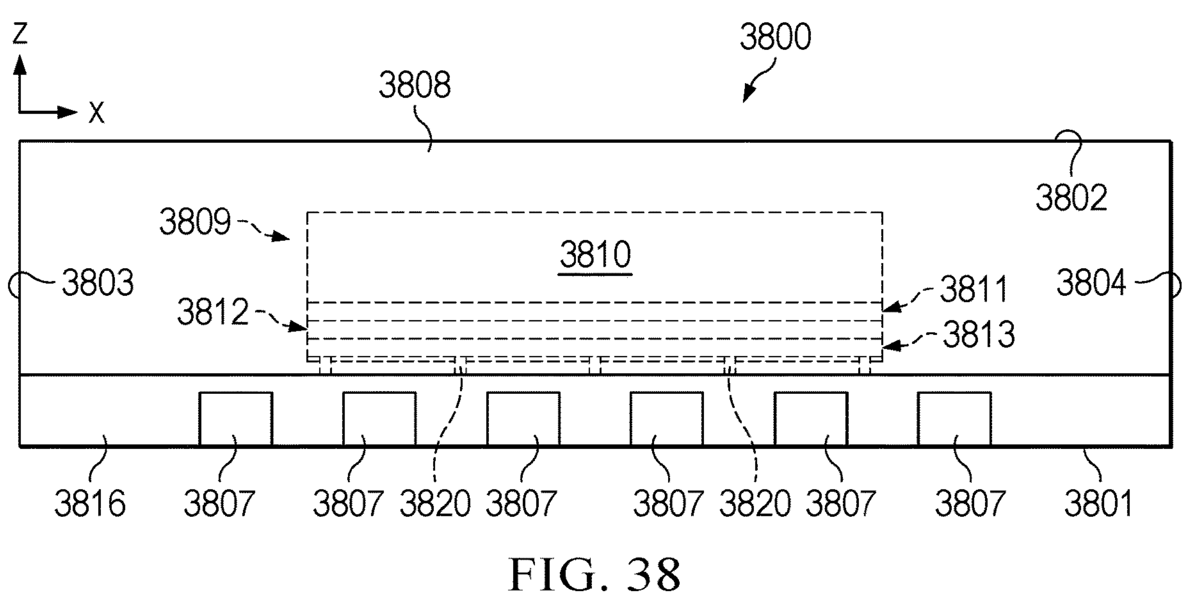
FIG. 38 is a partial side elevation view of a thermal test chip electronic device with a semiconductor die having a multilevel metallization structure with a metal based heater and sensor and flip chip electrical connections to a package substrate with conductive leads.
Figure 38A:
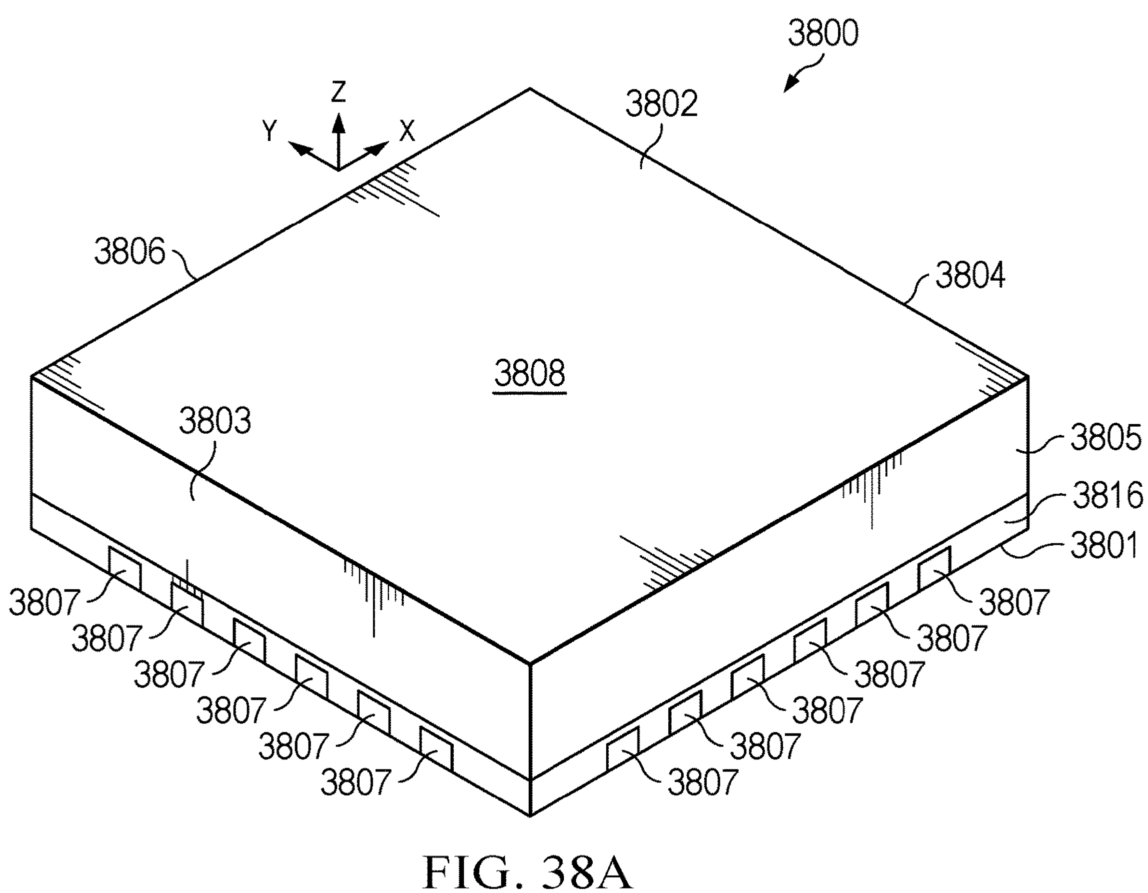
FIG. 38A a is a top perspective view of the electronic device of FIG. 38.
Figure 38B:
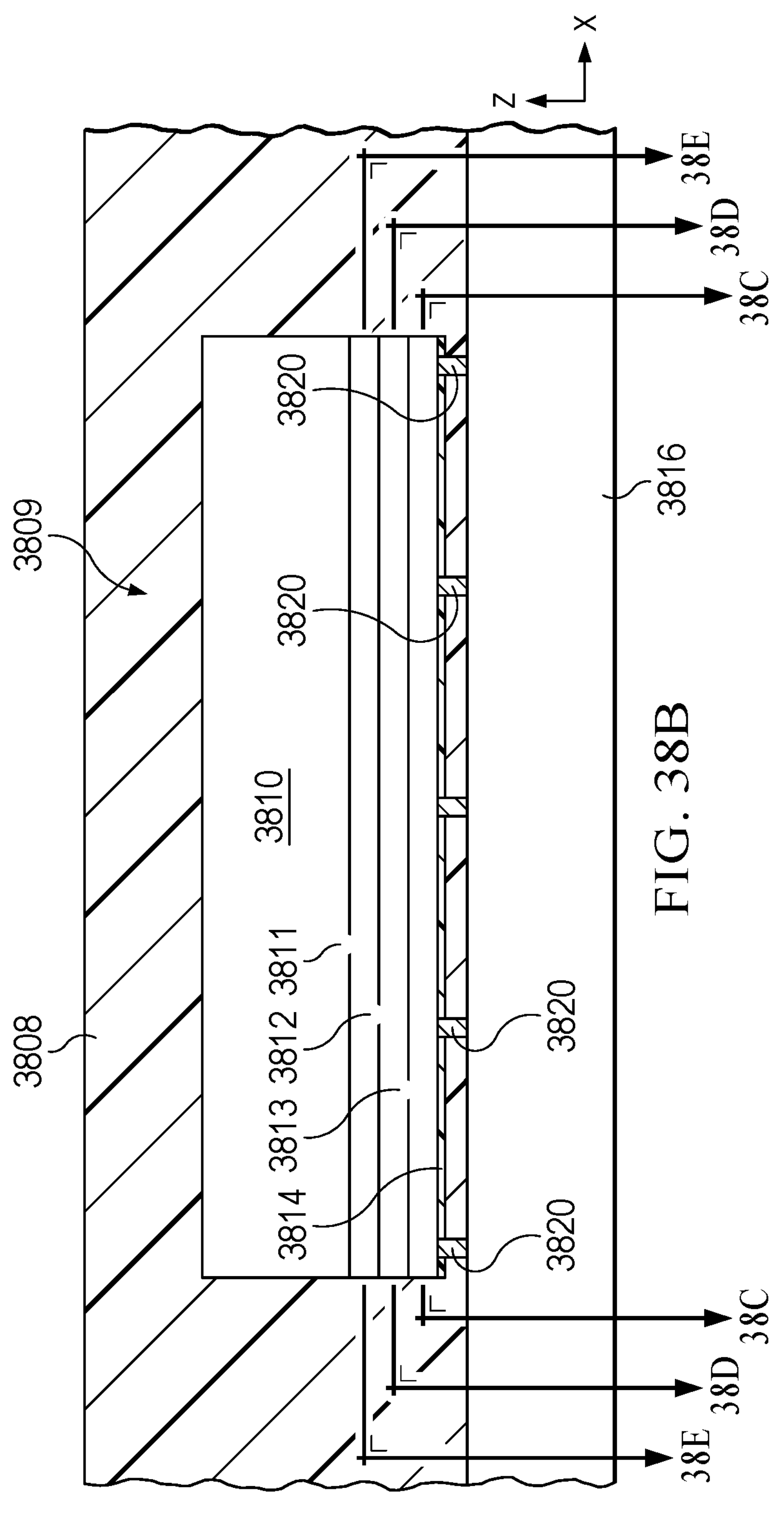
FIG. 38B is a partial side elevation view of the semiconductor die in the electronic device of FIG. 38.
Figure 38C:
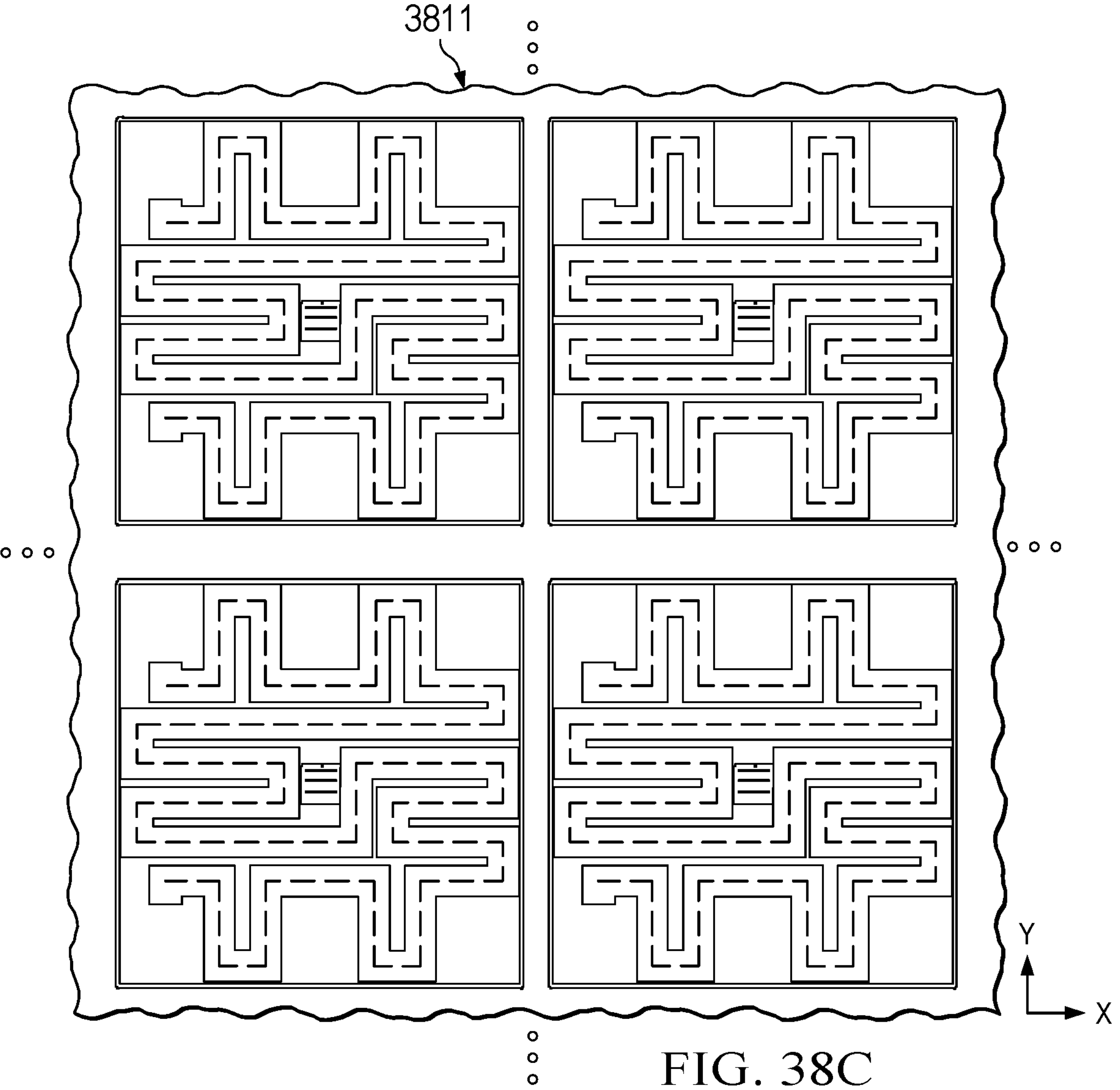
FIG. 38C is a partial top section view of a first metallization level of the semiconductor die in the electronic device taken along line 38C-38C of FIG. 38.
Figure 38D:
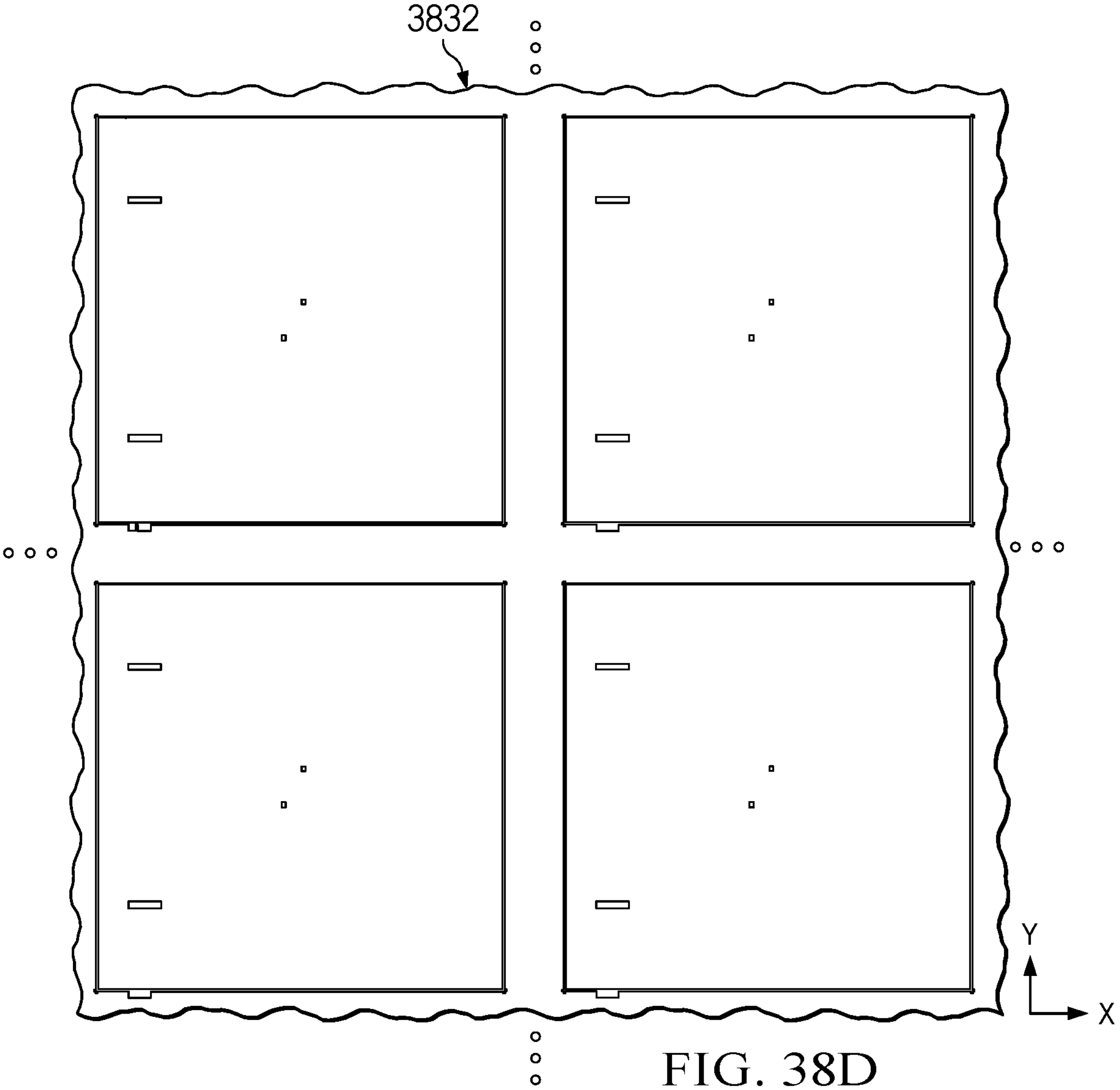
FIG. 38D is a partial top section view of a second metallization level of the semiconductor die in the electronic device taken along line 38D-38D of FIG. 38.
Figure 38E:
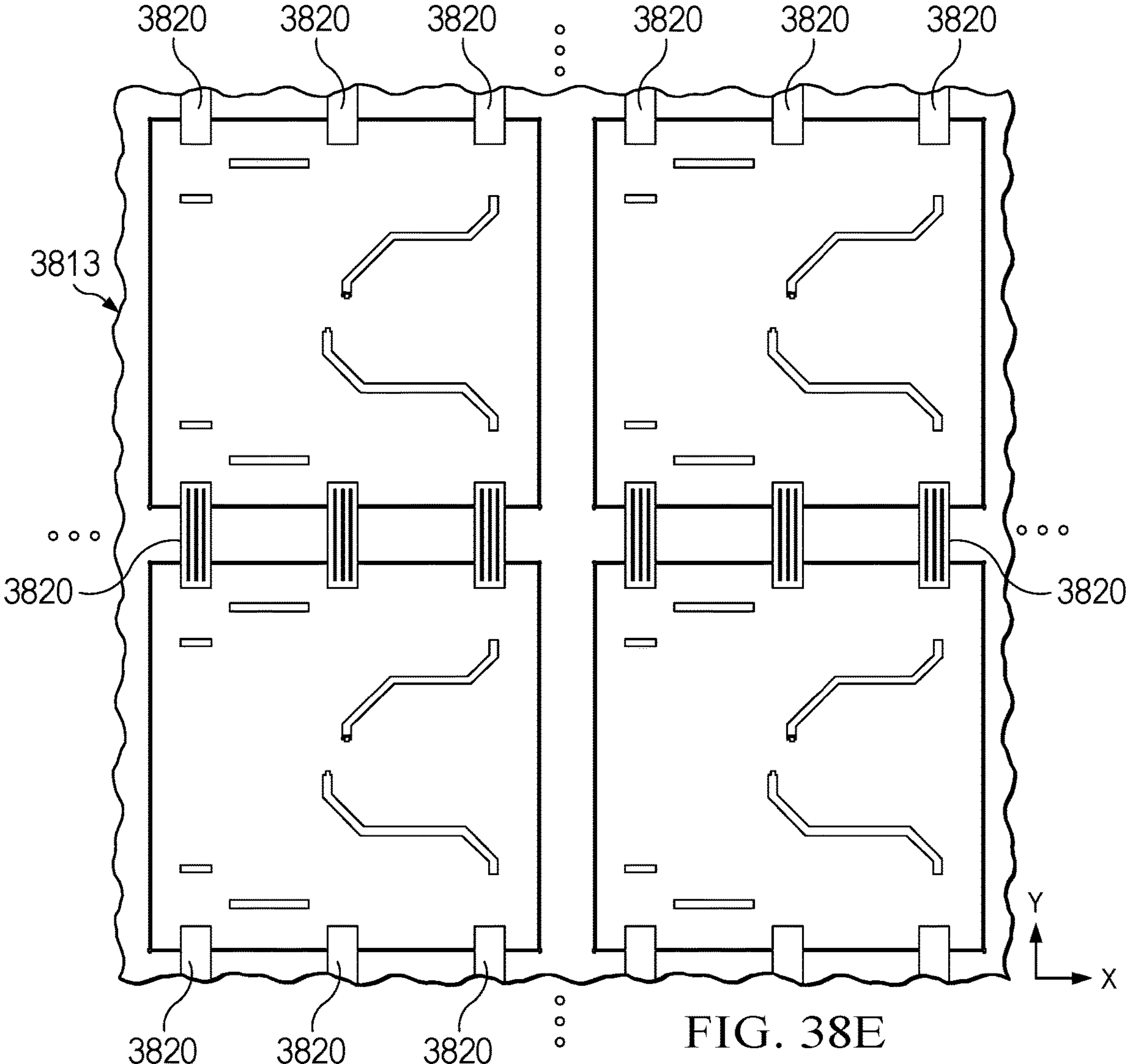
FIG. 38E is a partial top section view of a third metallization level of the semiconductor die in the electronic device taken along line 38E-38E of FIG. 38.
Figure 39A:
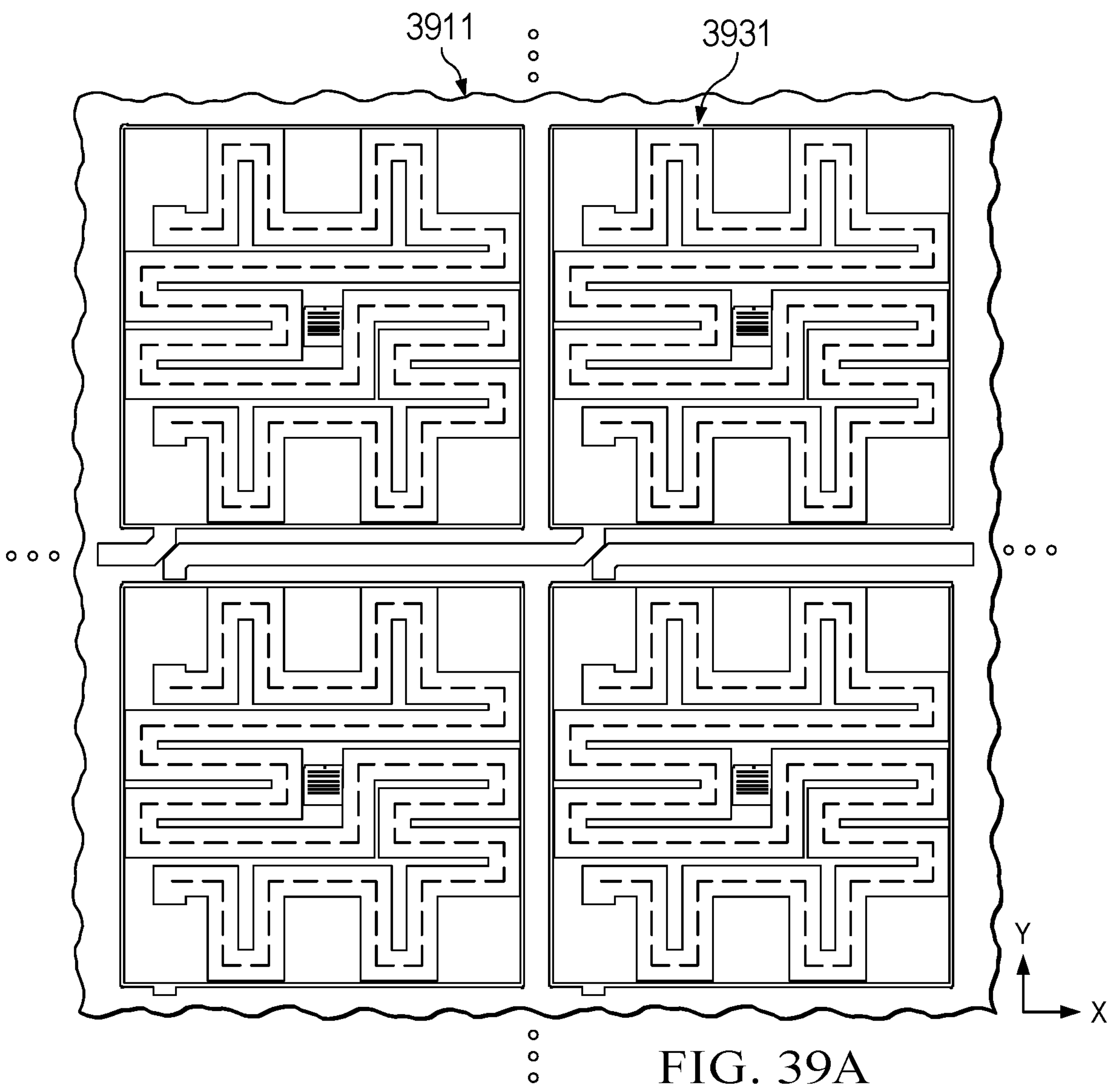
FIGS. 39A-39C show respective first, second, and third metallization levels of another example thermal test chip electronic device.
Figure 39B:
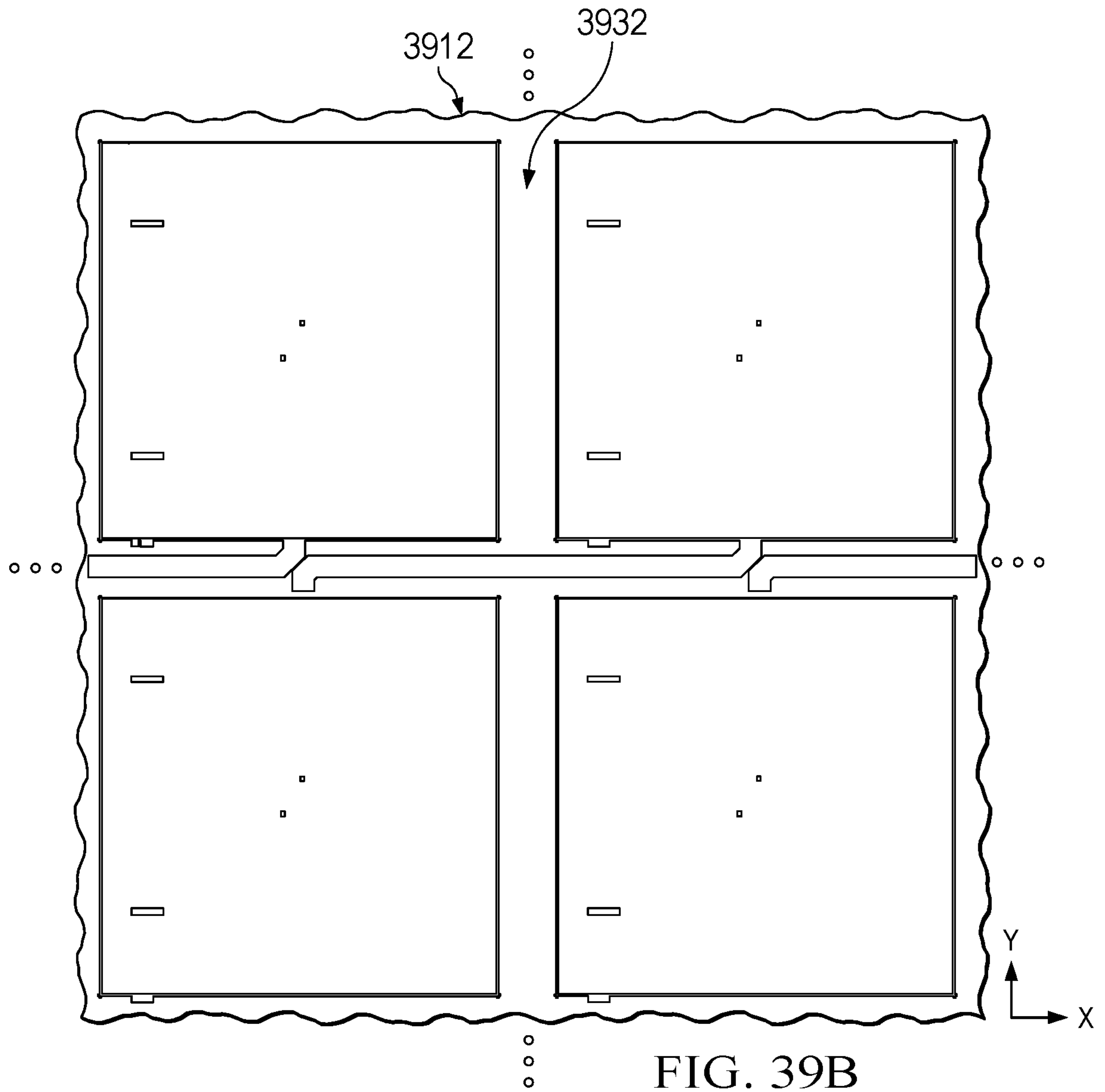
Figure 39C:
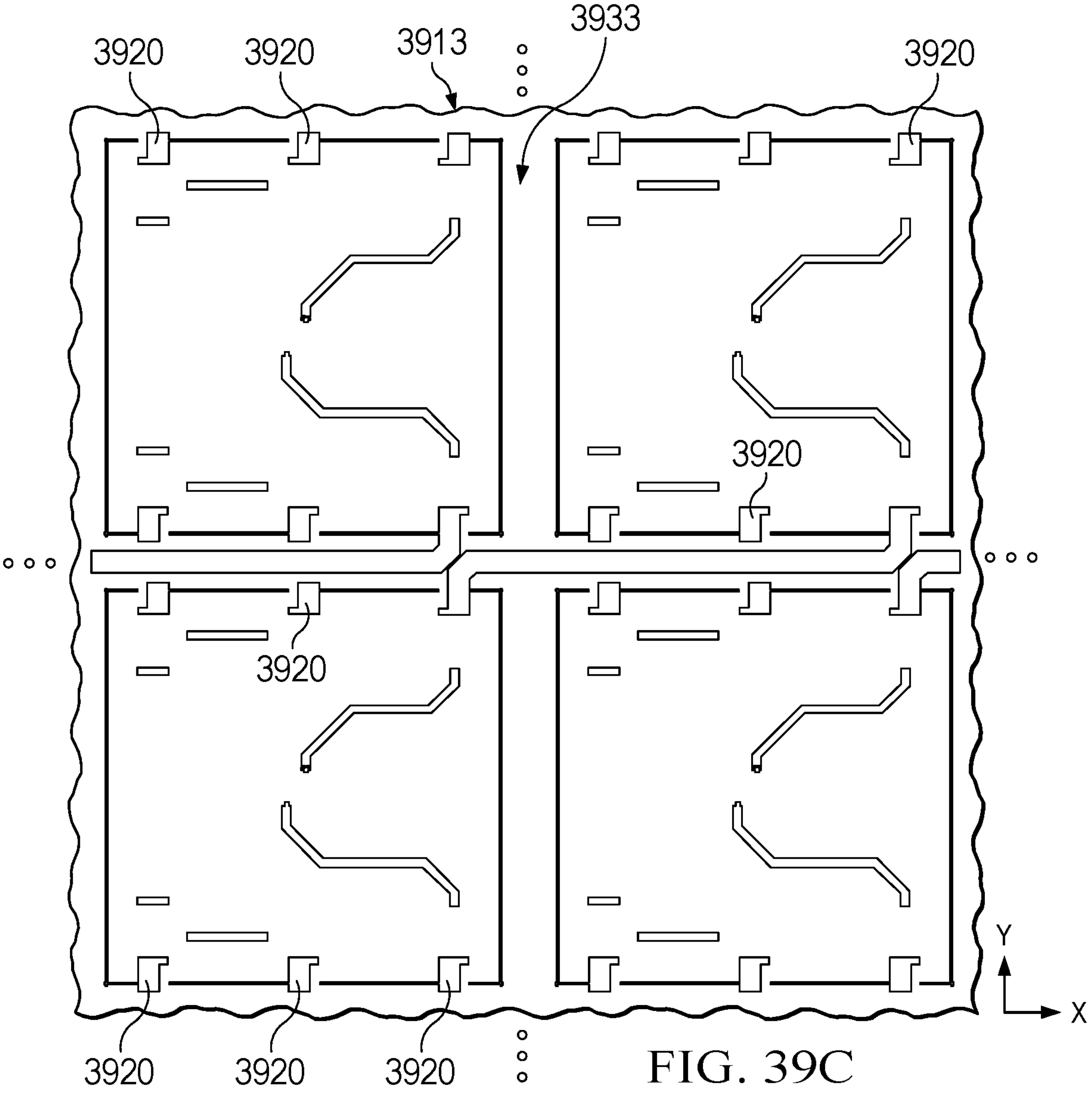

FIGS. 38-39C show flip chip examples of thermal test chip electronic devices with multilevel metallization structures having metal-based heater and sense resistors. FIGS. 38-38E show an example thermal test chip electronic device 3800. FIG. 38 shows a partial side elevation view of the electronic device 3800, FIG. 38A shows a top perspective view of the electronic device 3800, FIG. 38B shows a partial side elevation view of a semiconductor die in the electronic device 3800, FIG. 38C shows a partial top section view of a first metallization level of the semiconductor die in the electronic device taken along line 38C-38C of FIG. 38, FIG. 38D shows a partial top section view of a second metallization level of the semiconductor die in the electronic device taken along line 38D-38D of FIG. 38, and FIG. 38E shows a partial top section view of a third metallization level of the semiconductor die in the electronic device taken along line 38E-38E of FIG. 38. As best shown in FIGS. 38 and 38A, the electronic device 3800 has a conductive metal leads 3807 at least partially exposed outside a package structure 3808, such as a molded plastic, and the electronic device has opposite first and second (e.g., bottom and top) sides 3801 and 3802, respectively, which are spaced apart from one another along the third direction Z. The package structure 3808 and the electronic device 3800 have laterally opposite third and fourth sides 3803 and 3804 spaced apart from one another along the first direction X, and opposite fifth and sixth sides 3805 and 3806 spaced apart from one another along the second direction Y in the illustrated orientation. The sides 3801-3806 in one example have substantially planar outer surfaces. In other examples, one or more of the sides 3801-3806 have curves, angled features, or other non-planar surface features.

As best shown in FIGS. 38 and 38B, the electronic device 3800 includes a semiconductor die 3809 having a semiconductor layer 3810 and a multilevel metallization structure on the semiconductor layer 3810. In one example, the semiconductor layer 3810 has no circuitry and no electronic components. In the illustrated example, the semiconductor layer 3810 is or includes silicon or other semiconductor material, and the multilevel metallization structure includes a first metallization level 3811 on or over the semiconductor layer 3810, a second metallization level 3812 on or over the first metallization level 3811, and a third metallization level 3813 on or over the second metallization level 3812, where the second metallization level 3812 is spaced apart from the semiconductor layer 3810 along the third direction Z and the metallization levels 3811, 3812, and 3813 form a vertical stacked arrangement in the illustrated orientation of the electronic device 3800. In addition, the semiconductor die 3809 in the illustrated example includes a protective overcoat (PO) layer 3814 on or over a portion of the third metallization level 3813. The semiconductor die 3809 is enclosed by the package structure 3808. The third metallization level 3813 is the final or top level of the multilevel metallization structure in the illustrated example. In other implementations, the multilevel metallization structure can have any integer number of two or more levels, with an optional protective overcoat layer 3814 on or over a portion of the final level. As further shown in FIG. 38B, the semiconductor die 3809 is flip chip attached to a single or multilevel routing structure or package substrate 3816, for example, using solder or conductive adhesive connections (not shown) to mechanically and electrically coupled conductive metal features 3820 (e.g., copper pillars or solder balls) of the semiconductor die 3809 to conductive pads of the routing structure or package substrate 3816.

The multilevel metallization structure of the semiconductor die 3809 provides one or more metal based heating resistors and one or more metal sense resistors to facilitate thermal testing. In some implementations, the multilevel metallization structure includes a single unit region with a single metal heating resistor in one of the metallization levels 3811, 3812, or 3813. In other implementations, two or more of the metallization levels includes a corresponding heating resistor. In these or other implementations, one or more of the metallization levels 3811-3813 includes more than one heating resistor. In the above or other implementations, one or more of the metallization levels 3811-3813 includes a sense resistor. In these or other implementations, the multilevel metallization structure includes more than one sense resistor.

As shown in FIGS. 38C-38E, the example multilevel metallization structure of the electronic device 3800 includes a 2×2 array of unit regions in the respective metallization levels 3811, 3812, and 3813 shown in FIGS. 38C, 38D, and 38E, respectively. The unit regions are arranged in rows along a first direction X and columns along the second direction X. Each unit region in the first metallization levels 3811 (FIG. 38C) includes an instance of a heater resistor and an instance of a sense resistor, and the unit regions of the third level 3813 (FIG. 38E) have conductive (e.g., copper) pillars 3820 that are electrically coupled to respective terminals of the heater resistors and the sense resistors, and at least some of the conductive metal features 3820 are electrically coupled to respective ones of the conductive leads 3807 to allow an external test system to selectively activate (e.g., provide current to) individual ones and/or series connected groups of the heater resistors in select unit regions, for example, along selected columns, rows, and/or diagonal directions of the array, and also to sense local temperatures of the unit regions using all or selected ones or groups of the sense resistors (e.g., see FIGS. 14-32 above).

FIGS. 39A-39C show respective first, second, and third metallization levels 3911, 3912 and 3913 of another flip chip example thermal test chip electronic device with a 4×4 array in which the four unit areas of the first metallization levels 3911 include an instance of a heater resistor and a sense resistor (FIG. 39A), and the third metallization level 3913 (FIG. 39C) includes conductive metal features (e.g., copper pillars or solder balls) 3920.

The described examples facilitate scalable, technology agnostic, and cost-effective test chip solutions that can be made expeditiously to reduce design and development time and enhance design evaluation of thermal effects in a system or component under development using an all metal based solution without any costly silicon circuit fabrication to provide more direct measurement of silicon temperature rise in a device design under development as well as localized heating approximating an actual product implementation. The described examples can be used in a variety of ways, including without limitation to evaluate the junction to ambient temperature (Theta JA) and/or junction to case temperature (Theta JC), to make steady state and transient state measurements etc.

The described examples can advantageously save cycle time for gradient effect corrections and provide a faster and more flexible alternative for working through layout, FET placement, lead-frame design iterations and other design choice evaluations to help enables a more comprehensive analysis, in which BOM, packaging and boards can be evaluated while the silicon is being developed to speed up shipment of early sample boards and solutions to customers with thermal test chips in place of actual design chips.

Modifications are possible in the described examples, and other implementations are possible, within the scope of the claims.

What is claimed is:

1. An electronic device, comprising:

a package structure;

conductive leads partially exposed from the package structure; and a semiconductor die having a semiconductor layer and a multilevel metallization structure, the semiconductor die enclosed by the package structure, the multilevel metallization structure including one or more first heater resistors, one or more first sense resistors, and conductive metal features electrically coupled to respective terminals of the one or more first heater resistors and the one or more first sense resistors, the conductive metal features electrically coupled to respective ones of the conductive leads, wherein all of the one or more first sense resistors are encircled by the one or more first heater resistors.

2. The electronic device of claim 1, wherein the multilevel metallization structure includes an array of unit regions arranged in rows along a first direction and columns along an orthogonal second direction, each unit region including an instance of the first heater resistor, and an instance of the first sense resistor.

3. The electronic device of claim 2, wherein:

the multilevel metallization structure includes a first metallization level over the semiconductor layer and a second metallization level over the first metallization level, the second metallization level spaced apart from the semiconductor layer along a third direction that is orthogonal to the first and second directions;

the first metallization level of each unit region includes an instance of the first heater resistor;

the second metallization level of each unit region includes an instance of a second heater resistor; and the first metallization level of each unit region includes an instance of the first sense resistor.

4. The electronic device of claim 3, wherein the second metallization level of each unit region includes an instance of a second sense resistor.

5. The electronic device of claim 3, wherein the multilevel metallization structure includes a set of first series circuits including instances of the first heater resistor in respective unit regions, each respective first series circuit including a first pair of the conductive metal features electrically coupled to respective terminals of a respective instance of the first heater resistor of the respective first series circuit.

6. The electronic device of claim 5, wherein the multilevel metallization structure includes a set of second series circuits including instances of the second heater resistor in respective unit regions, each respective second series circuit including a second pair of conductive metal features electrically coupled to respective terminals of a respective instance of the second heater resistor of the respective second series circuit.

7. The electronic device of claim 1, wherein the multilevel metallization structure includes one or more second sense resistors.

8. A method of fabricating an electronic device, the method comprising:

forming a first metallization level of a multilevel metallization structure above a semiconductor layer, the first metallization level including one or more first heater resistors;

forming a second metallization level of the multilevel metallization structure above the first metallization level, the second metallization level including one or more second heater resistors, and one of the first and second metallization levels including one or more first sense resistors;

electrically coupling the one or more first and second heater resistors and the one or more first sense resistors to conductive leads; and enclosing the first and second metallization levels, the semiconductor layer, and portions of the conductive leads in a package structure, wherein all of the one or more first sense resistors are encircled by the one or more first heater resistors or the one or more second heater resistors.

9. The method of claim 8, wherein electrically coupling the one or more first and second heater resistors and the one or more first sense resistors to the conductive leads includes forming wire bonds between conductive metal features of the multilevel metallization structure and respective ones of the conductive leads.

10. The method of claim 8, wherein electrically coupling the one or more first and second heater resistors and the one or more first sense resistors to the conductive leads includes soldering conductive metal features of the multilevel metallization structure to respective ones of the conductive leads.

11. The method of claim 8, wherein forming the first and second metallization levels includes forming an array of unit regions arranged in rows along a first direction and columns along an orthogonal second direction, each unit region including an instance of the first heater resistor, an instance of the second heater resistor, and an instance of the first sense resistor.

12. The method of claim 11, wherein forming the first and second metallization levels includes forming a set of first series circuits including instances of the first heater resistor in respective unit regions, each respective first series circuit including a first pair of conductive metal features electrically coupled to respective terminals of a respective instance of the first heater resistor of the respective first series circuit.

13. The method of claim 12, wherein forming the first and second metallization levels includes forming a set of second series circuits including instances of the second heater resistor in respective unit regions, each respective second series circuit including a second pair of conductive metal features electrically coupled to respective terminals of a respective instance of the second heater resistor of the respective second series circuit.

14. A system, comprising:

a circuit board;

an electronic device, including:

a package structure;

conductive leads partially exposed from the package structure and connected to conductive terminals of the circuit board; and a semiconductor die having a semiconductor layer and a multilevel metallization structure, the semiconductor die enclosed by the package structure, the multilevel metallization structure including an array of unit regions arranged in rows along a first direction and columns along an orthogonal second direction, each unit region including a first heater resistor and a first sense resistor, and conductive metal features electrically coupled to respective terminals of the first heater resistor and the first sense resistor, the conductive metal features electrically coupled to respective ones of the conductive leads, wherein all of the first sense resistors are encircled by the first heater resistors;

a power circuit configured to provide current to activate selected ones of the first heater resistors;

a sensing circuit configured to sense a signal of selected ones of the first sense resistors; and a switching circuit coupled to the circuit board, the power circuit, and the sensing circuit, the switching circuit configured to selectively couple the power circuit to the selected ones of the first heater resistors and to selectively couple the sensing circuit to the selected ones of the first sense resistors.

15. The system of claim 14, wherein:

the multilevel metallization structure includes a set of first series circuits including instances of the first heater resistor in respective unit regions, each respective first series circuit including a pair of the conductive metal features electrically coupled to respective terminals of a respective instance of the first heater resistor of the respective first series circuit; and the switching circuit is configured to selectively couple the power circuit to one or more selected first series circuits to provide current to respective instances of the first heater resistor.

16. The system of claim 15, wherein:

the multilevel metallization structure includes a set of second series circuits including instances of a second heater resistor in respective unit regions, each respective second series circuit including a second pair of conductive metal features electrically coupled to respective terminals of a respective instance of the second heater resistor of the respective second series circuit; and the switching circuit is configured to selectively couple the power circuit to one or more selected second series circuits to provide current to respective instances of the second heater resistor.

17. A method, comprising:

connecting conductive leads of an electronic device to conductive terminals of a circuit board;

selectively coupling a power circuit to one or more first heater resistors in a multilevel metallization structure of a semiconductor die of the electronic device to provide current to activate the one or more first heater resistors; and selectively coupling a sensing circuit to one or more first sense resistors in the multilevel metallization structure to sense a temperature of the electronic device, wherein all of the one or more first sense resistors are encircled by the one or more first heater resistors.

18. The method of claim 17, wherein:

the multilevel metallization structure includes an array of unit regions arranged in rows along a first direction and columns along an orthogonal second direction, each unit region including an instance of the first heater resistor, and an instance of the first sense resistor.

* * * * *